US011486920B2

(12) United States Patent
Tart et al.

(10) Patent No.: US 11,486,920 B2
(45) Date of Patent: Nov. 1, 2022

(54) MONITORING SYSTEM WITH BRIDGES FOR INTERCONNECTING SYSTEM ELEMENTS

(71) Applicant: Bently Nevada, LLC, Minden, NV (US)

(72) Inventors: Michael Alan Tart, Gardnerville, NV (US); Steven Thomas Clemens, Carson City, NV (US); Dustin Hess, Minden, NV (US); Paul Richetta, Gardnerville, NV (US)

(73) Assignee: Bently Nevada, LLC, Minden, NV (US)

( * ) Notice: Subject to any disclaimer, the term of this patent is extended or adjusted under 35 U.S.C. 154(b) by 0 days.

(21) Appl. No.: 17/181,255

(22) Filed: Feb. 22, 2021

(65) Prior Publication Data
US 2021/0172997 A1    Jun. 10, 2021

Related U.S. Application Data

(63) Continuation of application No. 15/947,726, filed on Apr. 6, 2018, now Pat. No. 10,928,440.

(51) Int. Cl.
*G01R 31/28* (2006.01)
*G05B 19/4065* (2006.01)
*G05B 19/418* (2006.01)

(52) U.S. Cl.
CPC ..... *G01R 31/2801* (2013.01); *G05B 19/4065* (2013.01); *G05B 19/4185* (2013.01);
(Continued)

(58) Field of Classification Search
CPC ............ G01R 31/2801; G05B 19/4065; G05B 19/4185; G05B 2219/33144; G05B 2219/33328
See application file for complete search history.

(56) References Cited

U.S. PATENT DOCUMENTS

| 2007/0067481 A1* | 3/2007 | Sharma ................... H04L 69/12 709/231 |
| 2009/0232151 A1* | 9/2009 | Furlong .............. H04L 12/6418 370/419 |

(Continued)

*Primary Examiner* — Henry Tsai
*Assistant Examiner* — Aurangzeb Hassan
(74) *Attorney, Agent, or Firm* — Mintz Levin Cohn Ferris Glovsky and Popeo, PC; Lisa Adams

(57) ABSTRACT

Systems, methods, and devices for monitoring operation of industrial equipment are disclosed. In one embodiment, a monitoring system is provided that includes a passive backplane and one more functional circuits that can couple to the backplane. Each of the functional circuits that are coupled to the backplane can have access to all data that is delivered to the backplane. Therefore, resources (e.g., computing power, or other functionality) from each functional circuits can be shared by all active functional circuits that are coupled to the backplane. Because resources from each of the functional circuits can be shared, and because the functional circuits can be detachably coupled to the backplane, performance of the monitoring systems can be tailored to specific applications. For example, processing power can be increased by coupling additional processing circuits to the backplane.

18 Claims, 42 Drawing Sheets

(52) U.S. Cl.
CPC .............. *G05B 2219/33144* (2013.01); *G05B 2219/33328* (2013.01)

(56) References Cited

U.S. PATENT DOCUMENTS

| | | | |
|---|---|---|---|
| 2011/0072151 A1* | 3/2011 | Sharma | H04L 69/18 709/233 |
| 2012/0166582 A1* | 6/2012 | Binder | G06F 21/602 709/217 |
| 2017/0220517 A1* | 8/2017 | Khan | G06F 13/364 |
| 2017/0222686 A1* | 8/2017 | Khan | H04B 1/40 |
| 2019/0310308 A1* | 10/2019 | Hess | G05B 19/0428 |
| 2019/0310310 A1* | 10/2019 | Tart | G01R 31/2801 |
| 2019/0310619 A1* | 10/2019 | Clemens | G06F 13/4072 |

* cited by examiner

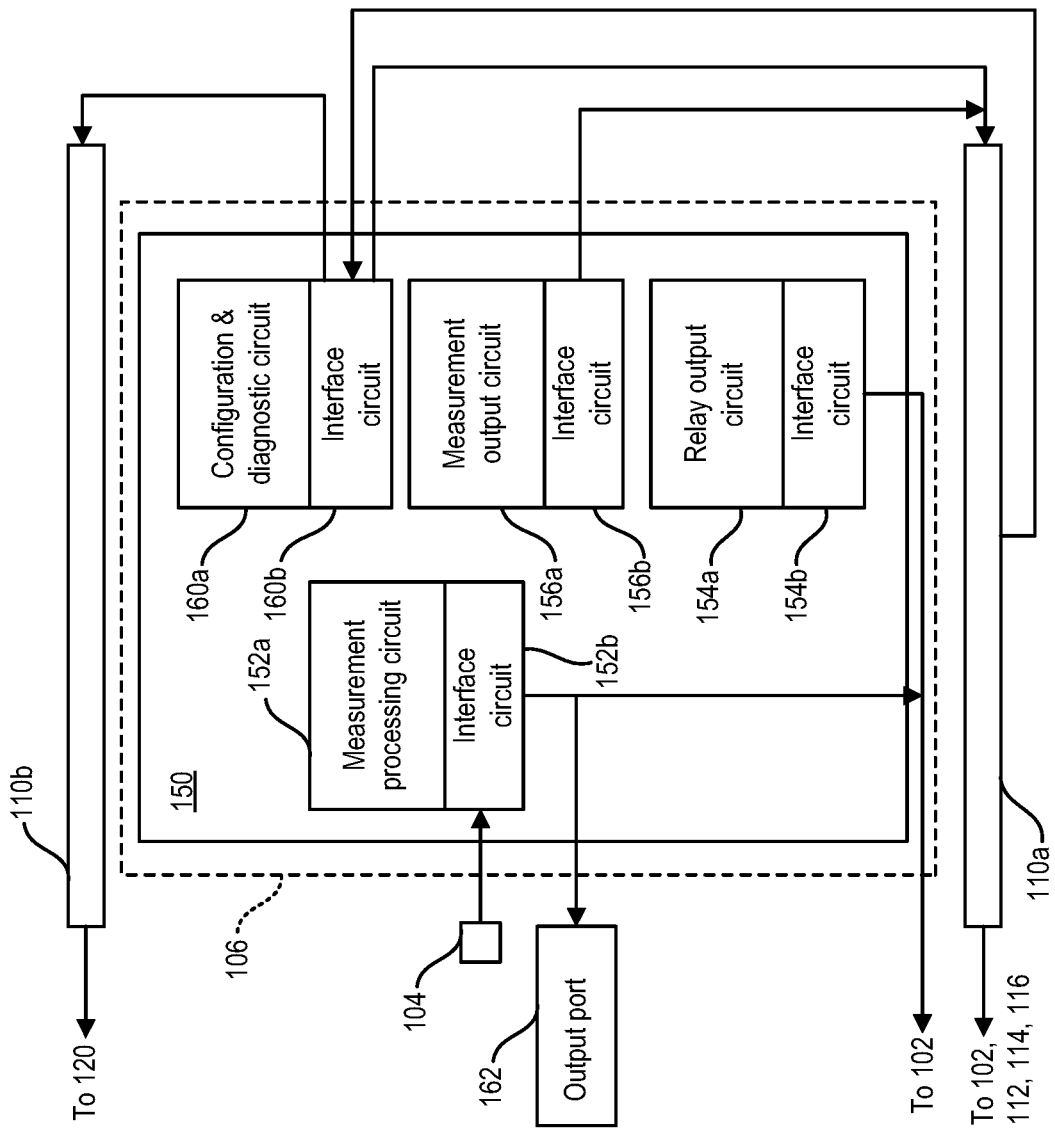

| Beacon packet | Length (Bytes) |
|---|---|
| GAME preamble | 8 |
| Type (Beacon) | 2 |
| Packet length (bytes) | 2 |
| Major revision | 1 |
| Minor revision | 1 |
| Current time (seconds) | 4 |
| Current time (nanoseconds) | 4 |
| Network ID number | 2 |
| Number of Lanes | 1 |
| Baud rate (bps of lane) | 4 |
| Schedule header | 12 |
| Schedule entries | M x N |
| CRC | 4 |

FIG. 8

| | Length (Bytes) |
|---|---|
| Beacon response header | 8 |
| GAME preamble | 2 |
| Type (Beacon response) | 2 |
| Packet length (bytes) | 1 |
| Major revision | 1 |
| Minor revision | 4 |
| Current time (seconds) | 4 |
| Current time (nanoseconds) | 2 |
| Network ID number | M |
| Unique ID | 3 |
| Number of Requested time slices | 4 |
| CRC | |

FIG. 10

| Time slice | Assignment | Length (Bytes) | Counter |
|---|---|---|---|
| 0 | 00-E0-46-00-12-0 34 (Beacon time slice) | 10 | 2 |
| 1 | 00-E0-46-00-12-34 (Beacon response time slice) | 10 | 2 |
| 2 | 00-E0-46-00-99-99 | 10 | 2 |
| 3 | 00-00-00-00-00-00 (unassigned) | 10 | 2 |
| 4 | FF-FF-FF-FF-FF-FF (All/best effort) | 10 | 2 |
| 5 | 00-E0-46-00-11-22 | 10 | 2 |
| 6 | 00-E0-46-00-11-22 | 10 | 2 |
| 7 | 00-E0-46-00-77-88 | 10 | 2 |
| 8 | 00-E0-46-00-88-99 | 10 | 2 |
| 9 | 00-E0-46-00-11-22 | 10 | 2 |
| N-1 | 00-E0-46-00-11-22 | 10 | 2 |

FIG. 17

MONITORING SYSTEM WITH BRIDGES FOR INTERCONNECTING SYSTEM ELEMENTS

CROSS-REFERENCE TO RELATED APPLICATIONS

This application is a continuation of U.S. patent application Ser. No. 15/947,726 filed Apr. 6, 2018, entitled "MONITORING SYSTEM WITH BRIDGES FOR INTERCONNECTING SYSTEM ELEMENTS," which is hereby incorporated herein by reference in its entirety.

BACKGROUND

Many industries, such as hydrocarbon refining and power generation, can rely heavily upon operation of machinery, and in some instances, continuous operation of machinery. In these environments, failure of one or more machines can incur significant costs due to repair expenses as well as loss of production and potential injury to workers. Given these risks, it can be common to monitor certain operating parameters of one or more machine components. Measurements of the operating parameters can provide an indication of the mechanical condition of a machine component, allowing preventative maintenance (e.g., repair, replacement, etc.) to be performed on the machine component prior to failure. This monitoring can provide one or more long term benefits, such as lower production costs, reduced equipment down time, improved reliability, and enhanced safety.

SUMMARY

Systems, devices, and methods for monitoring operating conditions of machines are provided. In one embodiments, a monitoring system is provided that includes a bus having a plurality of coupling elements in electronic communication with at least one data lane. The monitoring system can also include at least one slave circuit that can be detachably coupled to at least one of the plurality of coupling elements. The at least one slave circuit can be configured to deliver data to the at least one data lane. The slave circuit can have at least one first gate configured to enable electronic communication between the slave circuit and the at least one data lane. The at least one first gate can be configured to operate in a first operating mode and in a second operating mode. The at least one first gate can configured to allow data to be transferred from the slave circuit to the at least one data lane when in the first operating mode, and the at least one first gate can be configured to prevent data from being transferred from the slave circuit to the at least one data lane when in the second operating mode. The monitoring system can also include a master circuit that can be detachably coupled to at least one of the plurality of coupling elements. The master circuit can be configured to deliver data to the at least one data lane. The master circuit can have a first schedule controller configured to generate a first schedule and deliver data characterizing the first schedule to the at least one data lane. The first schedule can specify when the at least one first gate is in the first operating mode and when the at least one first gate is in the second operating mode.

The monitoring system can vary in a number of ways. One or more of the following features can be included in any feasible combination. For example, in one embodiments, the at least one slave circuit can include at least one first gate controller in electronic communication with the at least one first gate. The at least one first gate controller can be configured to receive data characterizing the first schedule and to control operation of the at least one first gate based on the data that characterizes the first schedule.

In some embodiments, the at least one slave circuit can include a second schedule controller that can be configured assume arbitration responsibilities, thereby enabling the second schedule controller to generate a second schedule that defines when the at least one first gate is in the first operating mode and when the at least one first gate is in the second operating mode.

In some embodiments, the master circuit can include at least one second gate that can be configured to enable electronic communication between the master circuit and the at least one data lane. The at least one second gate can be configured to operate in a third operating mode and in a fourth operating mode. The at least one second gate can be configured to allow data to be transferred from the master circuit to the at least one data lane when in the third operating mode, and the at least one second gate can be configured to prevent data from being transferred from the master circuit to the at least one data lane when in the fourth operating mode. The master circuit can also include at least one second gate controller in electronic communication with the first schedule controller and the at least one second gate. The at least one second gate controller can be configured to receive data that characterizes the first schedule, and to control operation of the at least one second gate based on the first schedule.

In some embodiments, the at least one slave circuit can include a plurality of slave circuits. Each slave circuit of the plurality of slave circuits can be configured to receive data from the at least one data lane of the bus.

In some embodiments, the monitoring system can include a sensor that can be electrically coupled to the at least one slave circuit. The sensor can be configured to measure operating parameters of a machine and to deliver data characterizing the measured operating parameters the at least one slave circuit.

In some embodiments, the monitoring system can include a sensor in electronic communication with the master circuit. The sensor can be configured to measure operating parameters of a machine and to deliver an analog sensor signal to the master circuit. The analog sensor signal can characterizing the measured operating parameters of the machine.

In some embodiments, the slave circuit can be configured to receive a discrete signal from at least one sensor measuring operating parameters of a machine, generate a digital signal based on the discrete signal, and deliver the digital signal to the at least one data lane.

In some embodiments, the master circuit can include an analog to digital converter configured to receive the analog sensor signal and convert the analog sensor signal to a digital sensor signal.

In some embodiments, the at least one data lane can include a plurality of parallel data lanes.

In some embodiments, the at least first one gate can include a 16 lane bidirectional differential transceiver.

In some embodiments, the at least one second gate can include a 16 lane bidirectional differential transceiver.

In some embodiments, the at least one data lane can include 16 data lanes. Each of the 16 data lanes can be a low voltage signaling pair.

In another aspect, a method is provided that includes generating a first schedule for a first frame that includes at least one first time sliced. The first schedule can identify the at least one first time slice and at least one slave circuit to which the at least one first time slice is assigned. The at least one slave circuit can be configured to provide a data packet to a bus of a monitoring system during the at least one first time slice. The method can also include generating a first beacon packet that includes the first schedule, delivering the first beacon packet to the bus of the monitoring system, and receiving the first beacon packet at the at least one slave circuit. The method can also include generating a first set of instructions for controlling operation of at least one gate of the at least one slave circuit based on the at least one first time slice that is assigned to the at least one slave circuit. The at least one gate can be configured to operate in a first operating mode and in a second operating mode. The at least one gate can be configured to allow data to be transferred from the at least one slave circuit to the bus when in the first operating mode, and the at least one gate can be configured to prevent data from being transferred from the at least one slave circuit to the bus when in the second operating mode. The method can also include providing the first set of instructions to a gate controller of the at least one slave circuit, thereby configuring the gate controller to operate the at least one gate in the first operating mode during the at least one first time slice.

The method can vary in a number of ways. One or more of the following features can be included in any feasible combination. For example, in some embodiments, the first schedule can be generated by a schedule controller of a master circuit that is coupled to the bus.

In some embodiments, the method can include providing a data packet from the at least one slave circuit to the bus during the at least one first time slice.

In some embodiments, the method can also include determining that the at least one slave circuit failed to provide a data packet to the bus during the at least one first time slice.

In some embodiments, the method can also include generating a beacon response packet based on the first schedule received with the first beacon packet. The beacon response packet can include a request for at least one second time slice to be assigned to the at least one slave circuit during a second frame. The method can also include delivering the beacon response packet to the bus of the monitoring system, and receiving the beacon response packet at a master circuit, the master circuit being configured to generate a second schedule for the second frame.

In some embodiments, the method can include generating the second schedule for the second frame based on the beacon response packet. The second frame can include the at least one second time slice. The second schedule can identify the at least one second time slice and the at least one slave circuit to which the at least one second time slice is assigned.

In some embodiments, the method can include generating a second beacon packet that includes the second schedule. The method can also include delivering the second beacon packet to the bus of the monitoring system, receiving the second beacon packet from the bus of the monitoring system, and generating a second set of instructions for controlling operation of the at least one gate of the slave circuit based on the at least one second time slice that is assigned to the slave circuit.

In some embodiments, the method can include delivering the second set of instructions to the gate controller of the slave circuit, thereby configuring the gate controller to operate the at least one gate in the first operating mode during the at least one second time slice.

In one embodiment, a system can include a bus and a master circuit detachably coupled to the bus. The master circuit can include a manager bus node configured to interface with a first data lane of the bus. The system can also include a plurality of slave circuits detachably coupled to the bus. A first slave circuit of the plurality of slave circuits can include a first slave bus node configured to interface with the first data lane. The master circuit can be configured to broadcast a first beacon packet during a first time slice of a first plurality of time slices to the bus. The first beacon packet can include a first system frame schedule indicative of an assignment of the first plurality of time slices of a first system frame to one or more of the plurality of slave circuits. The first plurality of time slices can be temporally arranged relative to a first system frame reference time. The master circuit can also be configured to receive one or more beacon response packets from one or more of the plurality of slave circuits during a second time slice of the first plurality of time slices. The first time slice can be temporally adjacent to the first system frame reference time and the second time slice can be temporally adjacent to the first time slice.

In one embodiment, the first slave circuit can be configured to receive the first beacon packet and configure the first slave bus node to transmit data packets to the first data lane during a third time slice of the first plurality of time slices. The first system frame schedule can be indicative of assignment of the third time slice to the first slave circuit.

In one embodiment, the master circuit can be further configured to determine a set of valid beacon response packets from the one or more beacon response packets received during the second time slice. The master circuit can also be configured to generate a second beacon packet including a second system frame schedule indicative of assignment of a second plurality of time slices of a second system frame to one or more of the plurality of slave circuits. Assignment of the second plurality of time slices can be based on time slice requests in the set of valid beacon response packets.

In one embodiment, the determination of the set of valid beacon response packets can be based on transmission collisions of the one or more beacon response packet in the first data lane of the bus. In another embodiment, the second plurality of time slices can be temporally arranged relative to a second system frame reference time. In yet another embodiment, the first slave bus node can include a first node controller, a first gate controller and a first plurality of gates. The first gate controller can configure one or more gates of the first plurality of gates to transmit data packets from the first node controller to the first data lane.

In one embodiment, the master circuit can assign of a fourth time slice of the second plurality of time slices to a second slave circuit of the plurality of slave circuits based on a unique identification of the second slave circuit in a second beacon response packet broadcasted on the first data lane by the second slave circuit. In another embodiment, the master circuit can be further configured to cancel the assignment of the fourth time slice to the second slave circuit based on inactivity of the second slave circuit during one or more time slices assigned to the second slave circuit.

In one embodiment, the second beacon packet can be generated at an application layer executed in a slave circuit controller in the second slave circuit. In another embodiment, the second slave circuit can include a second slave circuit clock, and the second slave circuit can be configured to synchronize the second slave circuit clock based on one or both of the first system frame reference time and the second system frame reference time. In another embodiment, the first slave bus node can be further configured to maintain a copy of the first beacon packet. In yet another embodiment, the first time slice can include a dead band and a usable time slice period.

In one embodiment, the master circuit can be configured to broadcast the first beacon packet during the usable time slice period, and configured to prevent broadcast of the first data packet during the dead band. In another embodiment, the first plurality of time slices can include one or both of an unassigned time slice and a best-effort time slice. The master circuit can be configured to discard data packets broadcasted by one or more slave circuits of the plurality of slave circuits during the unassigned time. The one or more slave circuits of the plurality of slave circuits can broadcast an asynchronous application layer event during the best-effort time slice.

In one embodiment, a method can include broadcasting a first beacon packet during a first time slice of a first plurality of time of a first system frame slices to a first data lane of a bus. The first beacon packet can include a first system frame schedule indicative of assignment of the first plurality of time slices to one or more of a plurality of slave circuits coupled to the bus. The first plurality of time slices can be temporally arranged relative to a first system frame reference time. The method can also include receiving one or more beacon response packets from one or more of the plurality of slave circuits during a second time slice of the first plurality of time slices. The first time slice can be temporally adjacent to the first system frame reference time and the second time slice can be temporally adjacent to the first time slice. The method can further include generating a second beacon packet including a second system frame schedule indicative of assignment of a second plurality of time slices of a second system frame to one or more of the plurality of slave circuits. The method can also include providing the second beacon packet to the one or more of the plurality of slave circuits. The broadcasting, the receiving, the generating and the providing can be by a master circuit detachably coupled to the bus, the master circuit can include a manager bus node configured to interface with the first data lane of the bus.

In one embodiment, the method can further include determining a set of valid beacon response packets from the one or more beacon response packets received during the second time slice. Assignment of the second plurality of time slices can be based on time slice requests in the set of valid beacon response packets. In another embodiment, determination of the set of valid beacon response packets can be based on transmission collisions of the one or more beacon response packet in the first data lane of the bus. In yet another embodiment, the second plurality of time slices can be temporally arranged relative to a second system frame reference time.

In one embodiment, the method can further include receiving the first beacon packet by a first slave circuit of the plurality of slave circuits. The first slave circuit can include a first slave bus node configured to interface with the first data lane. The method can also include configuring the first slave bus node to transmit data packets to the first data lane during a third time slice of the first plurality of time slices. The first system frame schedule can include assignment of the third time slice can be to the first slave circuit. In another embodiment, the method can further include the first slave bus node can include a first node controller, a first gate controller and a first plurality of gates. In yet another embodiment, configuring the first slave bus node to transmit data packets can include configuring one or more gates of the first plurality of gates, by the first gate controller, to transmit the data packets from the node controller to the first data lane.

In one embodiment, the method can further include assignment of a fourth time slice of the second plurality of time slices to a second slave circuit of the plurality of slave circuits based on a unique identification of the second slave in a beacon response packet received from the second slave circuit. In one embodiment, the method can further include cancelling the assignment of the fourth time slice to the second slave circuit based on inactivity of the second slave circuit during one or more time slices assigned to the second slave circuit.

In one embodiment, a monitoring system can include a first backplane having at least one first data lane. The monitoring system can also include at least one second data lane in parallel with the at least one first data lane. The monitoring system can also include at least one first port in electronic communication with the at least one first data lane and the at least one second data lane. The monitoring system can also include at least one second port in electronic communication with the at least one first data lane and the at least one second data lane. The monitoring system can further include a first functional circuit detachably coupled to the at least one first port. The first functional circuit can be configured to receive a sensor signal from a sensor. The sensor signal can characterize measured operating parameter of a machine. The functional circuit can be configured to generate a first digital signal based on the sensor signal, and deliver the first digital signal to the at least one first data lane. The monitoring system can also include a second functional circuit detachably coupled to the at least one second port. The second functional circuit can be configured to receive the first digital signal from the at least one first data lane. The second functional circuit can also be configured to determine an operating status of the machine based on the received first digital signal and a predetermined operating threshold. The second functional circuit can further be configured to generate a second digital signal based on the first digital signal and the predetermined operating threshold. The second digital signal characterizing the operating status of the machine, and deliver the second digital signal to the at least one second data lane.

In one embodiment, the monitoring system can include at least one third data lane in parallel with the at least one first data lane and the at least one second data lane. The monitoring system can also include at least one third port in electronic communication with the at least one first data lane, the at least one second data lane, and the at least one third data lane. The monitoring system can also include a third functional circuit detachably coupled to the at least one third port. The third functional circuit can be configured to receive the second digital signal from the at least one second data lane, and actuate a relay based the operating status of the machine.

In one embodiment, the first functional circuit not in electronic communication with the at least one second data lane. In another embodiment, the at least one first data lane can be a dedicated data lane and can be configured to receive data from only the first functional circuit. In yet another embodiment, the second functional circuit may not be in electronic communication with the at least one first data lane.

In one embodiment, the at least one second data lane can be a dedicated data lane and can be configured to receive data from only the second functional circuit. In another embodiment, the first functional circuit can include a first unidirectional gate configured to allow the first functional circuit to deliver the first digital signal to the at least one first data lane. In yet another embodiment, the first functional circuit can include a gate pair which can include a transmitter and a receiver. The transmitter can be configured to deliver a third digital signal from the at least one third data lane, and the receiver can be configured to receive a fourth digital signal from the at least one third data lane.

In one embodiment, the second functional circuit can include a gate pair comprising a transmitter and a receiver, the transmitter can be configured to deliver a third digital signal to the at least one third data lane, and the receiver can be configured to receive a fourth digital signal from the at least one third data lane. In another embodiment, the second functional circuit can include a second unidirectional gate configured to allow the second functional circuit to receive the first digital signal from the at least one first data lane. In yet another embodiment, the at least one third data lane can be a bi-directional serial data lane.

In one embodiment, the at least one first data lane can be a unidirectional serial data lane. In another embodiment, the at least one second data lane can be a unidirectional serial data lane. In yet another embodiment, the at least one first data lane comprises a plurality of first data lanes.

In one embodiment, the at least one second data lane comprises a plurality of second data lanes. In another embodiment, the at least one first port can be electrically decoupled from the at least one second data lane, thereby preventing electronic communication between the first functional circuit and the at least one second data lane. In yet another embodiment, the monitoring system can further include at least one fourth port in electronic communication with the at least one third data lane and a fourth functional circuit coupled to the at least one fourth port. The fourth functional circuit can be configured to deliver a third digital signal to the second functional circuit via the at least one third data lane. The third signal can characterize updated operating thresholds.

In one embodiment, the at least one fourth port can be electrically decoupled from the at least one first data lane, thereby preventing electronic communication between the fourth functional circuit and the at least one first data lane. In another embodiment, the fourth functional circuit can include a schedule controller configured to generate a first schedule.

In one embodiment, a method, can include delivering, from a first functional circuit of a monitoring system, a first digital signal to a first data lane of a backplane of a monitoring system. The first digital signal can characterize a measured operating parameter of a machine. The method, can include receiving the first digital signal from the first data lane, at a second functional circuit of the monitoring system. The method, can also include determining an operating status of the machine based on the received first digital signal and a predetermined operating threshold. The method, can further include generating a second digital signal based on the first digital signal and the predetermined operating threshold, the second digital signal characterizing the operating status of the machine. The method can also include delivering the second digital signal to a second data lane of the backplane, receiving the second digital signal from the second data lane at a third functional circuit, and actuating a relay based the operating status of the machine.

In one embodiment, the method can include receiving, at the first functional circuit, an analog signal from a sensor, the analog signal characterizing the measured operating parameter of the machine. The method can also include converting the analog signal to the first digital signal. In another embodiment, the method can include generating a third digital signal characterizing updated operating thresholds, and delivering the third digital signal to a third data lane of the backplane. The third signal can characterize updated operating thresholds.

In one embodiment, the analog signal can be converted to the first digital signal at a fixed rate. In another embodiment, the method can further include filtering the analog signal. In yet another embodiment, the method can further include delivering a signal to a control system upon actuation of the relay to stop operation of the machine.

Systems, devices, and methods for monitoring operating conditions of machines are provided. In one embodiment, a monitoring system is provided that includes a first backplane having a first set of data lanes and a first set of ports. Each port of the first set of ports can be in electronic communication with at least one data lane of the first set of data lanes. The monitoring system can include a second backplane having a second set of data lanes and a second set of ports. Each of the second set of ports can be in electronic communication with at least one data lane of the second set of data lanes. The monitoring system can further include a first bridge circuit that can be detachably coupled to at least one of the first set of ports, and a second bridge circuit detachably coupled to at least one of the second set of ports. The second bridge circuit can be in electronic communication with the first bridge circuit. The first bridge circuit can be configured to receive a first set of data from the first set of data lanes, convert the first set of data to a first serial data stream, and to deliver the first serial data stream to the second bridge circuit, thereby delivering the first set of data to the second backplane. The second bridge circuit can be configured to receive a second set of data from the second set of data lanes, convert the second set of data to a second serial data stream, and to deliver the second serial data stream to the first bridge circuit, thereby delivering the second set of data to the first backplane.

The monitoring system can vary in a number of ways. One or more of the following features can be included in any feasible combination. For example, in some embodiments, the first bridge circuit can include at least one first gate configured to facilitate electronic communication between the first bridge circuit and at least one data lane of the first set of data lanes. The at least one first gate can be configured to operate in a first operating mode and in a second operating mode. The at least one first gate can be configured to allow data to be transferred from the first bridge circuit to the at least one data lane of the first set of data lanes when in the first operating mode. The at least one first gate can be configured to prevent data from being transferred from the first bridge circuit to the at least one data lane of the first set of data lanes when in the second operating mode. The monitoring system can also include at least one first gate controller in electronic communication with the at least one first gate. The at least one first gate controller can be configured control operation of the at least one first gate.

In some embodiments, the second bridge circuit includes the second bridge circuit can include at least one second gate configured to facilitate electronic communication between the second bridge circuit and at least one data lane of the second set of data lanes. The at least one second gate can be configured to operate in a third operating mode and a fourth operating mode. The at least one second gate can be configured to allow data to be transferred from the second bridge circuit to the at least one lane of the second set of data lanes when in the third operating mode. The at least one second gate can be configured to prevent data from being transferred from the second bridge circuit to the at least one lane of the second set of data lanes when in the fourth operating mode. The second bridge circuit can also include at least one second gate controller in electronic communication with the at least one second gate and the at least one first gate controller. The at least one second gate controller can be configured control operation of the at least one second gate.

In some embodiments, the monitoring system can also include a first set of functional circuits. Each functional circuit of the first set of functional circuits can be detachably coupled to at least one port of the first set of ports. The first set of functional circuits can be configured to deliver the first set of data to the first backplane and to selectively receive any data delivered to the first backplane. The monitoring system can also include a second set of functional circuits. Each functional circuit of the second set of functional circuits can be detachably coupled to at least one port of the second set of ports. The second set of functional circuits can be configured to deliver a second set of data to the second backplane and to selectively receive any data delivered to the second backplane.

In some embodiments, the first set of functional circuits can include at least one first functional circuit. The first functional circuit can include at least one second gate configured to facilitate electronic communication between the at least one first functional circuit and at least one of the first set of data lanes. The at least second one gate being configured to operate in a first operating mode and a second operating mode. The at least one second gate can be configured to allow data to be transferred from the at least one first functional circuit to the at least one lane of the first set of data lanes when in the first operating mode. The at least one second gate can be configured to prevent data from being transferred from the at least one first functional circuit to the at least one lane of the first set of data lanes when in the second operating mode.

In some embodiments, the first set of data lanes can include a plurality of data lanes.

In some embodiments, the second set of data lanes can include a plurality of data lanes.

In some embodiments, the monitoring sensor can include a sensor in electronic communication with a functional circuit of at least one of the first set of functional circuits and the second set of functional circuits. The sensor can be configured to measure operating parameters of a machine and to deliver data characterizing the measured operating parameters to the functional circuit.

In some embodiments the first set of functional circuits can include a plurality of functional circuits. Each functional circuit of the plurality of functional circuits can be configured to receive data from at least one data lane of the first set of data lanes.

In some embodiments, the first backplane and the second backplane can be passive backplanes that not include active switches.

In another aspect, a method is provided that includes receiving a first identification data at a first bridge circuit coupled to a first backplane of a first monitoring subsystem. The first identification data can characterize information identifying hardware of a second monitoring subsystem. The method can also include receiving a second identification data at a second bridge circuit coupled to a second backplane of the second monitoring subsystem. The second identification data can characterize information identifying hardware of the first monitoring subsystem. The method can further include determining, using the first identification data and the second identification data, that first monitoring subsystem is compatible with the second monitoring subsystem. The method can also include receiving a first schedule at the second bridge circuit. The first schedule can characterize a first communication schedule for a first set of functional circuits that are in electronic communication with the first backplane. The method can further include receiving a second schedule at the first bridge circuit. The second schedule can characterize a second communication schedule for a second set of functional circuits that are in electronic communication with the second backplane. The method can further include comparing the first communication schedule to the second communication schedule and determining that the first schedule is compatible with the second schedule. The method can further include providing a first signal to at least one first gate of the first bridge circuit and providing a second signal to at least one second gate of the second bridge circuit, thereby activating the at least one first gate and the at least one second gate, and facilitating electronic communication between the first backplane and the second backplane.

The method can vary in a number of ways. One or more of the following features can be included in any feasible combination. For example, the method can include delivering, from the first set of functional circuits, a first set of parallel data streams to a first set of parallel data lanes of the first backplane. The method can also include receiving, at the first bridge circuit, the first set of parallel data streams from the first set of parallel data lanes of the first backplane, converting the first set of parallel data streams to a first serial data stream, and delivering the first serial data stream to the second bridge circuit. The method can further include expanding the first serial data stream to a second set of parallel data streams, and delivering the second set of parallel data streams to a second set of parallel data lanes.

In some embodiments, the method can include amplifying a power of the first serial data stream based on a distance between the first bridge circuit and the second bridge circuit.

In some embodiments, the method can include delivering, from the second set of functional circuits, a third set of parallel data streams to the second set of parallel data lanes of the second backplane.

In some embodiments, the method can include receiving, at the second bridge circuit, the third set of parallel data streams from the second set of parallel data lanes of the second backplane, converting the third set of parallel data streams to a second serial data stream, and delivering the second serial data stream to the first bridge circuit. The method can also include expanding the second serial data stream to a fourth set of parallel data streams, and delivering the fourth set of parallel data streams to the first set of parallel data lanes.

In some embodiments, the method can include generating a third schedule using at least one functional circuit of the first set of functional circuits. The third schedule can include data that determines when each functional circuit of the first set of functional circuits delivers data to the first set of parallel data lanes and when each functional circuit the second set of functional circuits delivers data to the second set of parallel data lanes.

In some embodiments, the third set of parallel data streams can include sensor data characterizing measured operating values of a machine. The sensor data can be measured by sensors coupled to the machine.

In some embodiments, the method can include amplifying a power of the second serial data stream based on a distance between the first bridge circuit and the second bridge circuit.

In some embodiments, the method can include determining an estimated delay time that can characterize an estimated amount of time required to transfer data between the first bridge circuit and the second bridge circuit. The method can also include determining a dead band period based on at least one of the first communication schedule and the second communication schedule. The dead band time can characterize a total amount of time available to absorb delays in communication between one or more backplane. The method can further include determining an amount of the dead band time that is available based on at least one of the first communication schedule and the second communication schedule, and comparing the estimated delay time to the amount of dead band time that is available.

In some embodiments, the method can include receiving a first network identification data at the first bridge circuit. The first network identification data can characterize a first network configuration. The method can also include receiving a second network identification data at the second bridge circuit. The second network identification data can characterize a second network configuration. The method can further include comparing the first network identification data with the second network identification data.

DESCRIPTION OF DRAWINGS

These and other features will be more readily understood from the following detailed description taken in conjunction with the accompanying drawings, in which:

FIG. 1B is a block diagram illustrating one exemplary embodiment of a backplane of the monitoring system of FIG. 1A;

FIG. 8 is an exemplary data structure of a beacon packet;

FIG. 10 is an exemplary data structure of a beacon response packet;

FIG. 17 is shown an exemplary of a schedule entry array that includes a time slice array, an assignment array, a length array, and a counter array;

DETAILED DESCRIPTION

Certain exemplary embodiments will now be described to provide an overall understanding of the principles of the structure, function, manufacture, and use of the systems, devices, and methods disclosed herein. One or more examples of these embodiments are illustrated in the accompanying drawings.

Industrial monitoring systems, such as wind turbines, can be used to monitor operating conditions of industrial systems. Although industrial monitoring systems can provide users with useful information regarding operation of industrial systems, some monitoring systems can be limited in terms of flexibility and/or scalability. Additionally, costs and complexity of installation can create a significant barrier to entry for some users that want to monitor low cost and/or low priority components/systems. Systems, methods, and devices are provided that improve flexibility and scalability of monitoring systems. In one embodiment, a monitoring system is provided that includes a passive backplane and one or more functional circuits that can couple to the backplane. Each of the functional circuits has access to all data that is delivered to the backplane. Therefore, resources (e.g., computing power) from each functional circuit can be shared by all active functional circuit that are coupled to the backplane. Because resources from each functional circuit can be shared, and because the functional circuits can be detachably coupled to the backplane, performance of the monitoring systems adjusted and/or scaled to fit individual monitoring needs. For example, processing power can be increased by coupling additional processing circuits to the backplane. The shared data and detachable functional circuits also allow for multiple backplanes to be coupled using bridges. Bridging can allow multiple backplanes to share common resources, which can provide flexibility when designing and installing monitoring systems. For example, monitoring subsystems can be installed remotely near industrial equipment such that the functional circuits can receive sensor data, while other monitoring subsystems can be installed at another location that may be more convenient, easier to access, or more cost effective.

Embodiments of systems and corresponding methods for monitoring industrial machines are discussed herein. However, embodiments of the disclosure can be employed with other machines without limit.

Figure 1A:
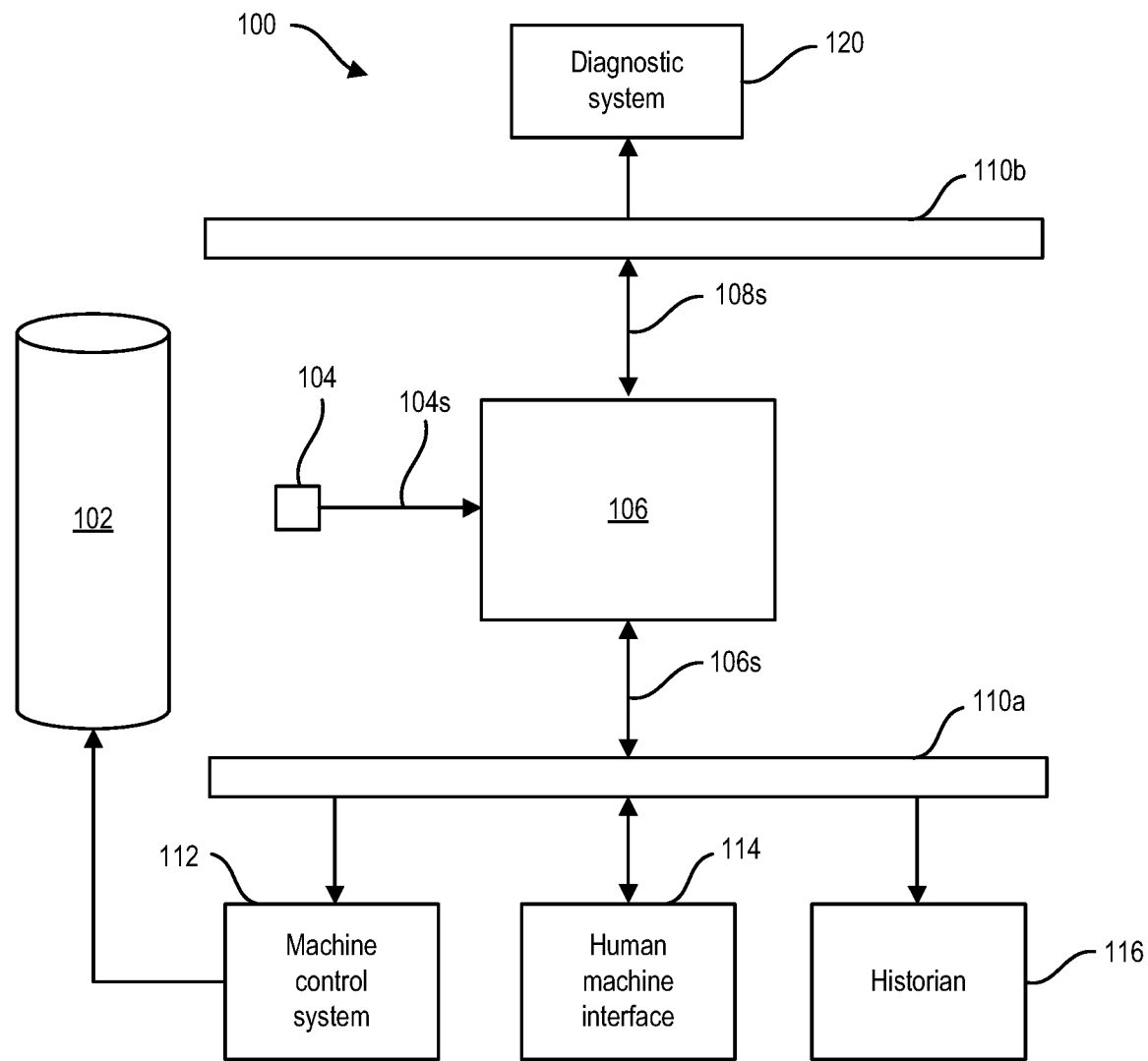
FIG. 1A is a block diagram illustrating one exemplary embodiment of an operating environment containing an existing monitoring system.

An operating environment 100 containing an existing monitoring system is illustrated in FIG. 1. The operating environment 100 can include a target 102, at least one sensor 104, and a monitoring system 106 in communication with the sensor 104, an internal network 110a, and an external network 110b.

The target 102 can be any component of any machine. Examples of the target 102 can include gears, bearings, and shafts, amongst others. Examples of machines can include turbomachines, turbines (e.g., hydro, wind), generators, and reciprocating compressors.

The sensor 104 can be configured to sense an operating parameter of the target 102, to generate at least one sensor signal 104s representing the measured operating parameter, and to transmit the sensor signal 104s to the monitoring system 106 (e.g., via field wiring). As an example, the sensor 104 can include a probe, a transducer, and a signal conditioning circuit (not shown). The probe can interact with the target 102 for measurement of the operating parameter. The transducer can convert measurements of the operating parameter into an electrical signal (e.g., a voltage). The signal conditioning circuit can condition and/or amplify the electrical signal to generate the sensor signal 104s (e.g., a voltage ranging between a minimum and maximum). Thus, in one aspect, the sensor signal 104s can contain the direct or raw measurement made by the sensor transducer. The sensor signal 104s can be an analog signal or a digital signal.

In another aspect, the sensor signals 104s can also include an enhanced data set, in addition to the direct measurements of the operating parameter. The enhanced data set can contain a variety of measured variables that depend upon the type of operating parameter being measured. As an example, the target 102 can be a rotating component, such as a shaft, and radial vibration can be a variable measured by a sensor 104 in the form of a proximity sensor. Under these circumstances, the enhanced data set can include one or more of a gap voltage, a 1× filtered amplitude, a 2× filtered amplitude, a 1× filtered phase, a 2× filtered phase, Not 1× amplitude, and maximum shaft displacement (Smax). Gap voltage is the voltage output by the probe and represents the physical distance between the target 102 and a tip of the probe. 1× amplitude is the amplitude of vibrations having the same frequency as the shaft rotation, while 2× amplitude is the amplitude of vibrations having a frequency twice that of the shaft rotation. For instance, a rotation speed of 1480 revolutions per minute corresponds to a frequency of 24.66 cycles per second (Hz). Phase is the time delay between a vibration measured at a predetermined measurement location with respect to a reference location. Thus, 1× phase refers to phase of vibrations having the same frequency as the shaft rotation, while 2× phase refers to phase of vibrations having a frequency twice that of the shaft rotation. Not 1× amplitude refers to all amplitudes except for the 1× amplitude. In other embodiments, the enhanced data set can include metadata regarding one or more components of the sensor 104, such as the transducer. Examples of metadata can include one or more of a serial number, revision number, operating temperature, and state of health.

The number and type of sensor 104 can be dictated by the operating parameter(s) that are intended to be measured. In one aspect, the sensor 104 can take the form of one or more proximity probes for measurement of vibration, position, speed, direction of motion, and eccentricity. In another aspect, the sensor 104 can take the form of one or more accelerometers for measurement of seismic vibration and acceleration. In a further aspect, the sensor 104 can take the form of one or more temperature probes or pressure probes for measurement of temperature and pressure, respectively. It can be understood that the sensor types and corresponding operating parameters listed above are not exhaustive and embodiments of the sensor 104 can include any sensor or combination of sensors suitable for measurement of operating parameters of interest.

In use, the monitoring system 106 can be configured to process the received sensor signals 104s and output monitoring signals 106s, 108s. As an example, the monitoring system 106 can be configured to determine a value characterizing an operating parameter measurement. The monitoring system 106 can also compare this determined value, and/or any measured variables of the enhanced data set, to one or more corresponding predetermined alarm conditions in real-time and determine an alarm status (e.g., OK, not OK, alert, danger, etc.). For instance, when the target 102 is a rotating shaft and the measured operating parameter is radial vibration of the shaft, the sensor signal 104s can include measurements of displacement of the shaft as a function of time. From the sensor signal 104s, the monitoring system 106 can determine the value of vibration amplitude from the peak-to-peak displacement.

The monitoring system 106 can also be configured to output monitoring signals 106s, 108s to the internal network 110a and/or the external network 110b. The output monitoring signals 106s, 108s can include one or more of the measured variables of the enhanced data set, the determined values, and the determined status. Alarm statuses, such as alert and danger, can be annunciated via physical relays on the monitoring system 106 or to the external systems 110 by the monitoring signals 106s, 108s. In another aspect, the monitoring system 106 can additionally or alternatively store the sensor signals 104s for later processing.

The internal network 110a can be a plant network that is in communication with a machine control system 112. The machine control system 112 can be configured to provide commands to a machine operative to control one or more operating parameters of the target 102. The internal network 110a can also be in communication with other systems, such as computing devices executing configuration software (not shown), human-machine interfaces (HMIs) 114 and/or a customer historian 116. The configuration software can be used to provide configuration information, such as the pre-determined alarm conditions, to the monitoring system 106. The HMI 114 can be one or more computing devices in communication with user interface devices (e.g., displays) allowing an operator of the machine to review measured operating parameters and/or provide instructions to the machine control system 112.

So configured, the monitoring system 106 can facilitate protection of a machine containing the target 102. As an example, in response to annunciation of an alarm status, the machine control system 112 can be utilized to control operation of the target 102 (e.g., automatically according to programmed logic or manually using the HMI 114) to cause the measured operating parameters to change and move out of the alarm status. Under extreme circumstances, the machine control system 112 can be employed to shut down operation of the machine to protect the target 102 from damage and/or workers from injury. The historian 116 can store any of the data contained within the monitoring signals 106s.

The external network 110b can be a business network that is in communication with a diagnostic system 120. The diagnostic system 120 can analyze any of the data contained within the monitoring signals 108s received from the monitoring system 106 to diagnose improper operation of the target 102 and/or predict improper operation of the target 102 before it occurs. Thus, by providing monitoring signals 108s to the external network 110b, the monitoring system 106 can facilitate condition monitoring of the target 102.

The monitoring system 106 is illustrated in greater detail in FIG. 1B. As shown, the monitoring system 106 includes a backplane 150 that can be configured to allow communication between different components coupled thereto. The components can include a measurement processing circuit 152a, a relay output circuit 154a, a measurement output circuit 156a, a configuration and diagnostic circuit 160a, and corresponding interface circuits 152b, 154b, 156b, 160b. The interface circuits 152b, 154b, 156b, 160b can provide hardware interfaces for communication to and from their respective circuits 152a, 154a, 156a, 160a. The individual circuits 152a, 154a, 156a, 160a can communicate selected information on the backplane 150 using protocols running on busses formed from passive traces extending across the backplane 150.

In one aspect, the measurement processing circuit 152a can be coupled to an interface circuit 152b such that sensor signals 104s received by the interface circuit 152b are transmitted directly to the measurement processing circuit 152a. That is, the sensor signals 104s are not transmitted to the backplane 150. The sensor signals 104s can be accessed by an operator through an output port 162. Multiple measurement processing circuits 152a and interface circuit 152b can be present, on a one-to-one basis, for receipt of the sensor signals 104s. As discussed above, the measurement processing circuit 152a can be configured to determine one or more values for the operating parameter measurements contained within the received sensor signal 104s. The measurement processing circuit 152a can also compare determined values, and/or measured variables of the enhanced data, to pre-determined alarm conditions in real-time and determine a status for the target 102. The measurement processing circuit 152a can further output signals representing the measured variables of the enhanced data, the determined values, and the determined statuses to the backplane 150.

The measurement processing circuit 152a can also format process variables (e.g., determined values, measured variables of the enhanced data set, annunciated alarms, etc.) for output to the machine control system 112. As an example, the format can be a current that ranges between about 4 mA to about 20 mA (also referred to as 4-20) and is proportional to the determined values and/or measured variable as compared to a corresponding scale. The machine control system 112 can utilize the process variables for process control of the target 102.

The statuses determined by the measurement processing circuits 152a can be retrieved by the relay processing circuit 154a from the backplane 150. The relay processing circuit 154a can include relays that are programmed to actuate based upon received alarm statuses to annunciate an alarm. In one example, relays can actuate based upon a single status. In another example, relays can actuate based upon Boolean expressions (e.g., AND or voting) that combine two or more statuses. The relay processing circuit 154a can also output signals representing annunciated alarms directly to the machine control system 112 for process control of the target 102. As an example, the machine control system 112 can shut down operation of the target 102 upon receipt of an alarm annunciation. Annunciated alarms can also be used to provide indications and/or to drive into digital input of the machine control system 112, the HMI 114, or historian 116.

The measurement output circuit 156a can retrieve data such as determined values, measured variables of the enhanced data, determined statuses, and annunciated alarms from the backplane 150 for transmission to the internal network 110a. Upon receipt, the retrieved data can be stored by the historian 116 and/or reviewed by an operator using the HMI 114.

The configuration and diagnostic circuit 160a can receive first configuration commands from the internal network 110a and transmit the first configuration commands to the backplane 150 for use by the circuits 152a, 154a, 156a, 160a. The first configuration commands can provide one or more set points for use by the measurement processing circuit 152a in determining statuses. The first configuration commands can also provide logic instructions and identify statuses to be used by the relay output circuit 154a for alarm annunciation. The first configuration commands can further identify data such as determined values, measured variables of the enhanced data, determined statuses, and/or annunciated alarms to be retrieved from the backplane 150 by the measurement output circuit 156a and transmitted to the internal network 110a.

The configuration and diagnostic circuit 160a can also receive second configuration commands from the internal network 110a. The second configuration commands can identify data such as determined values, measured variables of the enhanced data, determined statuses, and annunciated alarms to be retrieved from the backplane 150 and transmitted to the external network 110b for use by the diagnostic system 120.

While capable of facilitating protection monitoring and condition monitoring of the target 102, in some instances, the architecture of monitoring systems such as monitoring system 106 can lack flexibility. In one aspect, placement of the configuration and diagnostic circuit 160a in communication with both the internal and external networks 110a, 110b can cause delays when updating the second configuration commands. When diagnosing machine problems, it can be desirable to change the data received by the diagnostic system 120. However, transmissions to or from components in communication with the internal network 110a can be strictly regulated in order to protect the machine control system 112 from unauthorized access. This regulation can include permitting the configuration and diagnostic circuit 160a to transmit data to the external network 110b for condition monitoring but prohibiting transmission of changes to the second commands from the external network 110b to the configuration and diagnostic circuit 160a. Instead, an authorized operator of the machine control system 112 can be required to approve any changes to the second configuration commands and transmit the updated second conditioning commands from the internal network 110a to the configuration and diagnostic circuit 160a.

In another aspect, directly coupling the interface circuit 152b receiving the sensor signals 104s to the measurement processing circuit 152a can limit access of the sensor signal 104s to only the measurement processing circuit 152a. As a result, the other circuits 154a, 156a, 160a of the monitoring system 106, as well as the diagnostic system 120, cannot utilize the raw operating parameter measurements transmitted by the sensor signal 104s. Furthermore, should a second measurement processing circuit (not shown) be added to the monitoring system for receipt of additional sensor signals from another sensor, each measurement processing circuit could utilize the operating parameter measurements it receives but not operating parameters received by the other.

In a further aspect, process variables output by the measurement processing circuit 152a to the machine control system 112 can be limited. In general, for each sensor signal 104s received by the measurement processing circuit 152a, there can be a variety of possible process variables (e.g., determined values and/or measured variables of the enhanced data set). As an example, there can be 8 possible process variables determined by the measurement processing circuit 152a from a sensor signal 104s measuring radial vibration (vibration amplitude, gap voltage, 1× filtered amplitude, 2× filtered amplitude, 1× filtered phase, 2× filtered phase, Not 1× amplitude, and Smax. However, the measurement processing circuit 152a can possess the ability to output a single process variable for each sensor 104 from which it receives sensor signals 104s.

Figure 2:
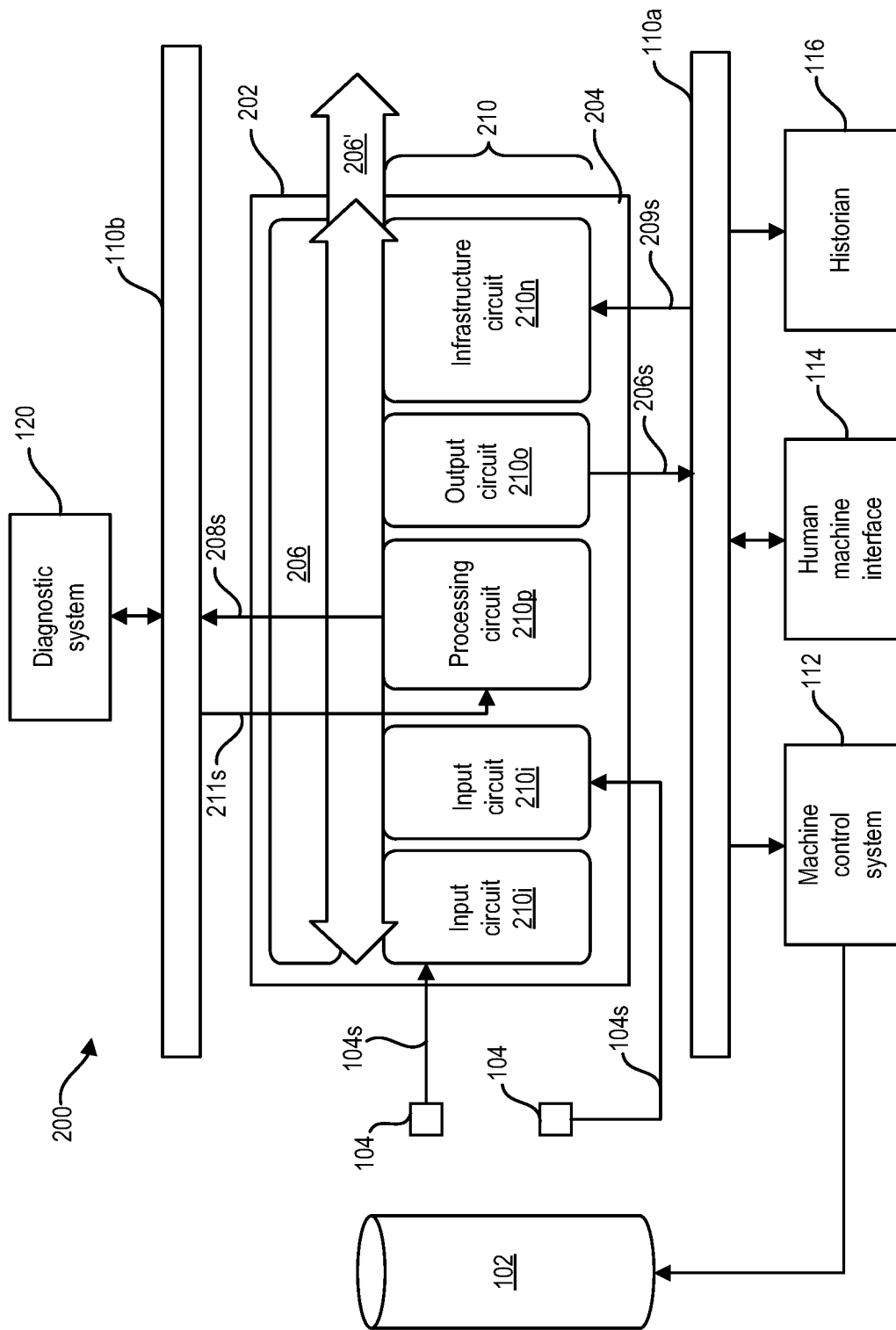
FIG. 2 is a block diagram illustrating one exemplary embodiment of an operating environment containing a flexible monitoring system configured to monitor a machine.

One or more of these limitations can be addressed by embodiments of a flexible monitoring system of the present disclosure. FIG. 2 illustrates an exemplary embodiment of an operating environment 200 including a flexible monitoring system 202. The operating environment 200 can be similar to the operating environment 100, except that the monitoring system 106 is replaced with the flexible monitoring system 202. The flexible monitoring system 202 can include a base 204 containing a backplane 206, and one or more circuits 210. The backplane 206 can be configured to communicatively couple with two or more circuits 210 and receive data from at least one circuit 210 coupled thereto. As discussed herein, data transmitted to the backplane 206 can be referred to as monitoring data. In one aspect, monitoring data can include information contained within the sensor signals 104s, such as measured operating parameters of the target 102 and measured variables of the enhanced data set. Monitoring data can also include any values, statuses, and/or annunciated alarms that are determined based upon the measured operating parameters of the target 102 and/or measured variables of the enhanced data set. Circuits 210 coupled to the backplane 206 can retrieve monitoring data from the backplane 206. In certain embodiments, the backplane 206 can be passive. A passive backplane can contain substantially no or no logical circuitry that performs computing functions. Desired arbitration logic can be placed on daughter cards (e.g., one or more of the circuits 210) plugged into or otherwise communicatively coupled to the passive backplane.

In contrast to the circuits 152a, 154a, 156a, 160a of the monitoring system 106, the circuits 210 can be designed with a common architecture that is programmable to perform different predetermined functions of the flexible monitoring system 202. Sensor signals 104s received by one or more of the circuits 210 can be transmitted to the backplane 206 and monitoring data represented by the sensor signals 104s can be accessed by any circuit 210. Furthermore, the flexible monitoring system 202 can communicatively couple multiple bases in a manner that forms a common backplane 206' from the individual backplanes 206 of each base 204 (e.g., a logical backplane). Thus, circuits 210 can retrieve monitoring data from any backplane 206 forming the common backplane 206', rather than just from the backplane 206 to which they are physically coupled.

Figure 3:
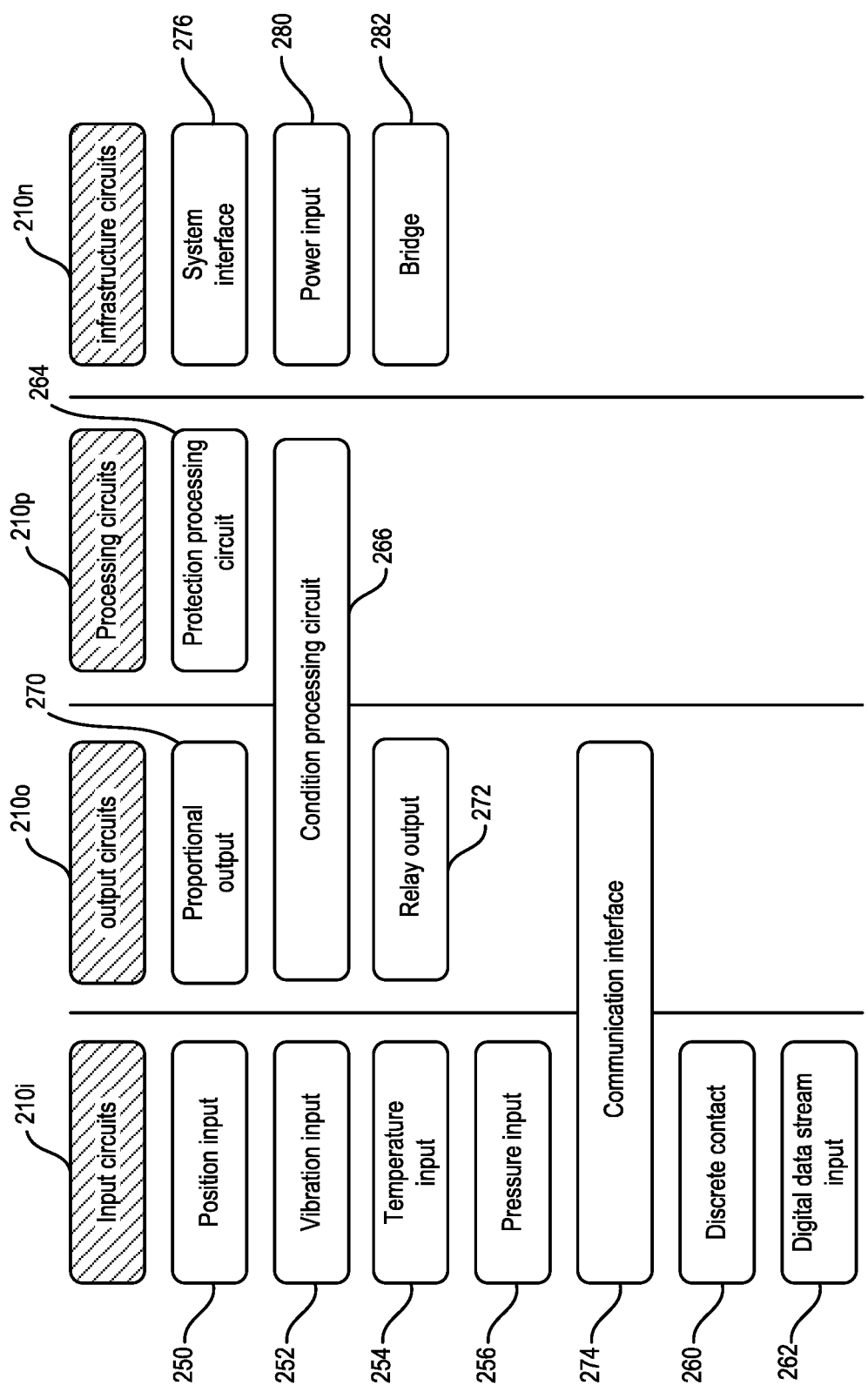
FIG. 3 is a diagram illustrating families of various types of functional circuits that can be used with the scalable monitoring system shown in FIG. 2.

In certain embodiments, the circuits 210 of the flexible monitoring system 202 can be configured to provide at least functionality similar to that of circuits 152a, 154a, 156a, 160a of the monitoring system 106. Exemplary embodiments of circuits 210 are illustrated in FIGS. 2-3 and discussed in detail below. As an example, circuits 210 can include input circuits 210i, processing circuits 210p, output circuits 210o, and infrastructure circuits 210n. It can be understood, however, that the circuits 210 can be programmed to perform other functions. Accordingly, the flexible monitoring system 202 can be configured to receive sensor signals 104s and output monitoring signals 206s, 208s to the internal and external networks 110a, 110b, respectively. As discussed in detail below, embodiments of the flexible monitoring system 202 can receive command signals 209s, 211s from the internal and external networks 110a, 110b, respectively, without compromising security of the machine control system 112. As a result, the flexible monitoring system 202 can be a suitable replacement for existing deployments of monitoring systems 106 while providing improved flexibility and functionality.

With this architecture, the circuits 210 can be combined in various ways on one or more backplanes 206 to form different implementations of the flexible monitoring system 202. The number of bases 204, input circuits 210i, processing circuits 210p, output circuits 210o, and infrastructure circuits 210n included in a given implementation of the flexible monitoring system 202 can also be varied independently of one another. In some implementations, the flexible monitoring system 202 can be in the form of a single base 204 including circuits 210 configured to provide signal input, signal output, protection monitoring, condition monitoring, and combinations thereof. In other implementations, the flexible monitoring system 202 can be in the form of at least two bases 204 and circuits 210 configured to perform any combination of signal input, signal output, protection monitoring, and condition monitoring can be distributed between the at least two bases 204. In this manner, the input, processing, and output capabilities of the flexible monitoring system 202, as well as the physical location of different circuits 210 of the flexible monitoring system 202, can be tailored to specific monitoring applications.

Furthermore, implementations of the flexible monitoring system 202 can be modified after initially deployed to modify the circuits 210 coupled to a given base 204 in the event that the intended monitoring application changes. Given their common architecture, circuits 210 can be easily added to a base 204 having capacity to couple to a new circuit 210. Alternatively, one or more new bases 204 can be communicative coupled to an existing base 204, allowing one or more new circuits 210 to be couple to respective backplane(s) 206 of the new base(s) 204 and expanding the monitoring capabilities of the flexible monitoring system 202. In some instances, circuits 210 removed from one base 204 of the flexible monitoring system 202 can be stored in reserve as spares or redeployed to another base 204 of the same or a different implementations of the flexible monitoring system 202, which may be beneficial.

In certain embodiments, input circuits 210i can be configured to receive sensor signals 104s, perform signal conditioning on the sensor signals 104s, and output the conditioned sensor signals 104s to the backplane 206. In contrast to the monitoring system 106 of FIGS. 1A-1B, the input circuits 210i can be decoupled from processing circuits 210p, allowing the number of input circuits 210i of the flexible monitoring system 202 to be varied independently of the number of processing circuits 210p.

The sensor signals 104s can be received from a variety of different types of sensor 104. Examples of sensor types can include, but are not limited to, vibration sensors, temperature sensors (e.g., resistance temperature detectors or RTD), position sensors, and pressure sensors.

Embodiments of the flexible monitoring system 202 can include one or more input circuits 210i. As shown in the FIG. 2, the flexible monitoring system 202 includes two input circuits 210i. Each of the input circuits 210i can be in communication with a respective sensor 104 for receipt of a corresponding sensor signal 104s. As an example, one sensor signal 104s can represent first monitoring data including measurements of a first operating parameter of a first machine component (e.g., acquired by a first sensor). The other sensor signal 104s can represent second monitoring data including measurements of a second operating parameter of a second machine component (e.g., acquired by a second sensor, different from the first sensor). In certain embodiments, the first and second machine components can be the same (e.g., the target 102). In other embodiments, the first and second machine components can be different (e.g., the target 102 and a different target [not shown]). Similarly, in some embodiments, the first and second operating parameters can be the same operating parameter. In one aspect, this configuration can provide redundancy in case of failure of one of the sensors 104. In another aspect, this configuration can be utilized where a desired measurement (e.g., shaft rotation speed) is derived from two sensor measurements coordinated in time (phase). In additional embodiments, the first and second operating parameters can be different. While two input circuits 210i have been illustrated and discussed, other embodiments of the monitoring system can include greater or fewer input circuits.

Different types of sensors 104 can generate sensor signals 104s in different formats, and input circuits 210i can be programmed to perform signal conditioning appropriate to the different sensor signals 104s before transmitting conditioned sensor signals to the backplane 206. Examples of various types of inputs are illustrated in FIG. 3. In one instance, a sensor signal 104s received from a position sensor can be received by a position input circuit 250. In another instance, a sensor signal 104s received from a vibration sensor can be received by a vibration input circuit 252. In an further instance, a sensor signal 104s received from a temperature sensor can be received by a temperature input circuit 254. In an additional instance, a sensor signal 104s received from a pressure sensor can be received by a pressure input circuit 256.

In other embodiments, the input circuit 210i can be in the form of a discrete contact circuit 260. The discrete contact circuit 260 can include a pair of contacts that can be closed by an external switch or relay. The pair of contacts can be closed by the machine control system 112 or by an operator of the machine control system 112 closing a switch. The discrete contact circuit 260 can be used to change the behavior of the flexible monitoring system 202. Examples of behavior changes can include, but are not limited to, a different mode of machine operation, causing the flexible monitoring system 202 to inhibit alarm determination, and resetting alarm states.

While the monitoring system 106 can include a discrete contact, it can lack specificity. As an example, changes effected by closing a discrete contact in the measurement system 106 can be effected upon all alarms generated by the measurement system 106. In contrast, because the discrete contact circuit 260 of the flexible monitoring system 202 can be separate from the protection processing circuit 264, the discrete contact circuit 260 can be configured to effect only selected alarm determinations and/or reset alarm states, or effect all alarms.

In further embodiments, the input circuit 210i can be in the form of a digital data stream input circuit 262. As an example, the digital data stream input circuit 262 can be configured to receive digital data streams from the sensor 104, the machine control system 112, and/or a trusted third-party system, as opposed to an analog data stream (e.g., from sensor 104).

Processing circuits 210p can be configured to retrieve any data from the backplane 206, analyze the retrieved operating parameters, and output the results of such analysis. As illustrated in FIG. 3, certain embodiments of the processing circuits 210p can be configured to perform protection functions and can be referred to as protection processing circuits 264 herein. In other embodiments, the processing circuits 210p can be configured to retrieve selected data from the backplane 206 and transmit the retrieved information to the diagnostic system 120 for performing diagnostic and/or predictive functions (e.g., condition monitoring) and can be referred to as condition processing circuits 266 herein.

The number of processing circuits 210p and input circuits 210i included in a given implementation of the flexible monitoring system 202 can be varied independently of the one another. In certain embodiments, processing circuits 210p can be added to the backplane 206 or removed from the backplane to tailor the amount of computing resources available for protection monitoring and/or condition monitoring. In other embodiments, a given processing circuit 210p can be replaced by another processing circuit 210p having greater or less computing power.

Any of these scenarios can be beneficial under certain circumstances, providing computational flexibility to the flexible monitoring system 202 that can be tailored to a given application and/or modified as needed. In one instance, machines having relatively low importance can have higher cost pressures and lower processing requirements. In this circumstance, an implementation of the flexible monitoring system 202 can include processing circuits 210p having processing resources tailored for cost. In another instance, a particular monitoring application can require high processing requirements (e.g., for determining values characterizing the measured parameters, for output of monitoring data, etc.). In this circumstance, an implementation of the flexible monitoring system 202 can include processing circuits 210p having processing resources tailored for processing resources. Thus, the architecture of the flexible monitoring system 202 can allow adaptation for different use cases depending upon the priorities of the intended monitoring application.

The protection processing circuits 264 and the condition processing circuits 266 are discussed below with reference to different functionalities. However, protection processing circuits 264 can be programmed to perform any function of the condition processing circuits 266. Condition processing circuits 266 can be programmed to perform functions of the protection processing circuits 264, except for transmitting data to the backplane 206 and providing local storage. The ability to inhibit the condition processing circuit 266 from transmitting data to the backplane 206 can inhibit unauthorized intrusion and facilitate protection of the internal network 110a and machine control system 112.

Protection processing circuits 264 can be configured to retrieve selected monitoring data from the backplane 206 in response to receipt of a protection command. As an example, one or more protection commands can be transmitted to protection processing circuits 264 in the form of protection command signal 209s received from the internal network 110a (e.g., from an operator of the machine control system 112). The selected monitoring data can include at least a portion of the monitoring data transmitted to the backplane 206. The monitoring data transmitted to the backplane can be received from an input circuit 210i or another protection processing circuit 264. The protection processing circuits 264 can also be configured to determine a value characterizing the selected monitoring data and transmit the determined value to the backplane 206 as additional monitoring data.

The protection processing circuit 264 can be configured to determine a status for the selected monitoring data based upon a comparison of the determined value, another determined value retrieved from the backplane 206 (e.g., from another protection processing circuit 264), and combinations thereof, with one or more predetermined set points. Predetermined set points can correspond to respective alarm conditions (e.g., an Alert condition, a Danger condition, etc.). Continuing the example above, where the determined value is an amplitude of a radial vibration, the one or more set points can include an Alert set point, a Danger set point that is greater than the Alert set point, and combinations thereof. In certain embodiments, a single set point can be employed. Assuming the use of Alert and Danger set points, if the radial vibration amplitude value is less than the Alert set point, the status of the radial vibration amplitude can be determined as "OK." If the radial vibration amplitude value is greater than or equal to the Alert set point, the status of the radial vibration amplitude can be determined as "Alert." If the radial vibration amplitude value is greater than the Danger set point, the status of the operating parameter can be determined as "Danger." After the status of the selected monitoring data is determined in this manner, the protection processing circuit 264 can transmit the determined status to the backplane 206. The condition processing circuit 266 can be configured to retrieve selected monitoring data from the backplane 206 and to provide the retrieved monitoring data to the external network 110b for use by diagnostic system 120. In certain embodiments, the selected monitoring data can be retrieved by the condition processing circuit 266 in response to receipt of a conditioning command. As an example, one or more conditioning commands can be transmitted to condition processing circuits 266 in the form of conditioning command signals 211s can be received from the external network 110b. (e.g., from an operator of the diagnostic system 120). In turn, the diagnostic system 120 can utilize the retrieved monitoring data to determine the cause of statuses and/or alarm conditions. Alternatively or additionally, the diagnostic system 120 can also employ the retrieved monitoring data to predict the development of statuses and/or alarm conditions before they arise. In further embodiments, the diagnostic system 120 can store the retrieved monitoring data for subsequent analysis. In additional embodiments, the diagnostic system 120 can transmit the retrieved monitoring data to another computing device for analysis.

In further embodiments, the condition processing circuit 266 can retrieve selected monitoring data from the backplane 206 based upon detection of a pre-determined status. As an example, the condition processing circuit 266 can retrieve and review statuses generated by the protection processing circuit 264 to identify a status matching the pre-determined status. The identified status can also include a status time characterizing the time when the status was determined. Upon identification of a match, the condition processing circuit 266 can retrieve selected monitoring data including operating parameter measurements corresponding to the pre-determined status for time durations before and/or after the status time. In this manner, the diagnostic system 120 can be provided with operating parameter information relevant to determining the cause of the status. The pre-determined statuses and selected monitoring data can be contained within the one or more conditioning commands.

The number of condition processing circuits 266 present in the flexible monitoring system 202 can be varied independently of the number of input circuits 210i. In certain embodiments, condition processing circuit 266 can be added to increase the ability of the flexible monitoring system 202 to output monitoring data. As an example, when two or more condition processing circuits 266 are present in the flexible monitoring system 202, each can tasked with output of different measured operating parameters. In another example, two or more condition processing circuits 266 can output the same measured operating parameters in order to provide redundancy. Each can be beneficial under certain circumstances, providing computational flexibility to the flexible monitoring system 202. In a further example, condition processing circuits 266 can be added to implement custom analytics without interfering with standard operation (e.g., when beta-testing a new analytic).

Output circuits 210o can be configured to obtain any monitoring data contained on the backplane 206 in response to receipt of output commands (e.g., contained in the one or more protection command signal 209s received from the internal network 110a). The output circuits 210o can further output the retrieved monitoring data to the internal network 110a in the form of output monitoring signals 206s. Examples of monitoring data retrieved by output circuits 210o can include, but are not limited to, operating parameter measurements, the determined values, variables of the enhanced data set, statuses, and alarms.

With continued reference to FIG. 3, embodiments of the output circuits 210o can be in the form of proportional output circuits 270. The proportional output circuits 270 can be configured to output monitoring signals 206s in the form of process control signals (not shown). The process control signals can be proportional to process variables, such as direct measurement values or variables of the enhanced data set, as compared to a predetermined scale. As an example, a current output can be a 4-20 mA output. The process control signals can be provided to the machine control system 112, either directly or via the internal network 110a, to facilitate control of operating parameters of the target 102. The process variables included in the process control signals can be specified by the protection command signal 209s.

In further embodiments, output circuits 210o can be in the form of one or more relay circuits 272 configured to retrieve selected status data from the backplane 206 and to actuate based upon received alarm statuses to annunciate an alarm. Annunciated alarms can be output in the form of alarm signals (not shown). In one example, relays can actuate based upon a single status. In another example, relays can actuate based upon predetermined Boolean expressions (e.g., AND or voting) that combine two or more statuses. The alarm signals can be provided to the machine control system 112 via the internal network 110a, or directly to the machine control system 112, to facilitate control of operating parameters of the target 102. As an example, the machine control system 112 can shut down operation of the target 102 in response to receipt of an alarm signal. The selected status data and the logic employed for actuation of a relay can be specified by the protection command signal 209s In other embodiments, output circuits 210o can be in the form of at least one communication interface circuits 274. The communication interface circuit 274 can be configured to retrieve selected monitoring data from the backplane 206 in response to receipt of the protection command signal 209s. The selected monitoring data can include one or more of the measured operating parameters, the measured variables of the enhanced data set, determined statuses, and determined alarms. The retrieved data can be transmitted to the internal network 110a in one or more output monitoring signals 206s for use by machine control system 212 (e.g., for process control), the HMI 114 (e.g., display to an operator) and/or stored by the historian 116.

Infrastructure circuits 210n can be configured to perform functionality required for the flexible monitoring system 202 to operate. As shown in FIG. 3, embodiments of the infrastructure circuits 210n can take the form of a system interface circuit 276. The system interface circuit 276 can function as an access point for transmission of protection command signals 209s from the internal network 110a to the monitoring system 220, facilitating configuration of the circuits involved in protection monitoring (e.g., protection processing circuit 264, output circuits 210i). The protection command signals 209s can include one or more signals including any of the following in any combination: identification of selected monitoring data for each of the protection processing circuit 264 and output circuits 210i to retrieve and/or output, alarm set points for the protection processing circuit 264, and logic for annunciation of relays by relay output circuits 272.

It can be appreciated that, in contrast to the monitoring system 106, embodiments of the flexible monitoring system 202 can separate the circuits 210 that configure protection monitoring functions (e.g., the system interface circuit 276) and condition monitoring functionality (e.g., the condition processing circuit 266). As a result, protection monitoring configuration can be performed entirely on the internal network 110a while condition monitoring configuration can be performed entirely on the external network 110b. That is, the internal network 110a is not communicatively coupled to the external network 110b. As a result, conditioning command signals 211s can be provided to the condition processing circuit 266 without the need to obtain approval from an authorized operator of the machine control system 112.

In appreciation of cybersecurity risks inherent in allowing the condition processing circuit 266 to communicate with the external network 110b and the backplane 206, the condition processing circuit 266 can be limited to unidirectional communication with the backplane 206 for data retrieval only. Such unidirectional communication can be established by any combination of hardware (e.g., data diodes), firmware, and/or software. In certain embodiments, this unidirectional communication is provided at least through hardware. As a result, the flexible monitoring system 202 can be kept secure from malicious actors while facilitating rapid configuration of the condition processing circuit 266.

In another aspect, infrastructure circuits 210n can take the form of power input circuits 280. Power input circuits 280 can provide the ability to connect one or more power sources to the flexible monitoring system 202.

In a further aspect, infrastructure circuits 210n can take the form of bridge circuits 282. The bridge circuits 282 can provide the ability to connect the backplanes 206 of two or more bases 204 together and to form the common backplane 206' for communication therebetween.

So configured, embodiments of the circuits 210 can be arranged in any combination distributed amongst one or more bases 204 to form implementations of the flexible monitoring system having desired monitoring capabilities (e.g., input, processing, output, etc.).

Figure 4:
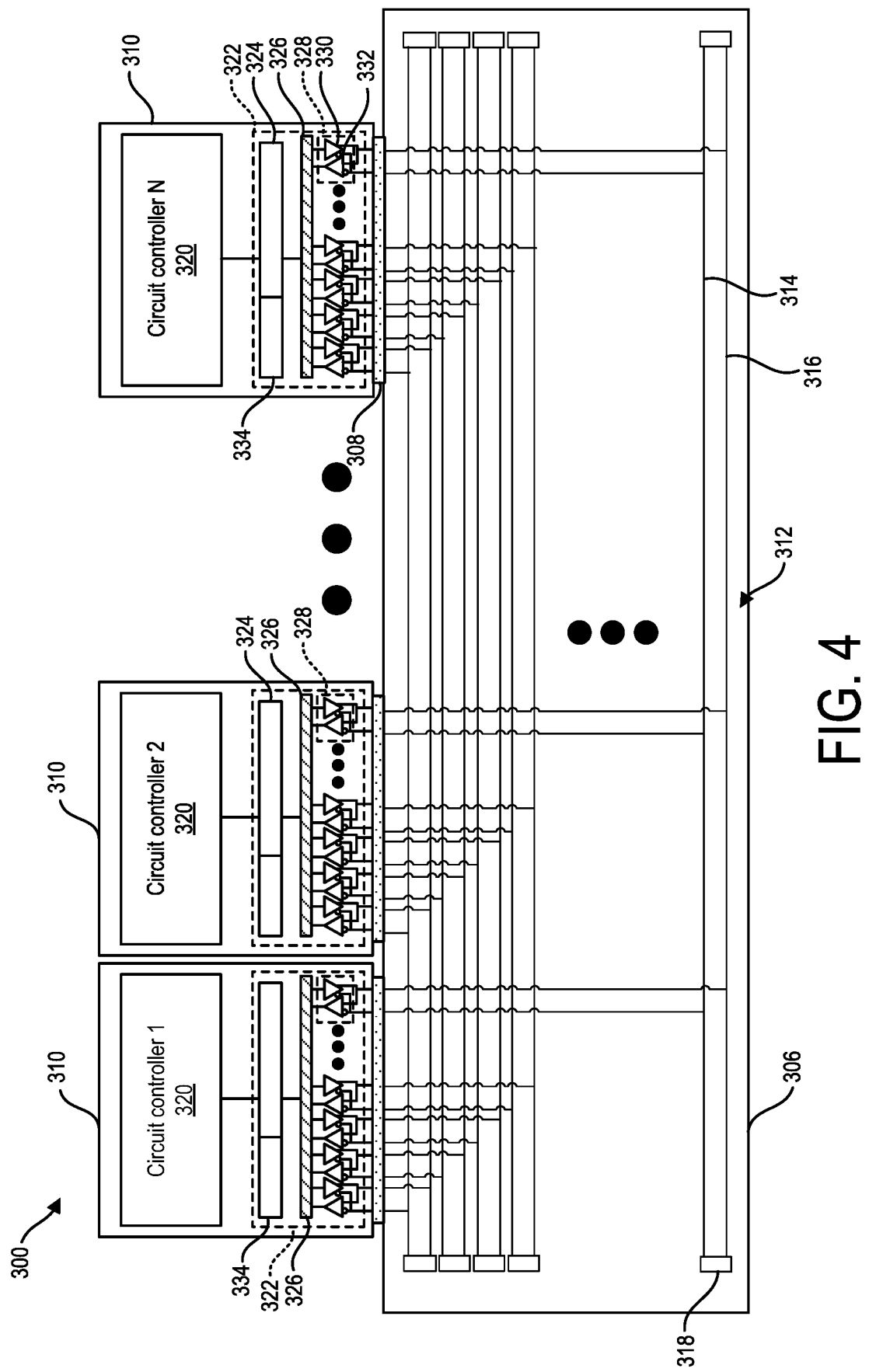
FIG. 4 is block diagram of a portion of an exemplary embodiment of a monitoring system.

FIG. 4 shows a detailed block diagram of a portion of an exemplary embodiment of a monitoring system 300 that can be configured to monitor operating parameters of industrial equipment. The monitoring system 300 can include any number of functional circuits 310, which can be detachably coupled to a backplane 306 via ports 308 of the backplane 306. The backplane 306 can be, include, or form part of, a physical bus. In some embodiments, the backplane 306 can have a unique ID that can be used to identify the backplane 306. The backplane 306 can be a passive backplane 306 configured to facilitate multipoint asynchronous electronic communication between the functional circuits 310 that are coupled to the backplane 306. Therefore, all data that is delivered to the backplane 306 can be received by all functional circuits 310 that are coupled to the backplane 306. In the illustrated example, the backplane 306 includes a number of data lanes 312 that are in electronic communication with ports 308 that are configured to receive functional circuits 310. Each port 308 is configured to facilitate electronic communication between a functional circuit 310 coupled to the port 308, and all of the data lanes 312 of the backplane 306.

As shown in FIG. 4, each data lane can include a transmitting portion 314 and a receiving portion 316. Ends of the transmitting and receiving portions can be coupled with resistors 318 that extend between the transmitting and receiving portions 314, 316. The resistors 318 can function to prevent, or mitigate, signal reflections that can be caused by unused energy associated with pulsed signals delivered to the data lanes 312 and/or noise due to inductance and capacitance effects associated with the data lanes 312. The transmitting and receiving portions 314, 316 of each data lane 312 can be coupled to each port 308 to facilitate electronic communication between the functional circuits 310 and the data lanes 312. Therefore, each port 308 facilitates delivery of data (e.g., data packets) to all data lanes 312, and retrieval of data from all data lanes 312.

There are a number of different types of functional circuits 310 that can be coupled do the backplane 306. For example, one or more of the functional circuits 310 can be an input circuit, a processing circuit, an output circuit, and/or an infrastructure circuit, as described with regard to FIGS. 2-3. In some embodiments, each functional circuit 310 can have a unique ID (e.g., a MAC address) that can be used to identify the functional circuit 310. The monitoring system 300 provides a high degree of flexibility and scalability by allowing a user to adjust performance of the monitoring system by attaching different functional circuits 310 to the backplane. For example, processing power can be increased by coupling additional processing circuits to the backplane 306. As another example, the monitoring system 300 can be expanded by coupling additional input circuits to the backplane 306 such that the monitoring system 300 can receive and process sensor data from additional sensors (e.g., sensors 104) used for monitoring the industrial equipment.

As shown in the illustrated example, each functional circuit 310 can include a circuit controller 320 and a node 322 configured to facilitate and control electronic communication between the circuit controller 320 and the backplane 306. For example, the node 322 can control delivery of data from the circuit controller 320 to the data lanes 312 of the backplane 306. The nodes 322 can also control which data is delivered from the data lanes 312 to the circuit controllers 320 of the functional circuits 310.

The circuit controllers 320 can include memory, at least one data processor, and/or other circuitry configured facilitate operation as described herein. The circuit controllers 320 can be configured to perform specific operations corresponding to desired functionality of the functional circuit 310. In some embodiments, the circuit controllers 320 can be configured to receive data from an external source (e.g., a sensor, or a user device), process the data, and provide the data to the node 322. For example, if a given functional circuit is an input circuit, as described herein with regard to FIGS. 2-3, the circuit controller 320 can include an analog-to-digital (A/D) converter that can be configured to receive analog signals from sensors and convert the analog signals to digital signals. Each of the circuit controllers can be configured to receive data from all data lanes of the backplane (e.g., via the node 322) and process the data.

In some embodiments, circuit controllers 320 of functional circuits 310 such as, e.g., protection circuits, can be configured to retrieve any data packets (e.g., data packets corresponding to sensor measurements) from data lanes 312 of the backplane 306 (e.g., via the node), analyze the retrieved data packets, and provide the results of such analysis to the data lanes 312 of the backplane 306 (e.g., via the node). For example, circuit controllers 320 of protection circuits can also be configured to compare data received from the backplane to pre-determined alarm conditions in real-time and determine a status (e.g., OK, alert, danger, etc.) for any measured operational parameter or variable, alone or in combination. The determined status can be subsequently output to the data lanes 312 of the backplane 306. Circuit controllers 320 of condition monitoring circuits can generally function similarly to circuit controllers of protection circuits. However, nodes of condition monitoring circuits can prevent the circuit controllers 320 of the condition monitoring circuits from delivering data to data lanes 312 of the backplane 306, as described in more detail below.

In some embodiments, circuit controllers 320 of output circuits (e.g., output circuits 2100) can be configured to obtain any data packets delivered to the data lanes 312 of the backplane 306, and output monitoring signals (e.g., monitoring signals 106s) to any external systems (e.g., external systems 110). Examples can include, but are not limited to, the direct measurement values, variables of an enhanced data set, and statuses, 4-20 mA recorder outputs, voltages of direct measurement values, as described herein with regard to output circuits 210i. In some embodiments, circuit controllers 320 of output circuits such as, e.g., relays, can be configured to retrieve status data from data lanes 312 of the backplane 306 (e.g., via the node) and to actuate based upon received data characterizing alarm statuses. In one example, circuit controllers 320 of relay circuits can actuate based upon a single status. In another example, relay circuits can actuate based upon Boolean expressions (e.g., AND or voting) that combine two or more statuses. In some embodiments, upon actuation, relay circuits can be configured to deliver a monitoring signal (e.g., monitoring signal 106s) to a control system (e.g., customer control system 212). The control system can then stop operation of the equipment being monitored to prevent damage or failure.

Circuit controllers 320 of infrastructure circuits (e.g., infrastructure circuits 210n) can be configured to perform operations required for the monitoring system to function. For example, circuit controllers 320 of system interface circuits can function as an access point for configuration of any of the functional circuits, alarm conditions for protection of the industrial equipment, and conditions for actuation of relay circuits. In some embodiments, circuit controllers 320 of system interface circuits can be coupled to the control system and/or a HMI (e.g., HMI 220). A trusted user, such as, e.g., a plant operator, can provide configuration data to the circuit controller 320 of the system interface circuit via the control system and/or the HMI, and the system interface circuit can provide data packets characterizing the configuration data to data lanes 312 of the backplane 306.

As described herein, the circuit controllers 320 can be configured to provide data to the nodes 322, but the circuit controllers do not have direct control of data delivery to the data lanes 312. The nodes 322 of the functional circuits 310 can control data flow between the circuit controllers 320 and the data lanes 312. Each node 322 can include a node controller 324, a gate controller 326, as well as an array of gate pairs 328. The gate pairs 328 can be configured to facilitate electronic communication between the functional circuits 310 and the data lanes 312 of the backplane 306. Each gate controller 326 can be configured to control operation of transmitters 330 and receivers 332 of the corresponding functional circuit 310, thereby controlling data flow between the functional circuit 310 and the data lanes 312 of the backplane 306. The transmitters 330 and receivers 332 can be referred to as gates. The transmitters 330 and receivers 332 are described in more detail below.

The node controllers 324 can include memory, at least one data processor, and/or other circuitry configured facilitate operation as described herein. Each node controller 324 can be in electronic communication with the circuit controller 320 gate controller 326 of the corresponding functional circuit 310. The node controller 324 can function as an interface between the circuit controller 320 and the gate controller 326 and/or the transmitters 330 and receivers 332. For example, the node controller 324 can be configured to control which data is transferred from the data lanes 312 to the circuit controller 320 using, e.g., packet filtering techniques. As an example, a circuit controller 320 of a functional circuit 310 such as, e.g., a protection circuit, can send a signal to the node controller 324 to instruct the node controller to provide specific data from the backplane 306. The node controller 324 can monitor data lanes 312 of the backplane 306, identify the desired data packets, and deliver the data packets and/or, data corresponding to the data packets, to the circuit controller 320 for processing. In some embodiments, the node controllers 324 can use information provided with data packets delivered to the backplane to identify relevant data to provide to the circuit controller 320. For example, the node controller can use IP addresses, MAC addresses, TCP/IP headers, UDP/IP headers, message headers, object headers, source information. destination information, and/or contents of the data packets to identify relevant data packets to provide to the circuit controller 320. In some embodiments, the node controller 324 can be configured to receive signals from the circuit controller 320, encode the signals into bits, and deliver signals (e.g., data packets) corresponding to the encoded bits to the gate controller 326 for the data to be delivered to data lanes 312 of the backplane 306. The node controller 324 can also store a copy of a schedule that can be used to control operation of the transmitters 330 and receivers 332.

The gate controllers 326 can include memory, at least one data processor, and/or other circuitry configured facilitate operation as described herein. Each gate controller 326 can be in electronic communication with the transmitters 330, receivers 332, and the node controller 324 of the corresponding functional circuit 310. Each gate controller 326 can be configured to control operation of the transmitters 330 and the receivers 332 of the corresponding functional circuit 310, thereby controlling data flow between the functional circuit 310 and the data lanes 312 of the backplane 306. For example, the gate controllers 326 can control operating modes of the gate pairs 328. In some embodiments, the gate controllers 326 can be configured to control operating modes of the transmitters 330 and receivers 332 based on a predetermined schedule and/or instruction provided by the node controller 324. As an example, the gate controllers 326 can be configured to receive data from the node controller 324, store the data, and deliver it to the data lanes 312 at a scheduled time. In some embodiments, the gate controller 326 can receive the schedule from the node controller 324. The schedule, as well as operating modes of the transmitters 330 and receivers 332, are described in more detail below. In some embodiments, each data lane 312 can have a corresponding schedule that defines when the various functional circuits 310 can deliver data packets to that particular data lane 312.

As shown in the illustrated example, the gate pairs 328 can be electrically coupled to individual data lanes 312 via the ports 308. In some embodiments, each gate pair 328 can be a half-duplex transceiver that includes a transmitter 330 and a receiver 332. The transmitters and receivers can be referred to as gates. Each transmitter and receiver of each gate pair 328 can be electrically coupled to receiving and transmitting portions 316, 314 of a corresponding data lane 312, respectively. In some embodiments, the node controller 324, gate controller 326, transmitters 330 and/or receivers 332 can be a field programmable gate array (FPGA).

The transmitters can be configured to facilitate delivering signals corresponding to data packets to data lanes of the backplane. Each transmitter can have first and second operating modes. When in the first operating mode, the transmitters are configured to allow data (e.g., data packets) to be transferred from the functional circuits 310 to the data lanes 312 of the backplane 306. In some embodiments, the gate controller 326 can deliver control signals to the transmitters to set them to operate in the first operating mode. As an example, the control signal can be an electrical signal delivered to the transmitters. As another example, the control signal can be a change in a voltage and/or current of an electrical signal delivered to the transmitters. When in the second operating mode, the transmitters are configured to prevent data (e.g., data packets) from being transferred from the functional circuits 310 to the data lanes 312 of the backplane 306. For example, when in the second operating mode, the transmitters can be logically disconnected from the port 308 and from the corresponding data lane 312 of the backplane 306. When in the second operating mode, the transmitters can have a high impedance to prevent signals from being delivered to the data lanes 312 of the backplane 306. For example, the gate controller 326 can deliver control signals to the transmitters such that the transmitters have a high impedance, thereby preventing the transmitters from delivering data packets to the data lanes 312. As another example, the gate controller 326 can stop delivering electrical signals to the transmitters 330, thereby placing the transmitters 330 in a state of high impedance. Operating modes of each transmitter can be controlled independently by the gate controllers 326 of the functional circuits 310.

The receivers can facilitate receiving signals corresponding to data packets from data lanes 312 of the backplane 306. In some embodiments, the receivers can be configured to modify and/or control signals delivered to the circuit controller 320 from the backplane. For example, the receivers can receive signals from the data lanes 312 of the backplane 306, amplify the signals, and provide the signals to the circuit controller 320 (e.g., via the gate controller 326 and/or the node controller 324).

In some embodiments, the receivers can also have first and second operating modes. When in the first operating mode, the receivers can be configured to allow data (e.g., data packets) to be transferred from the attached data lane 312 to the node controller 324 and/or the circuit controller 320. When in the second operating mode, the receivers can be configured to prevent data (e.g., data packets) from being transferred from the attached data lane 312 to the node controller 324 and/or circuit controller 320. As an example, if the gate pairs 328 are half-duplex transceivers, when the transmitter is in the first operating mode, the receiver is in the second operating mode. In some embodiments, when the transmitter switches to the first operating mode, the transmitter can deliver a control signal to the receiver to switch the receiver to the second operating mode. Conversely, when the transmitter is in the second operating mode, the receiver is in the first operating mode. As an example, when the transmitter switches to the second operating mode, the transmitter can stop delivering the control signal to the receiver, thereby switching the receiver to the first operating mode.

In some embodiments, operating modes of the receivers can be controlled independently of the corresponding transmitter of the gate pair 328. For example, the gate controller 326 can deliver a control signal to the receivers to put the receivers in the second operating mode. Periodically, at predetermined times, the gate controller 326 can stop delivering the control signal to the receivers, thereby switching the receivers to switch to the first operating mode.

In order to effectively manage communication between each of the functional circuits 310, a communication schedule can be created and distributed among the functional circuits 310. In an exemplary embodiment, at least one node 322 of one of the functional circuits 310 can include a schedule controller 334 that can be part of, and/or in electronic communication with, the node controller 324. The schedule controller 334 can include memory, at least one data processor, and/or other circuitry configured facilitate operation as described herein. The schedule controller can be configured to generate schedules that can define when each of the transmitter and/or receivers are in the first or the second operating modes. Therefore, the schedule determines when each functional circuit 310 can deliver data to each data lane 312 of the backplane 306. Controlling operating modes of the transmitters 330 and receivers 332 can be referred to as gating. Each schedule can include a frame that corresponds to a predetermined amount of time. The frame can be divided into a number of time slices. Each time slice can be assigned to a given functional circuit 310, thereby allowing the functional circuit 310 to deliver data to the data lanes 312 during assigned time slice. Schedule generation can also be referred to as arbitration. Functional circuits 310 that are capable of generating schedules and delivering the schedules to the data lanes 312 can be referred to as arbitration capable functional circuits. The functional circuit 310 that is in control of generating the schedule can be referred to as a master circuit. The node 322 of the master circuit can be referred to as a master node, or a manager node. Other functional circuits 310 that are coupled to the backplane 306 can be referred to as slave circuits. The master circuit can be in a master/slave relationship with all other functional circuits (e.g., the slave circuits) that are coupled to the backplane 306. Nodes 322 of the slave circuits can be referred to as slave nodes.

In some embodiments, gating can be autonomously arbitrated between functional circuits 310 of the monitoring system 300. For example, upon initial system startup, the functional circuits 310 can wait for a predetermined period of time to receive a beacon packet indicating the presence of a master circuit. If the functional circuits 310 do not receive a beacon packet after the predetermined period of time, a functional circuit 310 that is capable of arbitration can deliver a beacon packet to the data lanes 312 indicating that it (the arbitration capable functional circuit 310) has assumed arbitration responsibilities, thereby becoming the master circuit.

To generate the schedule, the schedule controller 334 of the master circuit can start a schedule record in memory. The schedule controller 334 can then provide the node controller 324 with a signal to deliver a beacon packet to data lanes 312 of the backplane 306. The beacon packet can contain information about the monitoring system 300 (e.g., unique IDs) schedule for the current frame. The beacon packet can also include time syncing information that each of the slave circuits can use to synchronize internal clocks with that of the master circuit. Time synchronization can allow functional circuits 310 to effectively communicate over shared data lanes 312 at predetermined scheduled times. The beacon signal can also trigger slave circuits to request time slices within the following frame. Each slave circuit can deliver a beacon response packet to the data lanes 312 to request certain time slices to deliver data to the backplane 306. For example, node controllers 324 can generate beacon packets to request time slices based on requests received from the circuit controllers 320.

The schedule controller 334 of the master circuit can receive the requests and can assign time slices to various nodes 322 and/or functional circuits 310, thereby generating the schedule. The schedule controller 334 can deliver the schedule to the node controller 324, which can provide the schedule to the gate controller 326. The gate controller 326 can deliver the schedule to the data lanes 312 of the backplane 306 at predetermined time slices, which can be referred to as beacon time slices, via the transmitters. Each slave circuit can receive the schedule from the backplane 306, and implement the schedule. For example, gate controllers 326 of each functional circuit 310 can receive the schedule and can enforce the schedule by controlling operating modes of the transmitters 330 and receivers 332 based on what is defined within the schedule.

In some embodiments, the gate controller 326 of each node 322 can logically disconnect the transmitters from the data lanes 312 during time slices that are not assigned to that particular node 322. In this way, circuit controllers 320 of slave circuits can request certain time slices within the schedule, but the circuit controllers 320 have no direct control over the transmitters 330 and receivers 332 of the functional circuit 310. As such, the circuit controllers 320 have no direct control over when data can be delivered to the data lanes 312. Therefore, if a functional circuit is sending invalid data, e.g., due to accidental or intentional corruption, the functional circuit 310 only corrupt time slices that have been scheduled for that particular functional circuit 310.

During normal operation, the gate controller 326 of a given functional circuit 310 can operate all of the transmitters 330 in the first operating mode during time slices that are assigned to that particular functional circuit 310. During assigned time slices, the gate controller 326 can provide data to all of the data lanes simultaneously. For example, if the backplane 306 includes 16 data lanes, the gate controller 326 can transmit a 2 bytes of information by simultaneously transmitting 1 bit of information to each data lane via the transmitters 330.

In some embodiments, one or more of the slave circuits can be configured to assume arbitration responsibilities if the master circuit is disabled or removed from the backplane. For example, if the slave circuits do not receive a beacon signal at the beginning of a frame, an arbitration capable slave circuit can wait for a period of time before delivering a beacon packet to the data lanes 312 indicating that it (the arbitration capable slave circuit) has assumed arbitration responsibilities, thereby becoming the master circuit. Methods of generating the schedule, and communication between master circuits and slave circuits, are discussed in more detail below.

Since arbitration can be performed by multiple functional circuits 310, and gating can be managed by nodes 322 of each functional circuit 310 rather than by a centralize source on the backplane 306, the monitoring system 300 provides robust communication between functional circuits 310 without a single point of failure. The method of arbitration is discussed in more detail below.

Figure 5:
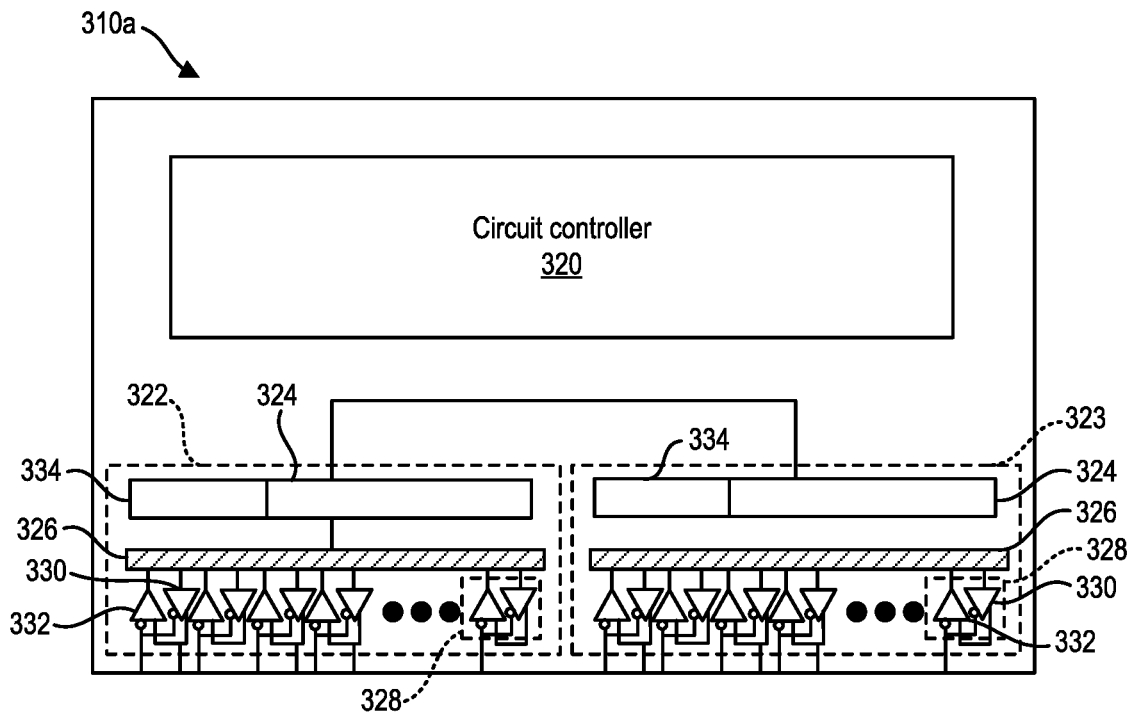
FIG. 5 is a block diagram of an exemplary embodiment of a functional circuit that includes two nodes.

The functional circuits 310 can vary in a number of ways. For example, in some embodiments, one or more functional circuits can include multiple nodes for redundancy. FIG. 5 shows an example of a functional circuit 310a that can generally be similar to the functional circuits 310 shown in FIG. 4, but that includes a primary node 322 and a secondary node 323. The functional circuit 310a can include a circuit controller 320 that can be in electronic communication with node controllers 324 of the nodes 322, 323. The primary and secondary nodes 322, 323 can include the node controllers 324, schedule controllers 334, gate controllers 326, and gate pairs 328 that can include transmitters 330 and receivers 332, which can be transmitters and receivers, respectively. The functional circuit 310a can be coupled to a port (e.g., port 308) of a backplane (e.g., backplane 306), and can function as described above with regard to the functional circuits 310 shown in FIG. 4. However, in this case, during operation one of the primary and secondary nodes 322, 323 can be disabled while the other of the primary and secondary nodes 322, 323 is operable. If the operable node 322, 323 fails, the other node 322, 323 can be activated to ensure that the functional circuit 310a can send data to, and receive data from, data lanes of the backplane. In some embodiments, the port of the backplane can couple corresponding gate pairs 328 of the individual nodes to the same data lane of the backplane, thereby allowing a seamless transition to the secondary node 323, if the primary node 322 fails.

Figure 6:
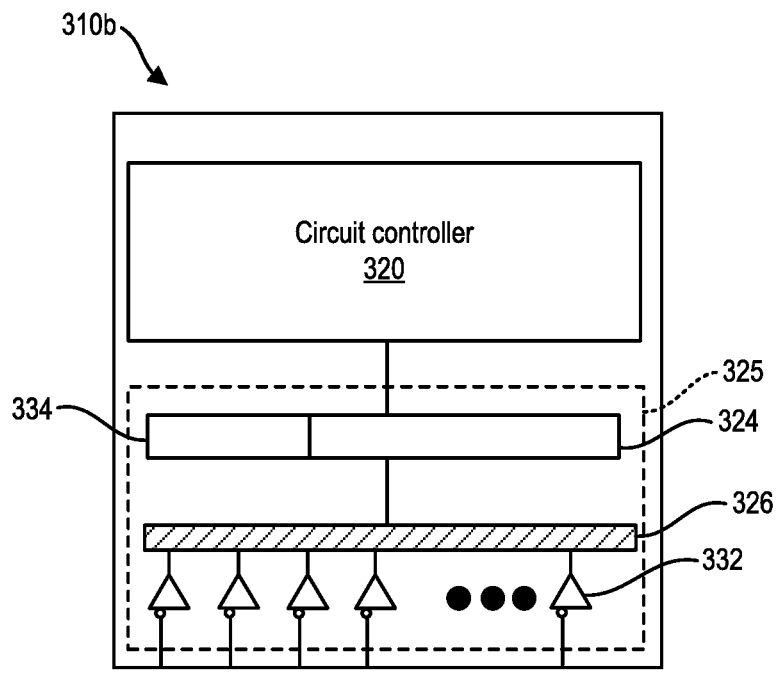
FIG. 6 is block diagram of an exemplary embodiment of a functional circuit that does not include transmitters.

In some embodiments, a monitoring system can include functional circuits that can be prevented from delivering data to the data lanes of the backplane. As an example, a functional circuit such as, e.g., a condition monitoring circuit, can be configured to receive data from data lanes of a backplane, but can be prevented from delivering data to the data lanes of the backplane. FIG. 6 shows an example of a functional circuit 310b that is configured to receive signals from data lanes of a backplane, but is prevented from delivering signals to the data lanes of the backplane. As shown in the illustrated example, the functional circuit that includes a circuit controller 320 and a node 325 that is configured to facilitate communication between the circuit controller 320 and data lanes of the backplane. The node 325 includes a node controller 324, a gate controller 326, receiver 332 such that it can receive signals from data lanes of a backplane, but does not include transmitters 330, thereby preventing the functional circuit 310b from delivering signals to the data lanes of the backplane.

In some embodiments, the functional circuit 310b can allow an untrusted, or external, user to view information from the backplane and interact with the circuit controller 320. An example of such a user can be, e.g., a remote maintenance engineer. As an example, the user can deliver data to the circuit controller 320 to request specific information (e.g., sensor data) from the data lanes for troubleshooting purposes. The circuit controller 320 can deliver the request to the node controller 324, which can allow the desired data to be delivered from the data lanes to the circuit controller 320. The user can review the data and assist a plant operator with troubleshooting, but cannot deliver any data to the data lanes of the backplane. Therefore, the user cannot make any changes to a monitoring system that employs the functional circuit 310b. The user can only relay information to the plant operator which, as a trusted user, can make changes to the monitoring system.

Controlling when each circuit module can communicate can provide a high degree of synchronization and determinism, which can facilitate communication between functional circuits without centralized switching within the bus. By utilizing functional circuits that can generate communication schedules, in conjunction with one or more bus that allows each of the functional circuits to communicate information to each other, the monitoring system 300 provides a modular, flexible, and scalable solution for monitoring industrial equipment.

Traditional monitoring systems can be limited in terms of flexibility and scalability. Additionally, costs and complexity of installation can create a significant barrier to entry for users that want to monitor low cost and/or low priority components/systems. By utilizing functional circuits that can be detachably coupled to the backplane, performance of the monitoring systems described herein can be adjusted and/or scaled to fit individual monitoring needs. For example, processing power can be increased by coupling additional processing circuits to the backplane. As another example, the monitoring system can be expanded by coupling additional input circuits to the backplane to such that the monitoring system can receive and process sensor data from additional sensors. Additionally, by generating a schedule at a master circuit, and gating communications at slave circuits, the monitoring system can provide robust communication and/or eliminate centralized failure points associated with system that use centralized switching for communication.

Figure 11:
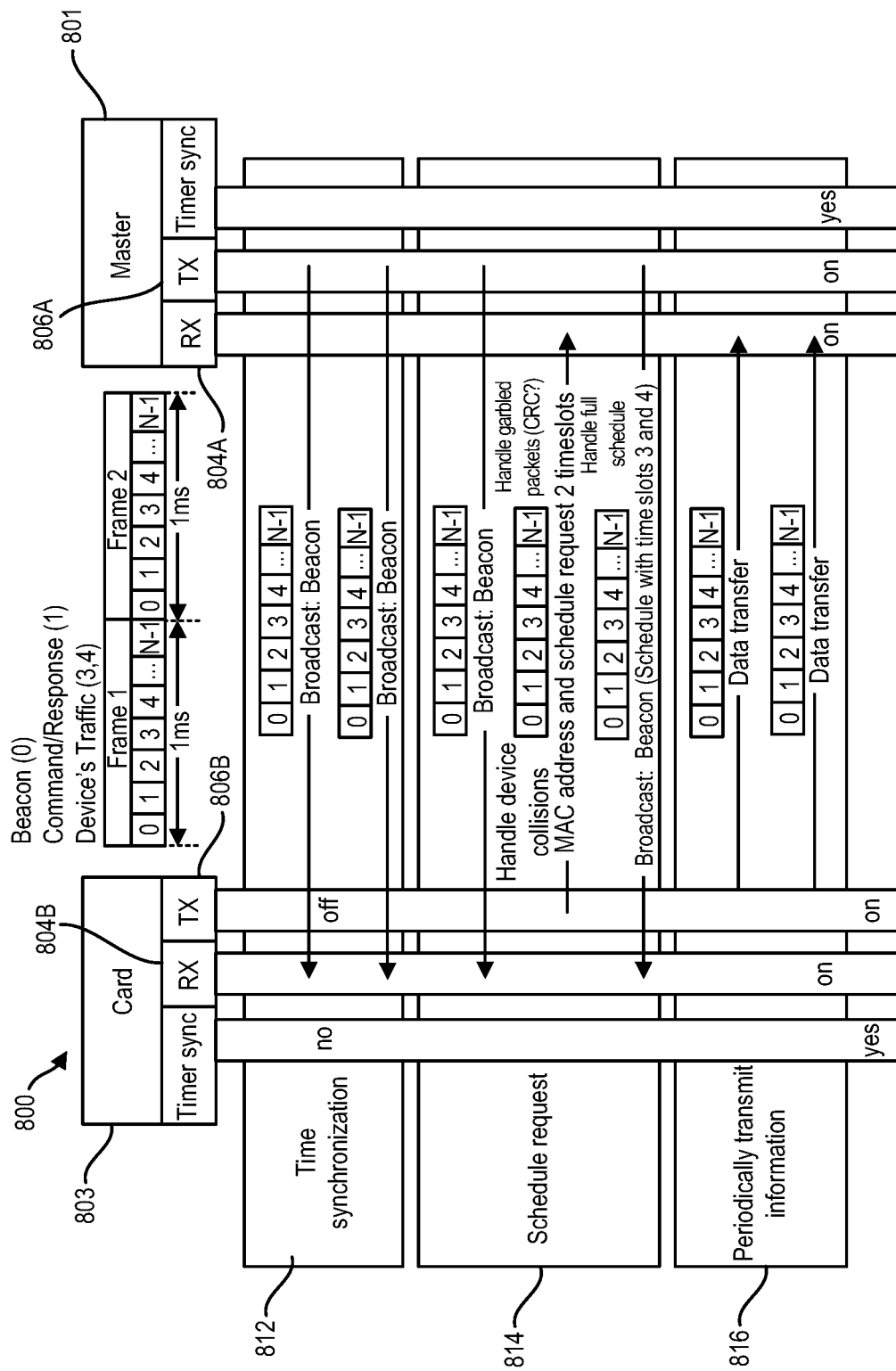
FIG. 11 is an exemplary communication protocol between a master circuit and a slave circuit.

Since functional circuits can send and receive signals via one or more data lanes in a bus, it can be desirable to configure functional circuits (e.g., functional circuits 310) to broadcast data based on a schedule. Doing so can prevent multiple functional circuits from broadcasting simultaneously resulting in reduction of collision between data packets broadcasted by different functional circuits. FIG. 11 illustrates an exemplary time sequencing of communication between functional circuits of a monitoring system. The monitoring system time can be divided into system frames during which functional circuit communication can be carried out based on a system frame schedule.

Figure 7:
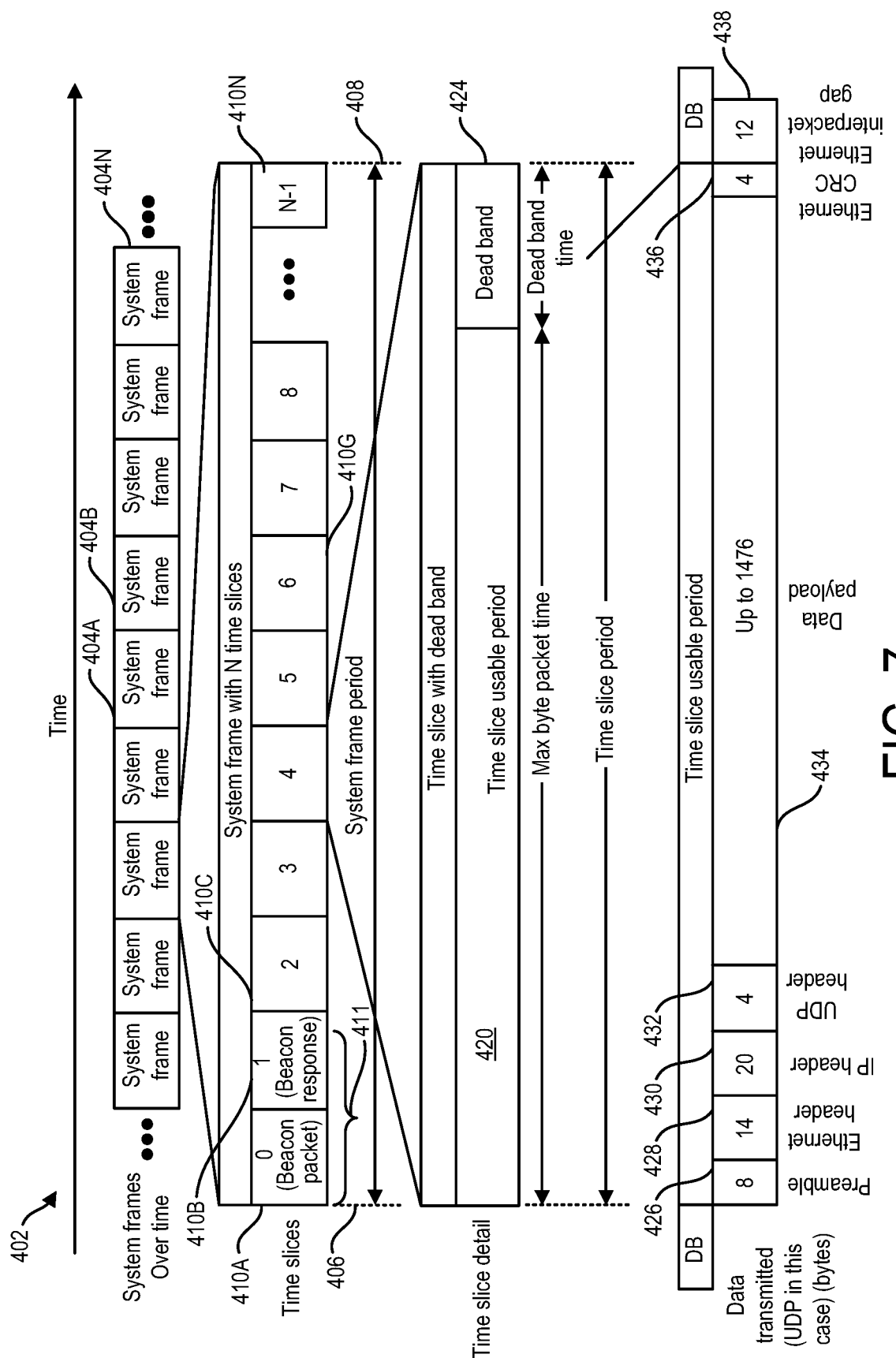
FIG. 7 is a diagram illustrating components of system frames.

As illustrated in FIG. 7, system time 402 can be divided into system frames 404A-N. A system frame 404A can extend over a period of time, for example, between a starting time 406 and an ending time 408. The system frame can be divided into multiple time slices 410A-410N that can be temporally contiguous. The first time slice 410A can begin at the starting time 406 which can be used as a reference time for the system frame. A second time slice 410B can be temporally adjacent to the first time slice 410A. The first time slice 410A can be referred to as a beacon time slice. The second time slice 410B can be referred to as a beacon response time slice. Together, time slices 410A and 410B can constitute an arbitration period 411 during which a master circuit can interact with slave circuits for allocation of time slices for data communication over the data lanes of the bus. The remaining time slices 410C-410N can constitute a data communication period during which slave circuit can broadcast data packets on the data lanes of the bus.

During the first time slice 410A of the arbitration period 411, the master circuit can broadcast a beacon packet on a data lanes of the bus to which the master circuit is communicatively coupled. The beacon packet can be received by the slave circuits (e.g., node controllers of the slave circuits) that are communicatively coupled to the data lane. The beacon packet can include a system frame schedule for the system frame 404A that allocates time slices of the data communication period (e.g., time slices 410C-410N) to slave circuits of the monitoring system. System frames can also be referred to as frames.

During the second time slice 410B of the arbitration period 411, one or more slave circuits can broadcast beacon response packet on the data lane of the bus. As an example, node controllers (e.g., node controller 324) can generate beacon response packets and deliver the beacon response packets to the data lane via transmitters (e.g., transmitters 330). The master circuit can receive the beacon response packets from the slave circuits. The beacon response packets can include requests for time slice assignment. The master circuit can generate schedules for future system frames (e.g., system frames 404B-N) that can include time slice assignments based on the requests in the beacon response packets from the slave circuits.

During the data communication period (e.g., 410C-410N), the slave circuits can broadcast data packets on the data lane of the bus. A slave circuit can receive the beacon packet broadcasted by the master circuit during the arbitration period 411, and can broadcast data packets during the time slice assigned to it in the system frame schedule of the beacon packet.

For example, the gate controller in the slave circuit can configure the slave bus node to transmit data packets during the time slice assigned to the slave circuit. This can be done by operating one or more transmitters in the slave bus node in a first operating mode where the transmitters allow data packets to be transferred from the slave circuit to one or more data lanes in the bus.

As illustrated by an expanded view of time slice 410G, each time slice 410A-410N can include a usable time slice period 420 temporally located prior to a dead band period 424. A slave circuits can be configured to transmit data packets during the usable time slice period of the assigned time slice. As an example, the usable time slice period 420 can be used to transmit a data packet that includes a preamble 426, headers 428, 430, 432, a data payload 434, a cyclic redundancy check (CRC) 436, and an interpacket gap 438. As an example, the headers 428, 430, 432 can be an Ethernet header, an IP header, and a UDP header, respectively. In some embodiments the preamble 426 can be 8 bytes, the data payload 434 can be 1476 bytes, the CRC 436 can be 4 bytes, and the interpacket gap 438 can be 12 bytes. Furthermore, in some embodiments, the headers 428, 430, 432 can be 14, 20, and 4 bytes, respectively. Information corresponding to sizes of preamble 126, the data payload 134, the CRC 436, and the interpacket gap 438, and the headers 428, 430, 432 can be distributed in schedules provided with beacon packets. The sizes of the various portions of data packets that can be transmitted during the useable time slice period can vary. Similarly, the duration of the useable time slice period 420 can vary. For example, the duration of the usable time slice period 420 can be determined based on the largest permissible data packet that can be broadcasted by a slave circuit and/or rates at which data can be transferred from functional circuits. The duration of the useable time slice period 420 can be at least as long as the amount of time required to transfer a data packet to the backplane. As an example, data packets can be in a range of approximately 56-65535 bytes. As another example, time slices have durations in the range of approximately 2500-13496 nanoseconds (ns).

The slave circuits may not transmit any data packets during the dead band period 424. The dead band periods 424 at the end of each time slice 410A-410N can facilitate seamless transitions between data delivery from functional circuits in communication data lanes of a backplane (e.g., backplane 306). For example, the dead band period 424 can function to mitigate data transmission timing errors due to inaccuracies in time synchronization between functional circuits, as well as minimize signal collisions that can result from latencies associated with data transmission between bridged backplanes. As an example, time synchronization errors can arise due to signal propagation delay along data lanes, propagation delay between bridged backplanes, time synchronization errors between functional circuits, bit error rate, and the like. Bridged backplanes are described in more detail below.

In some embodiments, the duration of the dead band period 424 can be determined based on a data communication protocol employed in the monitoring system. For example, an Ethernet communication protocol (e.g., TCP/IP, UDP/IP) can require that the dead band period 424 can allow for communication of a 12 byte data packet. In some implementations, the duration of the dead band period 424 can be determined based on expected and/or known time synchronization errors.

FIG. 8 illustrates an exemplary data structure of a beacon packet 500 broadcasted by the master circuit during the arbitration period. The beacon packet can include a preamble field 501, which can function as a reference signal. The slave circuits of the monitoring use the preamble field 501 to identify the beginning of data within the beacon packet. The beacon packet can also include data fields such as a type field 502, current time field 504, network identification number (ID) field 505, number of lanes field 507, baud rate field 506, schedule header 522, and schedule entries array 524, among others. The type field 502 can indicate that the data packet is a beacon packet 500. In some embodiments, functional circuits coupled to the backplane can use the preamble field 501 and the type field 502 to identify data delivered to the backplane. For example, the preamble field 501 can include a data transmission clock, which functional circuits coupled the backplane can use to identify data transmitted from a given functional circuit.

The current time field 504 can function as a reference time to synchronize clocks of the slave circuits. The current time field 504 can be, e.g., one or more of time of transmission of the beacon packet, starting time 406, ending time 408, and the like. The network ID field can identify a network formed by one or more backplanes and functional circuits coupled thereto. In some embodiments, network IDs can be generated and/or assigned to the monitoring system upon startup. The network IDs can function to characterize hardware of the monitoring system (e.g., unique IDs of functional circuits and/or the backplane, number of data lanes on the backplane, etc.) as well as operating parameter such as e.g., communication schedules, the baud rate, etc. In some embodiments, network IDs can provide a means to identify and/or separate independent networks that get connected unintentionally. The baud rate field 506 can include data that characterizes a speeds of communication over the various data lanes of the backplane.

The beacon packet can also include the system frame schedule 520. The system frame schedule 520 can include a schedule header 522 and a schedule entry array 524. The schedule header 522 can include self-describing information about the schedule. For example, the schedule header 522 can include data characterizing a number of time slices included in the schedule, a duration of each time slice, a duration of a dead band within the time slice, and identification data that can be used by node controllers of functional circuits to parse time slice assignments within the schedule.

Figure 9:
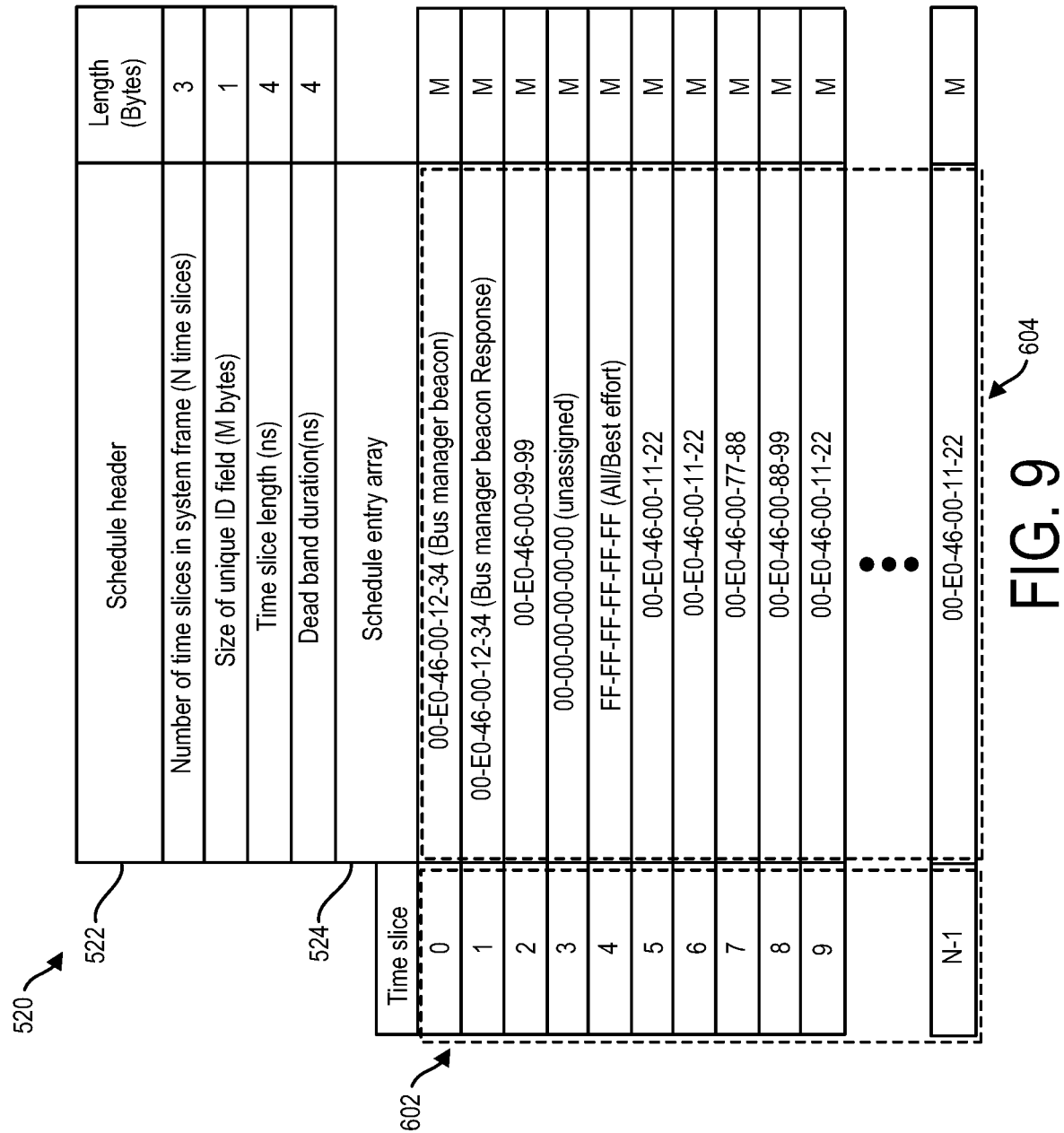
FIG. 9 is an exemplary structure of system frame schedule.

FIG. 9 illustrates an exemplary structure of system frame schedule 520. The system frame schedule includes the schedule header 522 and the schedule entry array 524. The schedule entry array 524 can include time slice assignments of time slices in the system frame (e.g., system frame 404A). The data matrix of schedule entry array 524 can include a time slice array 602 and assignment array 604. Fields of the time slice array can be identify the time slices and the fields of the assignment array can include the assignment data for the time slice arrays. For example, assignment field of a time slice that has been assigned to a slave circuit can include unique identification (ID) of the slave circuit. As an example a unique ID can be, e.g., MAC address. In some embodiments, the schedule entry array 524 can include time slices that are not be assigned to a slave circuit. The schedule entry array 524 can also include best-effort time slices in which multiple slave circuits can broadcast a data packet. An assignment field of an unassigned time slice can have a first predetermined value (e.g., 00-00-00-00-00-00). An assignment field of a best-effort time slice can include a second predetermined value (e.g., FF-FF-FF-FF-FF-FF, or 0xAA-AA-AA-AA-AA-AA).

In some embodiments, the master circuit can discard any data packets broadcasted by slave monitoring nodes during an unassigned time slice. During the best effort time slice any functional circuit coupled to the backplane of the monitoring system can broadcast a data packet. As an example, the best effort time slice can be used to communicate low priority traffic, asynchronous application layer events (e.g., events that are difficult to schedule). Because multiple functional circuits are broadcasting during the best effort time slice, data packets collisions can occur. These collisions can be resolved using, for example, a CSMA/CD algorithm. In some embodiments, each functional circuit can monitor data lanes of the backplane to determine if a collision has occurred. For example, during periods in which a functional circuit is transmitting data to data lanes of the backplane, a node controller and/or a gate controller of the functional circuit can monitor the data lanes to determine if data that exists on the backplane is the same as the data that was transmitted. If the data on the backplane is different than the data that was transmitted, then the node controller and/or gate controller can determine that a collision has occurred.

FIG. 10 illustrates an exemplary data structure of a beacon response packet 700 that can be provided to the backplane by a slave circuit during the second time slice (e.g., 410B) of the arbitration period 411. The beacon response packet 700 can include type field array 701 and the value array 703 can include corresponding array 703 of values. The field array 701 can include a data field 702 indicating that data the beacon response packet 700 represents a beacon response packet. The field array 701 can also include a slave time fields 704 that can include data that characterizes an internal time of the slave circuit. The field array 701 can include a unique identification (ID) field 706 that can include data that characterizes a unique identification corresponding to the slave circuit. The field array 701 can also include a time slice request field 708 that can include data that characterizes a number of time slices needed by the slave circuit to broadcast its data packets.

FIG. 11 illustrates an exemplary communication protocol 800 between a master circuit 801 and a slave circuit 803. The master circuit 801 can include data receivers 804A and data transmitters 806A. The slave circuit 803 can include data receivers 804B and a data transmitters 806B. During the time synchronization period 812, nodes of the master circuit 801 and the slave circuit 803 can synchronized their time. For example, the master circuit 801 can include its reference time (e.g., reference time 504) in the beacon packet and transmit it to the slave circuit 803 during the arbitration period (e.g., first time slice of a system frame) of one or more system frames. The slave circuit can remain in a standby mode and receive the beacon packets in multiple system frames. The slave monitoring node can synchronize its internal time with the reference time of the received beacon packet.

During the arbitration period 814 of a system frame, the master circuit can transmit beacon packets to the slave monitoring nodes (e.g., during the first time slice 410A), and can receive beacon response packet from the slave monitoring nodes (e.g., during the second time slice 410B). During the data communication period 816, the slave circuit can transmit data packets to the master circuit based on the system schedule transmitted in the beacon packet.

Figure 12:
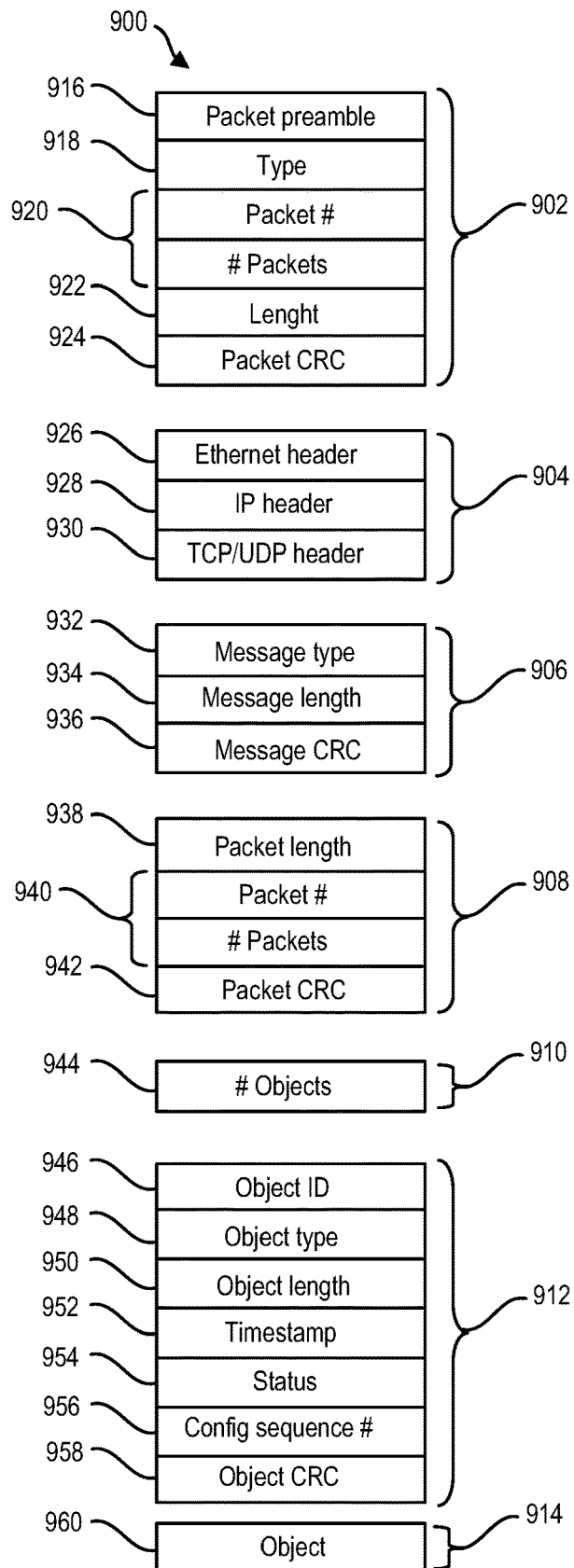
FIG. 12 is an exemplary structure of a data packet that can be delivered to the backplane of a monitoring system during operation.

FIG. 12 shows an exemplary structure of a data packet 900 that can be delivered to the backplane (e.g., backplane 306) of a monitoring system (e.g., monitoring system 300) during operation. As shown in the illustrated example, the data packet 900 can include a packet header 902, a communication header 904, a protocol header 906, a packetized message header 908, an object message header 910, an object header 912, and an object body 914. In some embodiments, node controllers (e.g., node controllers 324) and/or gate controllers (e.g., gate controllers 926) of functional circuits can use data within the packet header 902 and the communication header 904 to characterize and/or identify the data packet 900. The protocol header 906, packetized message header 908, object message header 910, object header 912, and object body 914 can include data corresponding to a payload of the data packet 900. In some embodiments, circuit controllers (e.g., circuit controllers 320) can used data within the protocol header 906, packetized message header 908, object message header 910, and/or object header 912 to characterize and/or identify data within the data packet 900.

The packet header 902 can include a packet preamble field 916, a type field 918, packet number fields 920, a length field 922, and a packet CRC field 924. The preamble field 916 can include a data transmission clock, which functional circuit coupled the backplane can use to identify the data packet 900. The type field 918 can include data that describes the type of data transmitted within the data packet 900. For example, if the data packet was transmitted by an input circuit, the type field can indicate that the data packet includes sensor data. The packet number fields 920 can include data characterizing information for delivering the data packet. For example, the packet number fields 920 can include data characterizing source information and/or destination information. The length field 922 can include data describing a length (e.g., in bytes) of the data packet 900. The packet CRC field 924 can include error checking information that can be used by other functional circuit to detect unintentional changes in raw data of the packet header 902.

The communication header 904 can include an Ethernet header 926, an IP header 928, and a TCP/UDP header 930. The Ethernet header 926 can include data characterizing MAC addresses of the functional circuit and/or the backplane. IP header 928 can include data describing a source IP address and/or a destination IP address. For example, the IP header 928 can include an IP address of the functional circuit that delivered the data packet 900 as well as an IP address of a functional circuit intended to receive the data packet 900. The TCP/UDP header 930 can include data describing source and destination ports. For example, the TCP/UDP header 930 can include a port number identifying a port that the functional circuit that delivered the data packet 900 is coupled to. The TCP/UDP header 930 can also include a port number identifying a port corresponding to that functional circuit that is intended to receive the data packet 900.

The protocol header 906 can include a message type field 932, a message length field 934, and a message CRC field 936. The message type field 932 can include data that describes the type of data transmitted within the data packet 900. In some embodiments, circuit controllers (e.g., circuit controller 320) of functional circuits that receive the data packet can use data within the message type field 932 to identify the type of data within the data packet 900. The message length field 934 can include data describing a length (e.g., in bytes) of a message within the data packet 900. The message CRC field 936 can include error checking information that can be used by other circuit controllers of functional circuits to detect unintentional changes in raw data of the message.

The packetized message header 908 can include a packet length field 938, packet number fields 940, and a packet CRC field 942. The packet length field 938 can include data describing a length (e.g., in bytes) of the data packet 900. The packet number fields 940 can include data characterizing information for delivering the data packet 900. The packet CRC field 942 can include error checking information that can be used by circuit controllers that receive the data packet 900 to detect unintentional changes in raw data of the packet header 902.

The object message header 910 can include an object number field 944. The packet number fields 940 can include data describing a number of objects within the data packet 900.

The object header 912 can include an object ID field 946, an object type field 948, an object length field 950, a timestamp field 952, a status field 954, a configuration sequence number field 956, and an object CRC field 958. The object ID field 946 can include data identifying an object field 960 of the object body 914. The object type field 948 can include data that describes the type of object transmitted within the data packet 900. The object length field 950 can include data describing a length (e.g., in bytes) of the object within the data packet 900. The timestamp field 952 can include data characterizing a time corresponding to when the data packet 900 was delivered to the backplane. The status field 954 can include data describing a status of the object within the data packet 900. The configuration sequence number field 956 can include data describing a configuration of data within the data packet 900. The object CRC field 958 can include error checking information that can be used by circuit controllers that receive the data packet 900 to detect unintentional changes in raw data of the object within the data packet 900.

The object body 914 can include an object field 960. The object field 960 can include a portion of the payload that corresponds to the object transmitted within the data packet 900. For example, the object field can include data from sensors.

Figure 13:
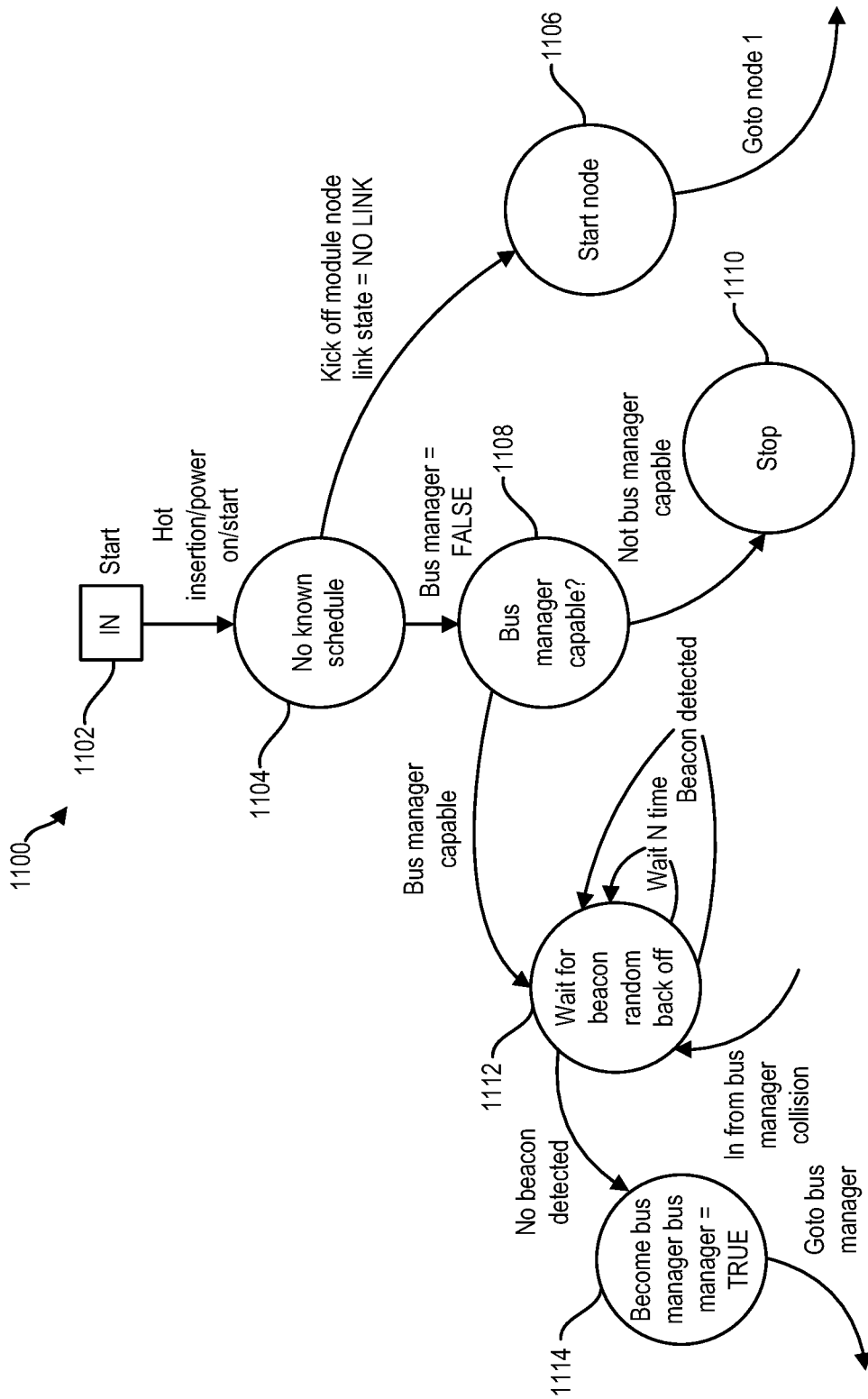
FIG. 13 is flow diagram that illustrates an exemplary initialization process.

Initially, when a functional circuit of a monitoring system is powered on, the functional circuit (e.g., a node controller) can perform an initialization process to determine if a master circuit exists and/or to assume arbitration responsibilities to become the master circuit. FIG. 13 shows an exemplary flow diagram 1100 that illustrates an initialization process that can occur when a functional circuit is powered on. The functional circuit can be powered on at step 1102. As an example, the functional circuit can be powered on when the monitoring system powered on. As another example, the functional circuit can be powered on when it is coupled to an active monitoring system (e.g., via hot insertion). The functional circuit can wait for a period of time to detect a beacon signal and/or to receive a schedule.

After a period of time, at step 1104, the functional circuit can determine that no beacon has been detected, that no schedule is available, and that the monitoring system does not include a master circuit. The functional circuit can also a link state. The link state can describe a state of connectivity to the backplane. If the link state indicates that there is no link, at step 1106, the functional circuit can start a node (e.g., node 322) of the monitoring state to generate a positive link state. For example, a card controller of the functional circuit can deliver a signal to a node controller to start the node. In some embodiments, the node controller and/or gate controller can identify the link state. If there is no link, the node controller and/or gate controller can start the node. If the node is linked to the backplane, at step 1108, the functional circuit can perform a self-evaluation to determine if it is arbitration capable. For example, the node controller of the functional circuit can determine if it includes, or is coupled to, a schedule controller. If the functional circuit is not arbitration capable, it can stop the initialization process at step 1110.

If the functional circuit is arbitration capable, a schedule controller of the functional circuit can generate a beacon packet and provide the beacon signal to the data lanes of the backplane (e.g., via the node controller and transmitters). If the node controller detects a collision, or if the node controller detects a beacon signal from a different functional circuit, the schedule controller and/or node controller can enter a state of random back-off at step 1112. At step 1112, the schedule controller and/or node controller can wait for a period of time to receive a beacon signal from another functional circuit.

In some embodiments, functional circuits that are arbitration capable can each be configured to wait for random amounts of time during step 1112. Waiting for random amounts of time can reduce the probability of multiple consecutive collisions, thereby allowing a functional circuit to assume arbitration capabilities more quickly. During step 1112, if the functional circuit receives a valid beacon packet, the node can stop the initialization process. If, at any point during operation, a frame (e.g., the frames discussed above with regard to FIG. 7) does not include a beacon packet, the functional circuit can restart the initialization process and attempt to become the master circuit. If each frame includes a beacon packet, the initialization process can remain stopped indefinitely.

If the functional circuit does not detect a beacon signal, at step 1114, the functional circuit can assume arbitration responsibilities, thereby becoming the master circuit. After the functional circuit becomes the master circuit, the master circuit can generate, distribute, and maintain schedules that define when each slave circuit of the monitoring system can communicate.

Figure 14:
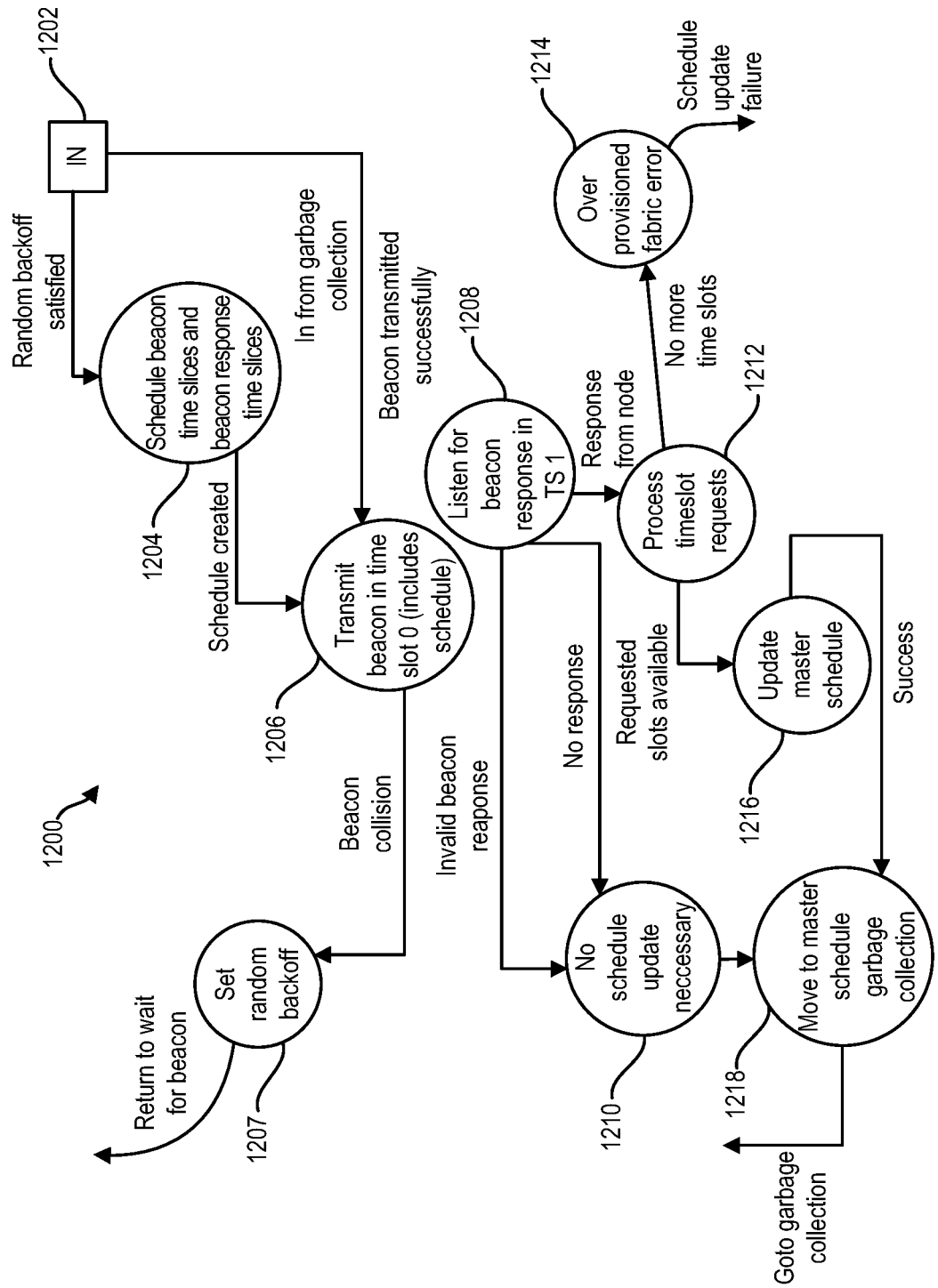
FIG. 14 is flow diagram that illustrates an exemplary method of generating a schedule based on the communication requests from slave circuits.

FIG. 14 shows a flow diagram 1200 that illustrates a method of generating a schedule based on the communication requests from slave circuits. As shown in the illustrated example, the master circuit can assume arbitration capabilities at step 1202. At step 1204, the schedule controller of the master circuit can generate a schedule and assign beacon time slice and beacon response time slice (e.g., time slices 410A, 410B). The schedule controller can also store the schedule in memory. At this point, each time slice within the schedule can be unassigned, with the exception of the beacon time slice (e.g., time slice 410A) and the beacon response time slice (e.g., time slice 410B). As another example, the time slices can be assigned based on a previously available schedule. Alternatively, if the functional circuit is in a continued state of operation from a previous frame, the method can move directly to step 1206.

At step 1206, the master circuit can transmit a beacon packet during the first time slice (e.g., time slice 110A). If the master circuit detect that there was a collision, at step 1207, the master circuit can enter a state of random back-off in which it will wait for a period of time before attempting to transmit another beacon packet with an updated data transmission clock, or timer, which can be used for time synchronization across various functional circuits coupled to the backplane.

If a no collision is detected the schedule controller and/or node controller of the master circuit can wait for a beacon response packet from one or more slave circuits at step 1208. If there is no beacon response packet, or if the beacon response packet is invalid, the master circuit can determine that no schedule update is necessary at step 1210.

At step 1212, if the master circuit receives a valid beacon response packet from a slave circuit, the schedule controller of the master circuit can process time slice requests from the beacon response packet. If there are no time slices available to be assigned, the schedule controller can generate an error signal at step 1214. In some embodiments, the schedule controller can deliver the error signal to a plant operator via a gateway circuit. For example, the schedule controller can deliver the error signal to the backplane via the node controller and transmitters and receivers of the master circuit. The gateway circuit can receive the error signal from the data lane, and deliver the error signal to a user device to inform the user that the backplane has been overprovisioned. In some embodiments, a user can replace the backplane with a backplane that includes more data lanes, thereby facilitating a higher volume of data traffic. As another example, a user can replace the backplane with a backplane that is configured to transfer data at a higher rate.

If time slices are available for scheduling, at step 1216, the schedule controller can update the schedule to accommodate communication requested within the beacon response packet. The schedule controller can deliver another beacon packet containing an updated schedule to the backplane. Slave circuits can receive the beacon packet from the backplane, and update their schedules.

At step 1218, the schedule controller and/or node controller of the master circuit can transition to a traffic monitoring, or "garbage collection" phase, as described in more detail below. In some embodiments, the traffic monitoring phase can occur simultaneously with all scheduling and arbitration functions performed by the master circuit.

Figure 15:
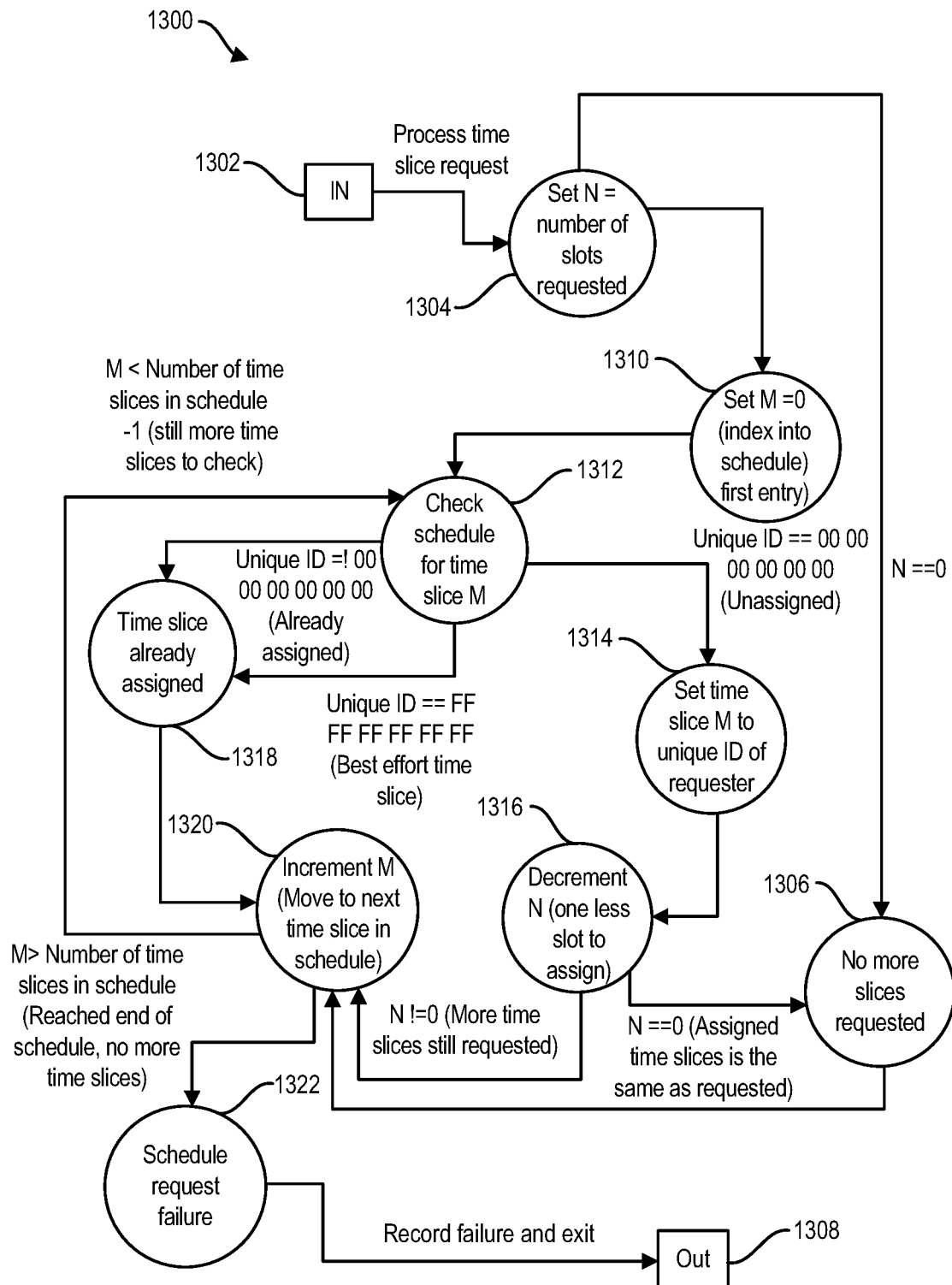
FIG. 15 is a flow diagram illustrating an exemplary method of processing time slice requests from beacon response packets and generating a schedule entry array.

As mentioned above with regard to step 1212, if the schedule controller of the master circuit receives a valid beacon response from a slave circuit, the schedule controller of the master circuit can process the time slice requests from the beacon response packet. FIG. 15 shows a flow diagram 1300 illustrating an exemplary method of processing time slice requests from beacon response packets and generating a schedule entry array (e.g., schedule entry array 524). At step 1302, the schedule controller of the master can receive a beacon response packet and begin processing time slice requests.

At step 1304, the schedule controller can allocate memory for variable N and set a value for the variable within memory. The schedule controller can determine a number of time slices requested from the beacon response packet. For example, the schedule controller can evaluate a value (e.g., a value provided with the number of requested time slices field 708) corresponding to a time slice request field (e.g., time slice request field 708) to determine the number of time slices requested. The schedule controller can then set a value for the variable N to be equal to the number of time slices requested. If the value of N is zero, at step 1306, the schedule controller can determine that there are no time slice requests to be processed. The schedule controller can then terminate processing time slice requests at step 1308.

At step 1310, the schedule controller can allocate memory for a schedule array (e.g., schedule entry array 524), which can include a time slice array (e.g., time slice array 602) and an assignment array (e.g., assignment array 604). Sizes of the time slice array and the assignment array can correspond to a predetermined number of time slices within a frame. For example, if there are 100 time slices per frame, the time slice array and the assignment array can each have 100 elements. The schedule controller can also allocate memory for an indexing variable M, and set the value of M to be 0.

At step 1312, the schedule controller can check a value of the assignment array at index M, which corresponds to a time slice at index M of the time slice array. If the value of the assignment array at index M indicates that the corresponding time slice is unassigned, at step 1314, the schedule controller can set the value of the assignment array at index M to be equal to a value of a unique ID (e.g., unique identification (ID) field 706) from the beacon response packet (e.g. beacon response packet 700).

At step 1316, the schedule controller can decrement, or reduce, the value N by one. If the value of N is equal to zero after step 1316, at step 1306, the schedule controller can determine that there are no time slice requests to be processed. If there are no more time slice requests to be processed, the process can move to step 1320, which is described in more detail below. If the value of N is not equal to zero after step 1316, the schedule controller can increment, or increase, the value of M by one at step 1320.

If the value of index M of the assignment array indicates that the corresponding time slice is not unassigned, or is a best effort time slice, at step 1318, the schedule controller can determine that the time slice at index M of the time slice array is already assigned. The schedule controller can then increment, or increase, the value of M by one at step 1320.

At step 1320, the schedule controller can increment, or increase, the value of M by 1. If the value of M is less than the number of time slices within the frame minus one, the process can return to step 1312. If the value of M is greater than the number of time slices within the frame, step 1322, the schedule controller can determine that a schedule request failure has occurred. The schedule controller can then terminate processing time slice requests at step 1308.

During operation, the master circuit can monitor traffic on the data lanes of the backplane to verify that data transmission is occurring during assigned time slices. If there is no data transmission during an assigned time slice, the master circuit can determine that the time slice has been abandoned. The master circuit can free, or unscheduled, a time slice and can reassign the time slice based on requests received during a subsequent beacon response time slice (e.g., beacon response time slice 410B).

Figure 16:
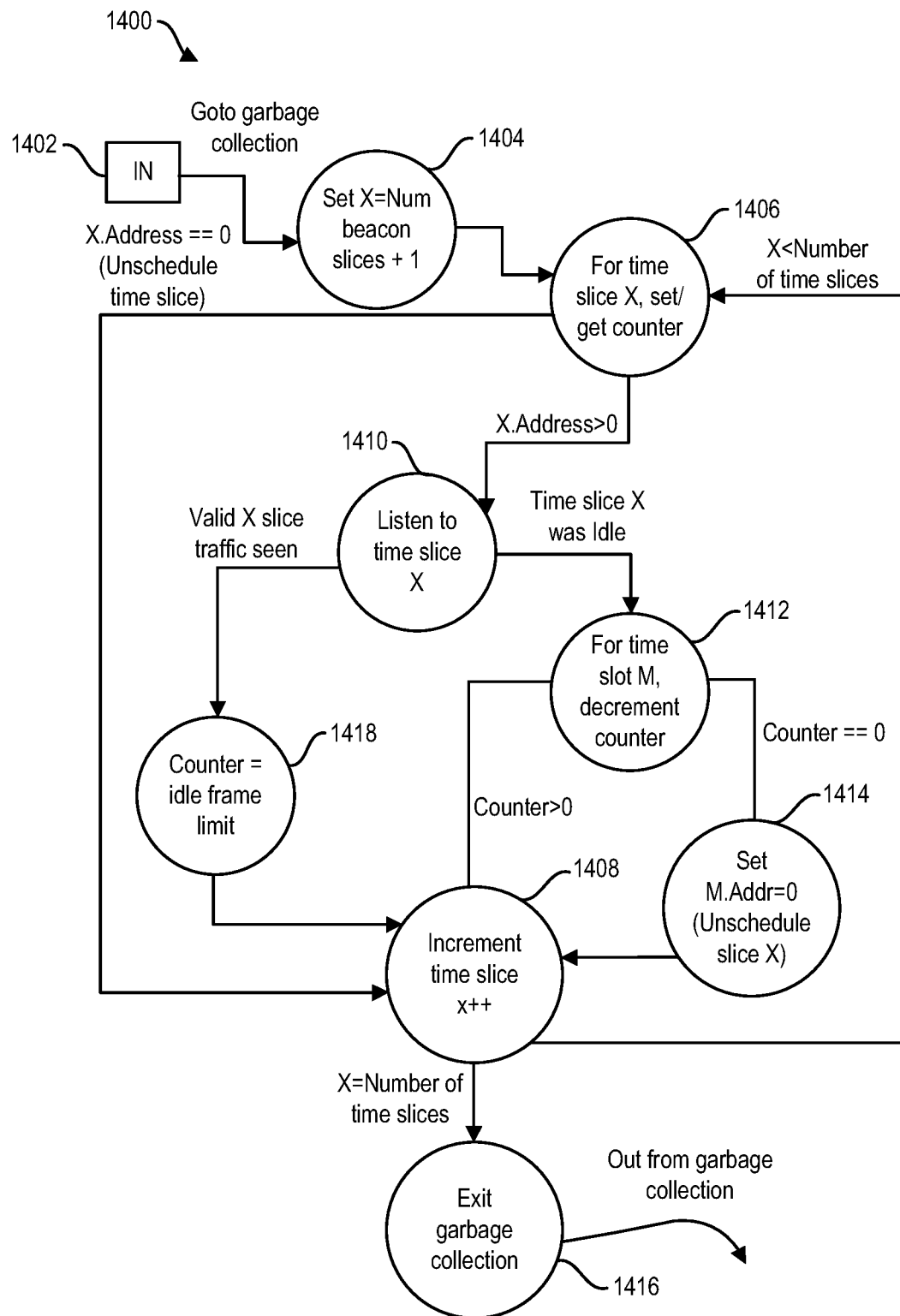
FIG. 16 is a flow diagram of an exemplary traffic monitoring process that can be used to recover unused time slices.

FIG. 16 shows a flow diagram 1400 of an exemplary traffic monitoring, or "garbage collection", process that can be used to recover unused time slices so that they can be reassigned. At step 1402, the schedule controller of the master can begin an iteration of the traffic monitoring process. At step 1404, the schedule controller can allocate memory to for an indexing variable X and set a value for the variable within memory. For example, the value of the indexing variable can be set to be equal to a number of beacon time slices plus one. For example, if an assignment array (e.g., assignment array 604) includes a beacon time slice at index 0, and a beacon response time slice at index 1, the value of the indexing variable can be set to 2, which corresponds to the index of the first time slice that has potentially been assigned to a slave circuit.

At step 1404 the schedule controller can also allocate memory for a counter array. The counter array can be the same size as the assignment array. Values of elements of the counter array can be set to predetermined idle slice limit. The idle slice limit can describe an acceptable number of consecutive delivery opportunities in which a slave circuit can remain idle, i.e., not transmit data. A delivery opportunity can be a time slice to which the slave circuit has been assigned. For example, if each slave circuit can remain idle for two consecutive delivery opportunities, values of each element of the counter array can be set to two. In some embodiments, if the counter array already exists from a previous frame, the schedule controller can reference the existing counter array. FIG. 17 shows an example of a schedule entry array 1500 that includes a time slice array 1502, an assignment array 1504, a length array 1506, and a counter array 1508.

At step 1406, the schedule controller can determine a value of index X of the assignment array. If the value of index X of the assignment array indicates that a corresponding time slice has not been assigned, the schedule controller can increment, or increase, the value of X by one at step 1408.

If the value of index X of the assignment array indicates that the corresponding time slice has been assigned, at step 1410, the schedule controller can monitor one or more data lanes of the backplane for a signal from the slave circuit to which the time slice corresponding to index X of the time slice array has been assigned. If the master circuit does not detect a signal from the slave circuit to which the time slice has been assigned, at step 1412, the schedule controller can decrement, or decrease, the value of index X of the counter array by one. If index X of the counter array is equal to zero, at step 1414, the schedule controller can unscheduled the slave circuit from the time slot. The schedule controller can then increase the value of X by one at step 1408.

After step 1412, if the value of index X of the counter array is greater than zero, at step 1408, the schedule controller can increase the value of X by one. If the master circuit detects a signal from the slave circuit to which the time slice has been assigned at step 1410, the schedule controller of the master circuit can set the value of index X of the counter array to the idle slice limit (e.g., one) at step 1418. The schedule controller can then increase the value of M by one at step 1408.

After step 1408, if the value of X is less than the number of time slices in the frame, the process can then return to step 1408. If the value of X is equal to the number of time slices in the frame, at step 1416, the schedule controller can terminate the traffic monitor process for the current frame.

By monitoring traffic on data lanes of the backplane, the master circuit can maximize efficiency of resource (e.g., time slice) utilization by identifying time slices in which the assigned slave circuit failed to communicate, unscheduling the assigned slave circuit, and reassigning the time slices based on communication requests received in beacon response packets.

Figure 18:
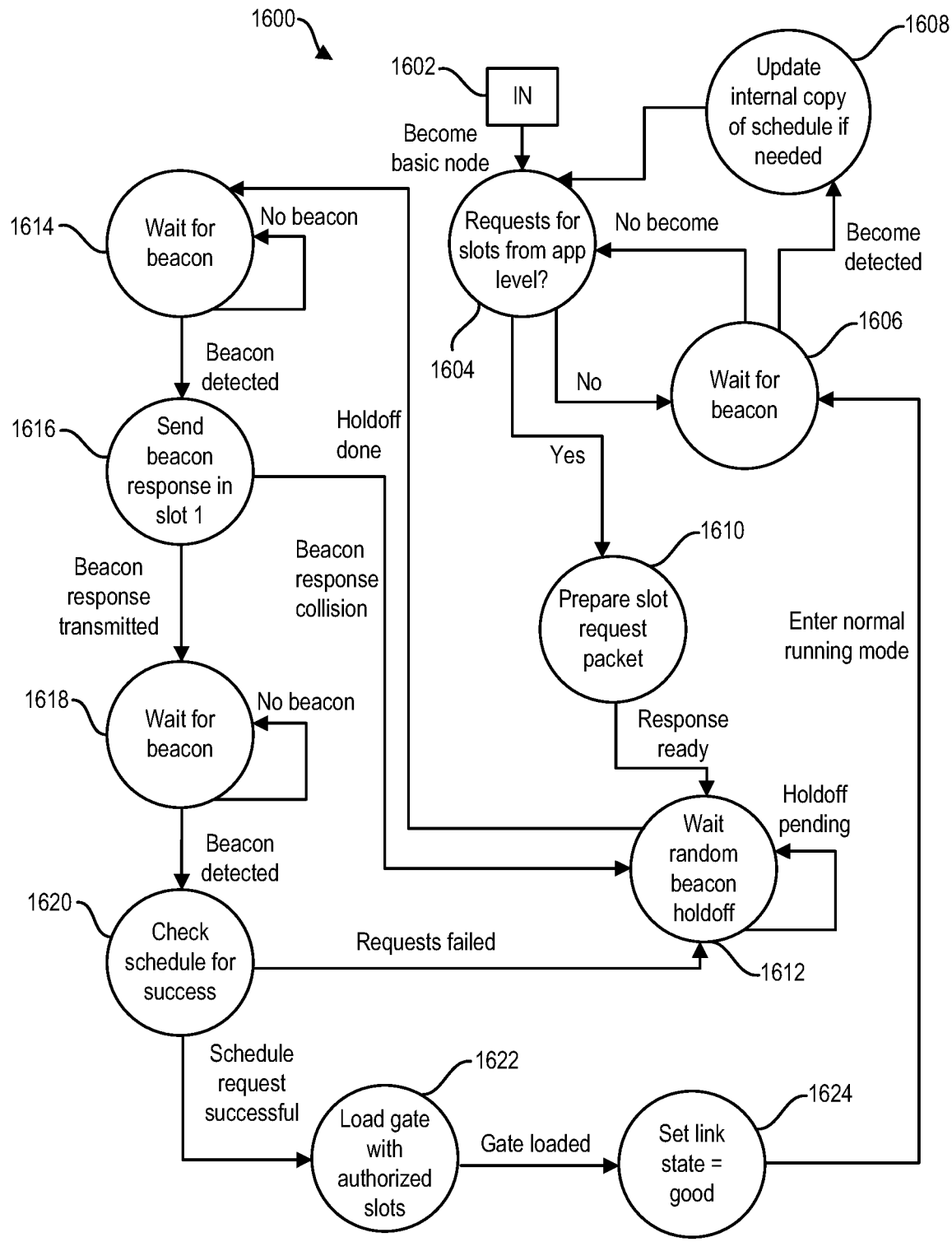
FIG. 18 is a flow diagram illustrating exemplary operation of a node of a slave circuit of a monitoring system.

FIG. 18 shows a flow diagram 1600 illustrating exemplary operation of a node of a slave circuit of a monitoring system (e.g., the monitoring system 300). The slave circuit can generally be similar to the functional circuit 310 described above with regard to FIG. 4. However, in some embodiments, the slave circuit may not include a schedule controller, or the schedule controller may be inactive.

At step 1602, the slave circuit can be powered on. At step 1604, a node controller can check to determine whether a circuit controller of the slave circuit has provided a request to deliver data to data lanes of a backplane to which the slave circuit is coupled to.

If the node controller determines that the circuit controller has not provided any additional requests to deliver data to the backplane, at step 1606, the node controller can wait to receive a beacon packet from a master circuit. After a period of time, if the node controller does not receive a beacon packet, the process can return to step 1604 and the node controller can check to determine if the circuit controller has provided a request to deliver data to data lanes of the backplane. If the node controller receives a beacon packet during step 1606, the node controller can update and/or generate an internal copy of a schedule stored in memory based on a schedule provided with the beacon packet at step 1608. The node controller can also provide the updated/generated schedule to a gate controller of the slave circuit so that the gate controller can control operation of transmitters and/or receivers of the slave circuit to enforce the schedule. The process can then return to step 1604 and the node controller can check to determine if the circuit controller has provided a request to deliver data to data lanes of the backplane.

If the node controller detects that the circuit controller has requested that data be delivered to the backplane, at step 1610, the node controller can prepare a beacon response packet to request time slices for communication based on the request from the circuit controller. For example, the circuit controller can provide one or more communication packets to the node controller to be delivered to the backplane. The node controller can determine the total size (e.g., in bytes), and can calculate a number of time slices required to transmit the communication packet based on a baud rate of the monitoring system. The node controller can generate the beacon response packet requesting the calculated number of time slices. As another example, in some embodiments, the circuit controller deliver a signal to the node controller to request a certain amount of bandwidth (e.g., in bytes per second) to deliver a desired payload that can be provided with the communication packets.

In some embodiments, at step 1612, the node controller can enter a hold-off state in which the node controller waits for period of time. As an example, the node controller can enter the hold-off state to reduce simultaneous data delivery to the backplane, thereby reducing the risk of collisions between beacon response packets from different functional circuits. At step 1614, the node controller can wait to receive a beacon packet. After the node controller receives the beacon packet from the master circuit, at step 1616, the node controller can provide the beacon response packet to a data lane of the backplane.

If the node controller detects that the beacon response packet experienced a collision, the node controller can enter a hold-off state at step 1612. After a period of time, the node controller can wait for a beacon packet (e.g., in a subsequent frame) at step 1614. After the node controller receives the beacon packet, at step 1616, the node controller can provide the beacon response packet to the data lane of the backplane.

At step 1618, after the beacon packet is transmitted to the data lane, the node controller can wait to receive a beacon packet. The node controller can then receive the beacon packet from the master circuit.

At step 1620, the node controller can check a schedule provided with the beacon packet to determine if the requested time were granted. If slave node was not assigned the time slices that were requested in the beacon response packet, the node controller can enter a hold-off state at step 1612. The process can then proceed through steps 1614, 1616, 1618. If the slave node was assigned the time slices that were requested in the beacon response packet, at step 1622, the node controller can provide the schedule and/or instructions with the assigned time slices to the gate controller. The gate controller can control operation of the transmitters and/or receivers based on the schedule and/or instructions. For example, the gate controller can switch transmitters to the first operating mode during assigned time slices. The gate controller can switch the transmitters to the second operating mode during time slices in which the slave circuit is not assigned to communicate.

At step 1624, the node controller can determine a link state of the node of the slave circuit. If the link state indicates that the node is coupled to the backplane, the process can then proceed to step 1606, in which the node controller can wait to receive a beacon packet from a master circuit. The process can proceed from step 1606 as described above.

By generating a communication schedule at a master circuit, distributing the schedule to slave circuits, and enforcing the communication at the slave circuits, the monitoring system provides robust communication and eliminates centralized failure points associated with system that use centralized switching for communication. The scheduled communication can prevent multiple functional circuits from broadcasting simultaneously, which can mitigate or eliminate collisions between data packets broadcasted by different functional circuits.

Exemplary technical effects of the subject matter described herein can include the ability schedule communications between multiple functional circuits such that the functional circuits can effectively communicate over shared data lanes. Other exemplary technical effects include the ability to maximize utilization of a limited number of data lanes, and adapt to physical and/or operation changes of the monitoring system. For example, by monitoring traffic on data lanes of the backplane, the master circuit can adapt to physical and/or operation changes of the monitoring system and maximize efficiency of resource (e.g., time slice) utilization by identifying time slices in which assigned slave circuits failed to communicate, unscheduling the assigned slave circuits, and reassigning the time slices based on communication requests received in beacon response packets.

In some embodiments, multiple backplanes can be coupled using bridge modules. The coupled backplanes can form an extended logical bus such that all data is transferred between the backplanes. This allows monitoring systems to span across multiple locations while retaining the full functionality that is available when using monitoring systems that include a single backplane.

Figure 19:
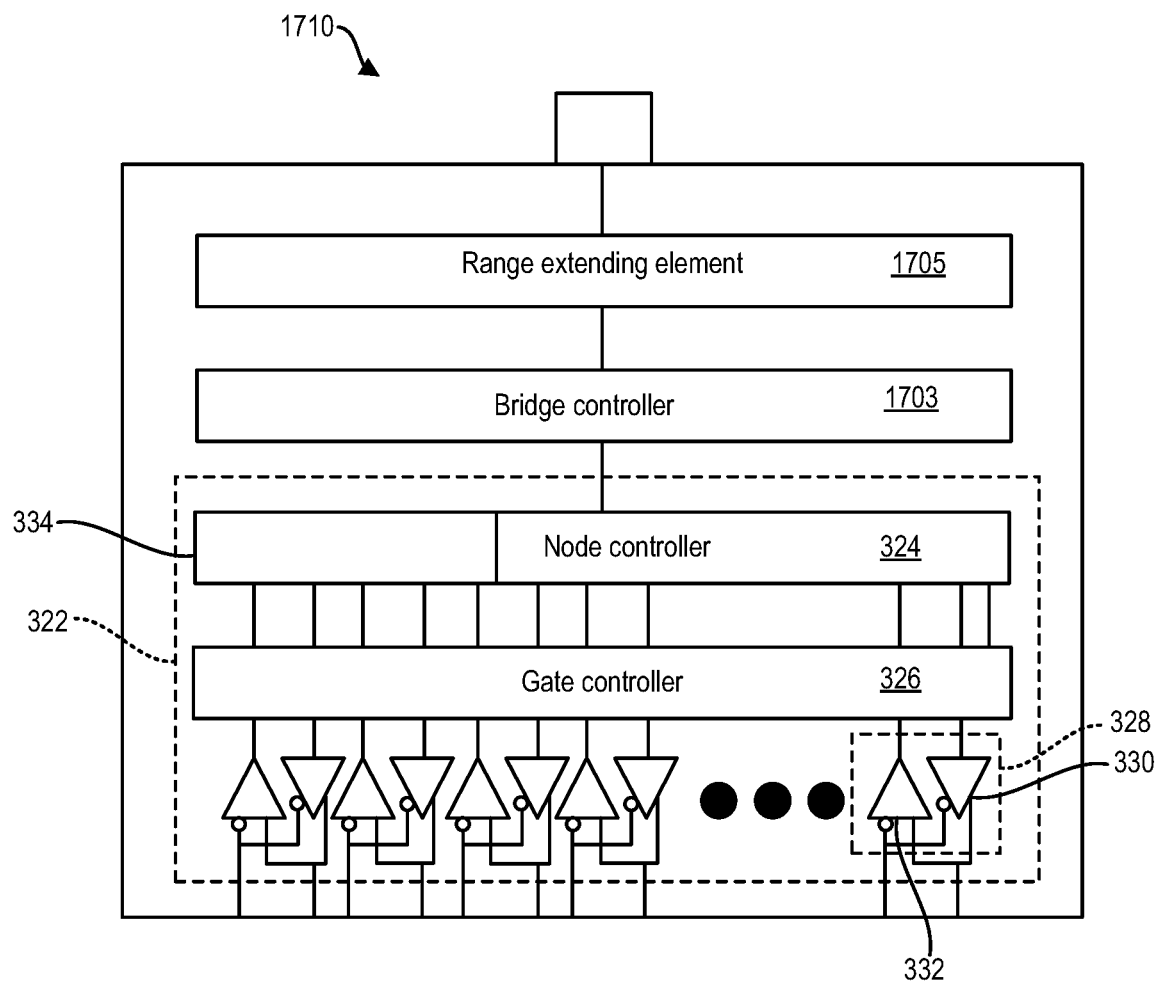
FIG. 19 is a block diagram of an exemplary embodiment of a bridge circuit that can be configured to facilitate electronic communication between backplanes of a monitoring system.

FIG. 19 shows an example of a bridge circuit 1710 that can be configured to facilitate electronic communication between backplanes of a monitoring system. The bridge circuit 1710 can include a bridge controller 1703 that is in electronic communication with a range extending element 1705 and a node 322. The nodes 322 can be configured to facilitate and control electronic communication between the bridge controller 1703 and a first backplane of a first monitoring system. For example, the node 322 can control delivery of data from the bridge controller 1703 to the data lanes of the first backplane.

The node 322 can include a schedule controller 334, node controller 324, gate controller 326, and a gate array that includes gate pairs 328. The node controller 324 can include memory, at least one data processor, and/or other circuitry configured facilitate operation as described herein. The node controller can function as an interface between the bridge controller 1703 and the gate controller 326, transmitters 330 and/or receivers 332 of the gate pairs 328. For example, in some embodiments, the node controller 324 can be configured to receive signals from the bridge controller 1703, encode the signals into bits, and deliver signals corresponding to the encoded bits to the gate controller 326 for the data to be delivered to data lanes of the first backplane. The node controller 324 can also store a copy of a schedule that can be used to control operation of the transmitters 330 and receivers 332. The transmitters 330 receivers 332 and the gate controller 326 are described in more detail below.

The gate controller 326 can include memory, at least one data processor, and/or other circuitry configured facilitate operation as described herein. The gate controller 326 can be in electronic communication with the transmitters 330, receivers 332, and the node controller 324 of the bridge circuit 1710. The gate controller 326 can be configured to control operation of the transmitters 330 and receivers 332 bridge circuit 1710, thereby controlling data flow between the bridge circuit 1710 and the data lanes of the first backplane. For example, the gate controller 326 can control operating modes of the gate pairs 328. In some embodiments, the gate controllers 326 can be configured to control operating modes of the transmitters 330 and receivers 332 based on a predetermined schedule and/or instruction provided by the node controller 324. As an example, the gate controller 326 can be configured to receive data from the node controller 324, store the data, and deliver it to the data lanes at a scheduled time. In some embodiments, the gate controller 326 can receive the schedule from the node controller 324.

Each transmitter 330 and receiver 332 of each gate pair 328 can be electrically coupled to receiving and transmitting portions of a corresponding data lane, respectively. In some embodiments, the node controller 324, gate controller 326, transmitters 330, and/or receivers 332 can be a field programmable gate array (FPGA). The transmitters 330 and receivers 332 can have first and second operating modes, as described above with regard to the transmitters and receivers shown in FIG. 4.

In some embodiments, the bridge circuit 1710 can include the schedule controller 334 such that the bridge circuit 1710 is arbitration capable. The schedule controllers 334 can allow the bridge circuit 1710 to assume arbitration responsibilities and become a master circuits of the monitoring system. The schedule controller 334 can include memory, at least one data processor, and/or other circuitry configured facilitate operation as described herein. The schedule controller 334 can be configured to generate schedules that can define when each of the transmitter and/or receivers of functional circuits and/or bridge circuits 1710 of the monitoring system are in the first or the second operating modes. As described here, the schedule identifies when each functional circuit and/or bridge circuit can deliver data to each data lane of the first backplane.

As shown in the illustrated example, the bridge controller 1703 can be electrically coupled to the range extending element 1705 as well as the node controller 324 of the node.

The bridge controller 1703 can include memory, at least one data processor, and/or other circuitry configured facilitate operation as described herein. In some embodiments, the bridge controller 1703 can be, or can include, a FPGA. The bridge controller 1703 can be configured to receive data from the first backplane (e.g., via the node), process the data, and provide the data to another bridge circuit coupled to a second backplane. For example, the bridge controller 1703 can convert, or condense, parallel data flow from data lanes of first backplane to a serial data stream to deliver to the bridge circuit 1710 coupled to the second backplane, via the range extending element. As another example, the bridge controller 1703 can be configured to receive a serial data stream from the bridge circuit 1710 coupled to the second backplane, and convert serial data stream to parallel data streams to be delivered to data lanes of the first backplanes (e.g., via the node).

In some embodiments, the bridge controller 1703 and/or node controllers 324 of the bridge circuits 1710 can be configured to store information about the monitoring system in memory. For example, the bridge controller 1703 can store hardware data, schedules, network IDs, etc. As an example, hardware data can be, or can include, a unique ID (e.g., a MAC address) of the first backplane and/or functional circuits coupled thereto. As another example, the hardware data can include data describing the number of data lanes that the backplane includes. In some embodiments, the bridge controllers 1703 can receive data describing the number of data lanes from beacon packets (e.g., number of lanes field 207).

The range extending element 1705 can be, or can include, e.g., a signal amplifier and/or attenuator. The range extending element 1705 can be configured to facilitate communication between bridge circuits 1710 that are separated by a range of distances. For example, the range extending element 1705 can be configured to receive a signal from the bridge controller 1703, amplify the signal, and provide the amplified signal to another bridge circuit 1710. In some embodiments, the range extending element 1705 can be configured to amplify outgoing signals (e.g., signals delivered to another bridge circuit 1710) based on a known distance between the bridge circuits 1710. Additionally, the range extending element 1705 can be configured to receive an amplified signal from another bridge circuit 1710, attenuate the signal, thereby reducing a voltage and/or current of the signal, and provide the attenuated signal to the bridge controller 1703. As an example, the range extending element 1705 can attenuate incoming signals (e.g., signals received from another bridge circuit) based on predetermined maximum voltage and/or current thresholds for signals that the bridge controller 1703 is configured to receive.

In some embodiments, the bridge circuit 1703 can be configured verify that the monitoring system that are being bridged are compatible. As an example, the bridge circuit 1703 can use hardware data, unique IDs, and schedules to determine that that monitoring systems are compatible. Once the bridge controllers 1703 of the bridge circuit 1710 determine that the monitoring systems are compatible, the bridge controllers 1703 can allow the monitoring systems to be connected, thereby facilitating communication between the backplanes of the monitoring systems. The bridge circuits 1710 are described in more detail below.

Figure 20:
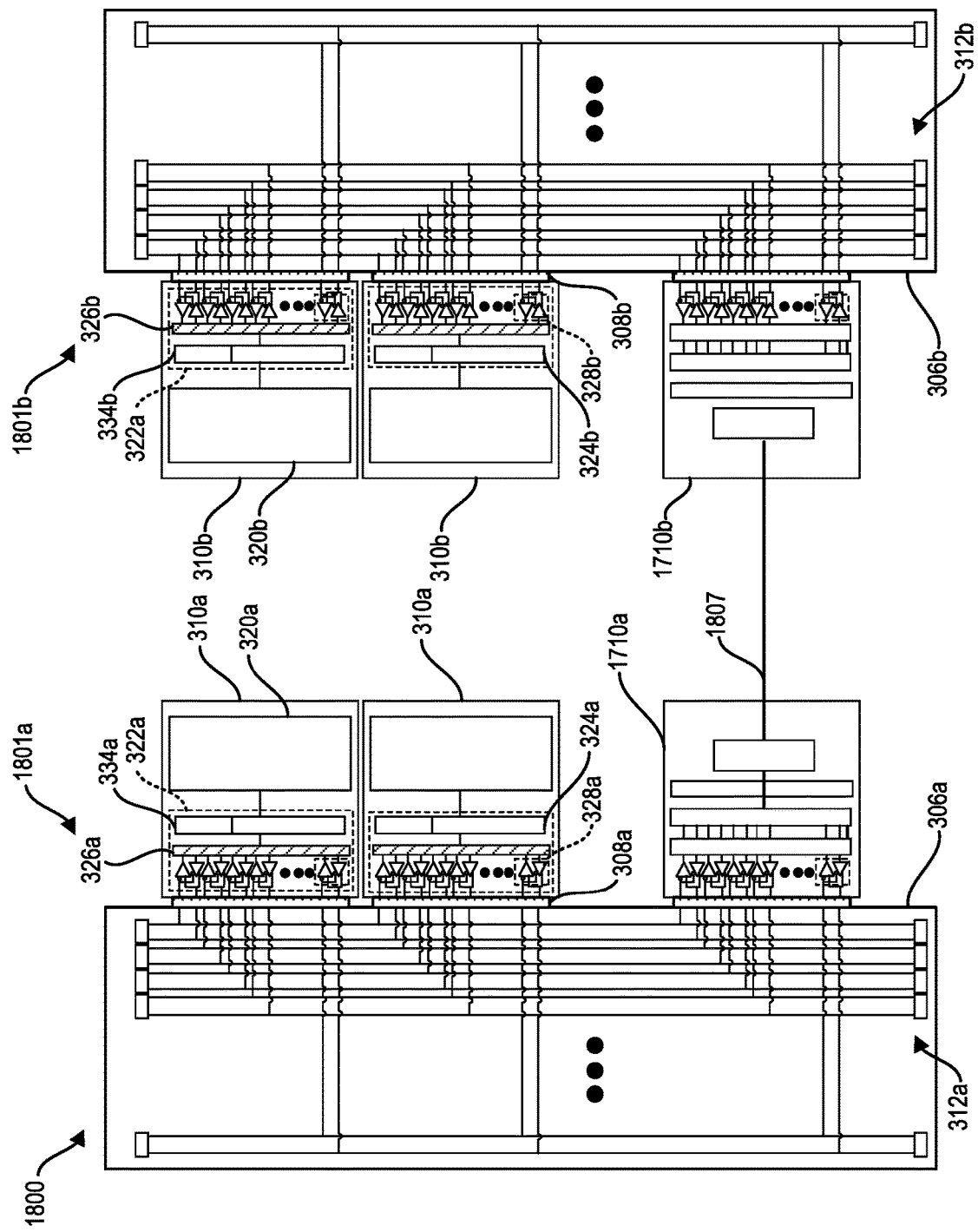
FIG. 20 is a block diagram of an exemplary embodiment of a monitoring system that includes two monitoring subsystems that are coupled using bridge circuits.

FIG. 20 shows a block diagram of an exemplary embodiment of a monitoring system 1800 that includes two monitoring subsystems 1801a, 1801b that are coupled using bridge circuits 1710a, 1710b. The bridge circuits can be the same as the bridge circuits 1710, as described herein. The monitoring system 1800 can be configured to monitor operating parameters of industrial equipment.

The monitoring subsystems 1801a, 1801b can generally be similar to the monitoring system 1800 described above with regard to FIG. 4, but each of the monitoring subsystems 1801a, 1801b can include a bridge circuit configured to facilitate communication between backplanes of the monitoring subsystems 1801a, 1801b. Each monitoring subsystem can include any number of functional circuits 310a, 310b and bridge circuits that can be detachably coupled to backplanes 306a, 306b via ports 308a, 308b of the backplanes 306a, 306b. The functional circuits 310a, 310b can be the same as the functional circuits 310.

Figure 21:
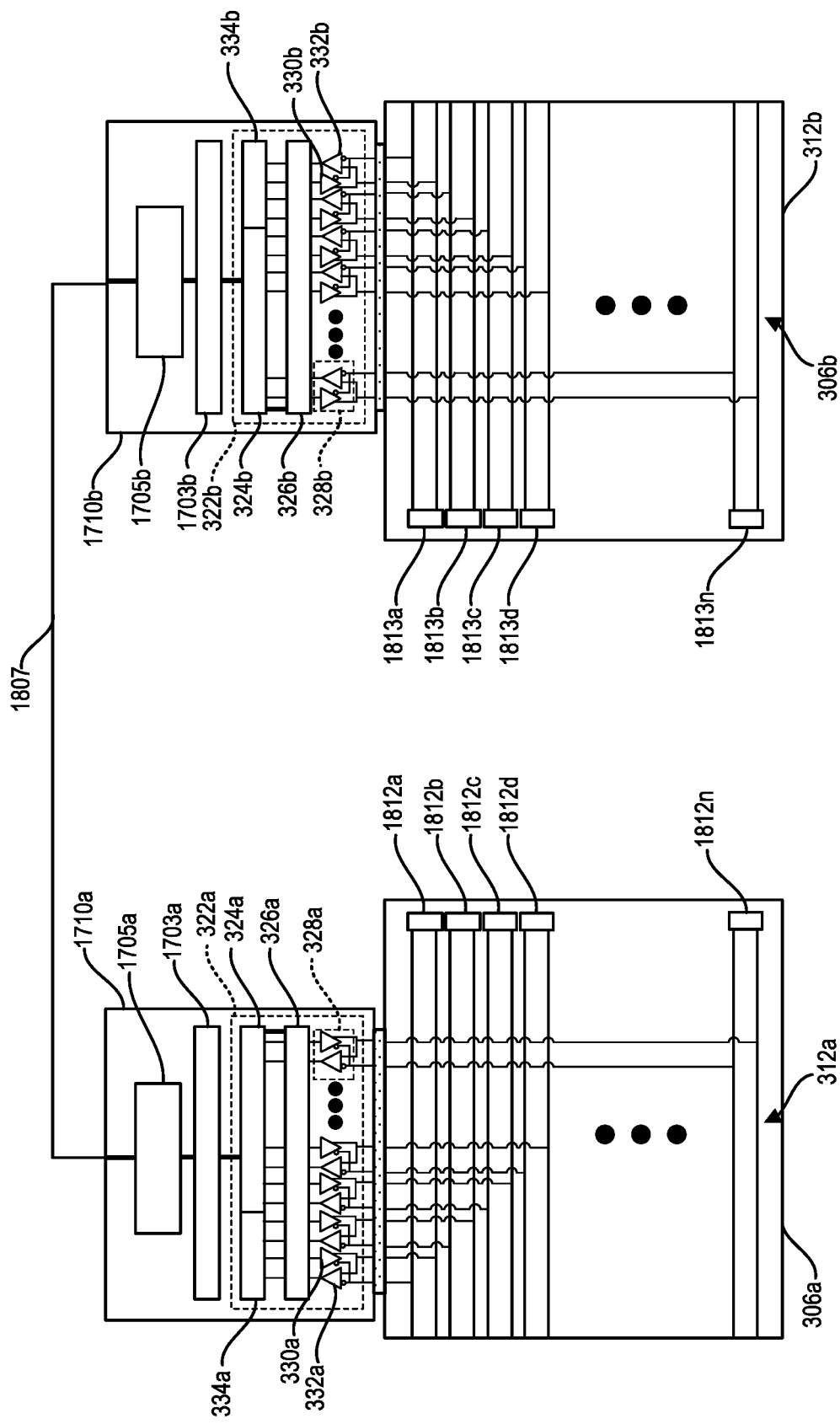
FIG. 21 is a magnified view of the block diagram of the monitoring system shown in FIG. 20.

The backplanes 306a, 306b can be, include, or form part of, a physical bus. The backplanes 306a, 306b can be passive backplanes 306a, 306b that can be configured to facilitate multipoint asynchronous electronic communication between the functional circuits 310a, 310b and/or bridge circuits 1710a, 1710b that are coupled to the backplanes 306a, 306b. Therefore, all data that is delivered to the backplanes 306a, 306b can be received by all functional circuits 310a, 310b and/or bridge circuits 1710 coupled to the backplanes. The backplane 306a can include data lanes 1812a, 1812b, 1812c, 1812d-1812n, and the backplane 306b can include data lanes 1812a, 1813b, 1813c, 1813d-1813n, as shown in FIG. 21. Referring to FIGS. 20-21, the data lanes 1812a-1812n, 1813a-1813n are in electronic communication with a number of ports 308a, 308b on the respective backplanes 306a, 306b. The ports 308a, 308b can be configured to receive functional circuits 310a, 310b and/or bridge circuits 1710a, 1710b. Each port 308a, 308b is configured to enable electronic communication between a functional circuit 310a, 310b or bridge circuit 1710a, 1710b coupled to the port, and all of the data lanes 1812a-1812n, 1813a of the respective backplanes 306a, 306b.

There are a number of different types of functional circuits that can be coupled to ports of the backplanes 306a, 306b. For example, one or more of the functional circuits can be an input circuit (e.g., input circuit 210i), an output circuit (e.g., output circuit 210o), a processing circuit (e.g., processing circuit 210p), and/or an infrastructure circuit (e.g., infrastructure circuit 210n). As shown in the illustrated example, each functional circuit 310a, 310b can include a circuit controller 320a, 320b and a node 322a, 322b configured to facilitate and control electronic communication between the circuit controller 320a, 320b and the backplane 306a, 306b. As described herein, the node 322a, 322b can control delivery of data from the circuit controller 320a, 320b to the data lanes 312a, 312b of the backplane 306a, 306b. The nodes 322a, 322b can also control which data is delivered from the data lanes 312a, 312b to the circuit controllers 320a, 320b of the functional circuits 310a, 310b.

As shown in the illustrated example, the bridge circuits 1710a, 1710b can be detachably coupled to ports 308a, 308b of the backplanes 306a, 306b. The bridge circuits 1710a, 1710b can be electrically coupled via a coupling element 1807 that can between the bridge circuits 1710a, 1710b. Ends of the coupling element 1807 can be attached to range extending elements 1705a, 1705b of the bridge circuits 1710a, 1710b. The coupling element 1807 can be e.g., electrical cabling and/or fiber optic cabling. In some embodiments, the bridge circuits 1710a, 1710b can communicate wirelessly. For example, the bridge circuits can include transceivers for communicating via Bluetooth protocol, cellular protocol, WI-FI protocol, near field communication (NFC), and/or a radio frequency identification (RFID) protocol.

In the illustrated example, the bridge circuits 1710*a*, 1710*b* can include bridge controllers 1703*a*, 1703*b* that are in electronic communication with the range extending elements 1705*a*, 1705*b* and nodes 322*a*, 322*b* of corresponding bridge circuits 1710*a*, 1710*b*. The nodes 322*a*, 322*b* of the bridge circuits 1710*a*, 1710*b* can generally be similar to the nodes 322 of functional circuits 310, as described above with regard to FIG. 4. The nodes 322*a*, 322*b* can be configured to facilitate and control electronic communication between the bridge controllers 1703*a*, 1703*b* and the backplanes 306*a*, 306*b*. For example, the nodes 322*a*, 322*b* can control delivery of data from the bridge controllers 1703*a*, 1703*b* to the data lanes 1812*a*-1812*n*, 1813*a*-1813*n* of the backplanes 306*a*, 306*b*. The nodes 322*a*, 322*b* can include schedule controllers 334*a*, 334*b*, node controllers 324*a* 324*b*, gate controllers 326*a*, 326*b*, and gate pairs 328*a*, 328*b*.

As mentioned above, the bridge circuits 1710*a*, 1710*b* can be configured to facilitate electronic communication between backplanes 306*a*, 306*b* of monitoring subsystems. For example, the bridge circuit 1710*a* can be configured to receive all data delivered to the data lanes 1812*a*-1812*n* of the backplane 306*a*, and provide the data to the bridge circuit 1710*b*. The bridge circuit 1710*b* can receive the data, and can distribute the among data lanes 1813*a*-1813*n* of the backplane 306*b* that correspond to the data lanes 1812*a*-1812*n* backplane 306*a*. For example, all data that is provided from functional circuits 310*a* to data lanes 1812*a*, 1812*b*, 1812*c*, can be provided to corresponding data lanes 1813*a*, 1813*b*, 1813*c* via the bridge circuits 1710*a*, 1710*b*. Therefore, the backplanes 306*a*, 306*b* form an extended logical bus, and the functional circuits 310*a*, 310*b* can function as if they were coupled to a single backplane.

As described herein, communication from functional circuits and/or bridge circuits is controlled using a schedule that can be generated by a master circuit. Since all data packets are shared between the backplanes 306*a*, 306*b*, the bridge circuits 1710*a*, 1710*b* and the functional circuits 310*a*, 310*b* can share a schedule. The schedule can be generated using a single master circuit, which can be one of the functional circuits 310*a*, 310*b* coupled to either of the backplanes 306*a*, 306*b*. The master circuit can generally function to generate and distribute the schedule, and monitor communication across the data lanes 1812*a*-1812*n*, 1813*a*-1813*n*, as described herein with regard to FIGS. 7-18.

Figure 22:
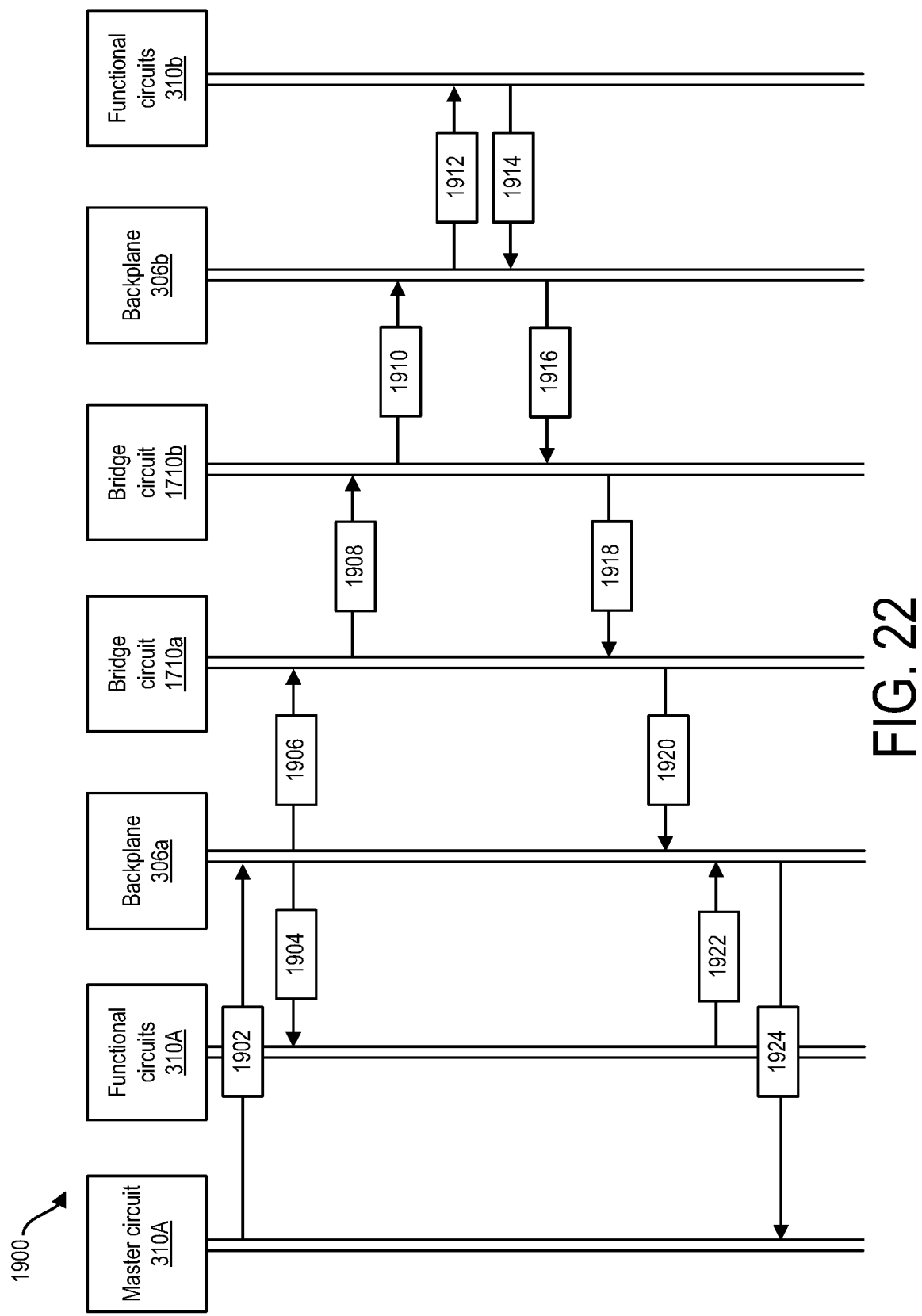
FIG. 22 is a data flow diagram illustrating exemplary communication between various components of the monitoring system illustrated in FIG. 20.

FIG. 22 shows a data flow diagram 1900 illustrating communication between various components of the monitoring system 1800 during an arbitration period (e.g., arbitration period 411). As an example, the master circuit can be one of the functional circuits 310*a* that is coupled to the backplane 306*a*. At step 1902, the master circuit can deliver a beacon packet that includes a schedule for a current time frame to data lanes 1812*a*-1812*n* of the backplane 306*a*.

At step 1904, functional circuits 310*a* coupled to the backplane 306*a* can receive the beacon packet from the backplane 306*a*. At step 1906, the node controller 324*a* of the bridge circuit 1710*a* can receive the beacon packet and store a copy of the schedule in memory. The node controller 324*a* can provide the schedule and/or instructions with the assigned time slices for the current frame to the gate controller 326*a*. The gate controller 326*a* can use the schedule and/or instructions to control operation of the transmitters 330*a* and receivers 332*a*, as described in more detail below. The node controller 324*a* can also provide the beacon packet to the bridge controller 1703*a*. The bridge controller 1703*a* can receive the beacon packet and provide the beacon packet to the range extending element 1705*a* which can amplify the signal the beacon packet.

At step 1908 the bridge circuit 1710*a* can deliver the beacon packet to the bridge circuit 1710*a*. The range extending element 1705*b* of the bridge circuit 1710*b* can receive the beacon packet and provide the beacon packet to the node controller 324*b*, which can store a copy of the schedule in memory At step 1910, the node controller 324*b* can provide the beacon packet to the data lanes 1813*a*-1813*n* of the backplane 306*b* via the gate controller 326*b* and the transmitters of the gate pair 328*b*. At step 1912, the functional circuits 310*b* can receive the beacon packet from the backplane 306*b*. Node controllers 324*b* of the functional circuits 310*b* can store a copy of the schedule corresponding to the current frame as well as check the schedule to determine if their previous communication requests were schedule. The node controllers 324*b* can also provide the schedule and/or instructions with the assigned time slices to the gate controllers 326*b*. The gate controllers 326*b* can use the schedule and/or instructions to control operation of the transmitters 330*b* and receivers 332*b*, as described in more detail below.

At step 1914, the functional circuits can provide beacon response packets to the data lanes 1813*a*-1813*b*. At step 1916, the bridge controller 1703*b* of the bridge circuit 1710*b* can receive the beacon response packets from each of the data lanes 1813*a*-1813*n* via the receivers 332*b*, gate controller 326*b*, and node controller 324*b*. Since the data lanes 1813*a*-1813*n* are in parallel, the bridge controller 1703*b* receives a parallel data stream that includes, or characterizes, the beacon response packets. The bridge controller 1703*b* can convert, or condense, the parallel data stream into a serial data stream, and provide the serial data stream to the range extending element 1705*b*. The range extending element can amplify power (e.g., voltage and/or current) of the serial data stream.

At step 1918, the bridge circuit 1710*b* provide the serial data stream to the bridge circuit 1710*a* via the range extending element 1705*b*. The range extending element 1705*a* can receive the serial data stream, attenuate power (e.g., voltage and/or current) of the serial data stream and provide the serial data stream to the bridge controller 1703*a*. The bridge controller 1703*a* can receive the serial data stream, expand the serial data stream into parallel data streams.

At step 1920, the bridge controller 1703*a* can provide the parallel data streams to the data lanes 1812*a*-1812*n* of the backplane 306*a* via the node 322*a*. At step 1922, functional circuits 310*a* can deliver beacon response packets to the data lanes 1812*a*-1812*n* of the backplane 306*a*. At step 1924, the master circuit can receive the beacon response packets from the functional circuits 310*a*, 310*b*, and generate a schedule for the following frame.

During normal operation (e.g., during time slices 410C-410N), functional circuits 310*a*, 310*b* can communicate via data lanes 1812*a*-1812*n*, 1813*a*-1813*n* of the backplanes 306*a*, 306*b*. For example, functional circuits 310*a*, 310*b* can deliver data packets to the data lanes 1812*a*-1812*n* of the backplane 306*a*. The bridge controller 1703*a* of the bridge circuit 1710*a* can receive the data packets in a parallel data stream, convert, or condense, the parallel data stream into a serial data stream, and provide the serial data stream to the range extending element 1705*a*. The range extending element 1705*a* can amplify power (e.g., voltage and/or current) of the serial data stream and provide the serial data stream to the bridge circuit 1710*b*. The range extending element 1705*b* can receive the serial data stream, attenuate power (e.g., voltage and/or current) of the serial data stream and provide the serial data stream to the bridge controller 1703b. The bridge controller 1703b can receive the serial data stream, expand the serial data stream into parallel data streams, and provide the parallel data streams to the data lanes 1813a-1813n via the node 322b.

Similarly, functional circuits 310b can deliver data packets to the data lanes 1813a-1813n of the backplane 306a. The bridge controller 1703b of the bridge circuit 1710b can receive the data packets in a parallel data stream, convert, or condense, the parallel data stream into a serial data stream, and provide the serial data stream to the range extending element 1705b. The range extending element 1705b can amplify power (e.g., voltage and/or current) of the serial data stream and provide the serial data stream to the bridge circuit 1710a. The range extending element 1705a can receive the serial data stream, attenuate power (e.g., voltage and/or current) of the serial data stream and provide the serial data stream to the bridge controller 1703a. The bridge controller 1703a can receive the serial data stream, expand the serial data stream into parallel data streams, and provide the parallel data streams to the data lanes 1812a-1812n via the node 322a. During operation the bridge circuits 1710a, 1710b are transparent to all the functional circuits 310a 310b coupled to the backplanes 306a, 306b of the monitoring system. Therefore, the monitoring system 1800 functions it appears that the signals/data are all from the same base.

As mentioned above, the gate controllers 326a, 326b of the bridge circuits 1710a, 1710b can use the schedule and/or instructions to control operation of the transmitters 330a, 330b and receivers 332a, 332b. For example, the gate controller 326b can set the transmitters 330b to operate in the first operating mode during time slices when the functional circuits 310a attached to the backplane 306a are scheduled to deliver data to the backplane 306a such that the data can be delivered to the backplane 306b via the bridge circuits 1710a, 1710b. The gate controller 326b of the bridge circuit 1710b can set the transmitters 330b to operate in the second operating mode during time slices in which the functional circuits 310a are not schedule to deliver data to the backplane 306a. Similarly, the gate controller 326a of the bridge circuit 1710a can set the transmitters 330a to operate in the first operating mode during time slices when the functional circuits 310b attached to the backplane 306b are scheduled to deliver data to the backplane 306a such that the data can be delivered to the backplane 306a via the bridge circuits 1710a, 1710b. The gate controller 326a can set the transmitters 330a of the bridge circuit 1710a to operate in the second operating mode during time slices when the functional circuits 310b are not schedule to deliver data to the backplane 306b.

In some embodiments, separation distances between the bridge circuits 1710a, 1710b can introduce non-negligible propagation delays in transmissions of data packets between the bridge circuits 1710a, 1710b. The propagation delays can create time synchronization errors between functional circuits 310a, 310b of each monitoring subsystem 1801a, 1801b. For example, when the master circuit (e.g., one of the functional circuits 310a) sends the beacon packet, functional circuits 310a that are coupled to the backplane 306a can receive the beacon packet before functional circuits 310b that are coupled to the backplane 306b. Therefore, the time synchronization of functional circuits 310b can be delayed as compared to the time synchronization of the functional circuits 310a. Additionally, in some cases, propagation delays can result in data packet transmissions that extend over multiple time slices, which can result in collisions. For example, if a data packet is transmitted from a functional circuit 310b coupled to the backplane 306b requires more time to travel to the backplane 306a than is allotted in a usable time slice period (e.g., usable time slice period 420), the data packet may still be in transit during a subsequent time slice. In that case, the data packet may collide with another data packet that is transmitted during the subsequent time slice.

Dead band periods (e.g., dead band period 424) can be built into time slices to absorb delays in communication between functional circuits coupled to a single backplane as well as delays in communication that result from bridge backplanes. The dead band periods can function to mitigate data transmission timing errors due to inaccuracies in time synchronization between functional circuits, as well as minimize signal collisions that can result from latencies associated with data transmission between bridged backplanes.

In order to ensure that the time slices include a sufficiently large dead band period, the bridge controllers 1703a, 1703b and/or node controllers 324a, 324b of the bridge circuits 1710a, 1710b can estimate delay times that can characterize an estimated amount of time required to transfer data packets between the bridge circuits 1710a, 1710b. The bridge circuits 1710a, 1710b can then determine, identify, or calculate a current allotted dead band period based on information available in the schedule. The bridge circuits 1710a, 1710b can compare the estimated delay times with the allotted dead band period. In some embodiments, if the dead band period is insufficient, the bridge circuits 1710a, 1710b can deliver data packets to the master circuit to request adjustment of the dead band periods and/or adjustment of sizes of time slices in subsequent frames.

In some embodiments, when the monitoring subsystems 1801a, 1801b are powered on, the bridge circuits 1710a, 1710b can be configured prevent data transmission between the backplanes 306a, 306b until hardware and operating parameters (e.g., communication schedules, baud rates, etc.) of monitoring subsystems (e.g. monitoring subsystems 1801a, 1801b) are determined to be compatible. For example, the bridge circuits 1710a, 1710b can be configured to receive data from the backplanes 306a, 306b, but can be prevented from delivering data to the backplanes 306a, 306b. In some embodiments, the transmitters 330a, 330b can be set to the second operating mode such that they prevent data from being delivered to the data lanes 1812a-1812n, 1813a-1813n. In some embodiments, the bridge circuits 1710a, 1710b can determine if hardware of the monitoring subsystem is compatible. The bridge circuits 1710a, 1710b can also determine if any preexisting schedules of the monitoring subsystems 1801a, 1801b are compatible. As an example, operating parameters can include schedules, baud rates, etc.

Figure 23:
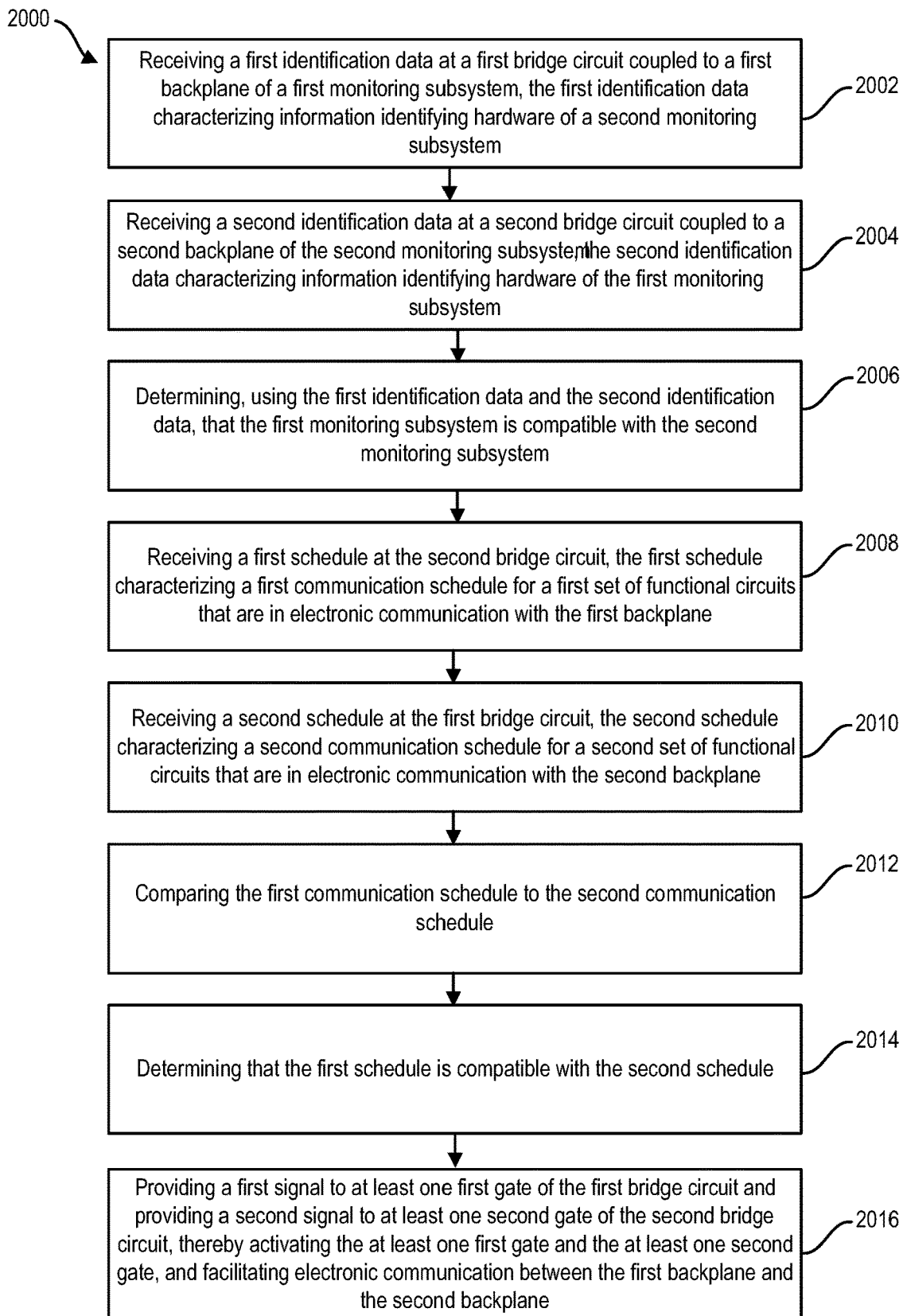
FIG. 23 is a flow chart illustrating an exemplary method of determining compatibility of backplanes.

Upon startup, the bridge circuits 1710a, 1710b can determine if they include system data stored in memory of the node controllers 324a, 324b and/or the bridge controllers 1703a, 1703b. As an example, system data can be, or can include, unique IDs (e.g., MAC addresses) corresponding to components of the monitoring subsystems, information describing how many data lanes each backplane includes, network IDs, etc. FIG. 23 shows a flow chart 2000 illustrating an exemplary method of determining that hardware and operating parameters of monitoring subsystems (e.g. monitoring subsystems 1801a, 1801b) are compatible.

At step 2002, the method can include receiving a first identification data at a first bridge circuit (e.g., bridge circuit 1710a) coupled to a first backplane (e.g., backplane 306a) of a first monitoring subsystem (e.g., monitoring subsystem 1801a). The first identification data can characterize information identifying hardware of a second monitoring subsystem (e.g., monitoring subsystem 1801*b*). As an example, the first identification data can be, or can include, a unique ID (e.g., a MAC address) of the second backplane (e.g., backplane 306*b*) and/or functional circuits 310*b* coupled thereto. As another example, the first identification data can be, or can include, data describing the number of data lanes that the second backplane includes, as well as a network ID corresponding to the second monitoring subsystem. In some embodiments, the first bridge circuit can receive unique IDs of the functional circuits from data packets delivered to the first backplane from the second monitoring subsystem during operation. As another example, the first bridge controller can receive data describing the number of data lanes from beacon packets (e.g., number of lanes field 507). The bridge controller and/or a node controller (e.g., bridge controller 1703*a* and node controller 324*a*) of the first bridge circuit can store the first identification data in memory during operation. The first identification data can remain in memory during a system shutdown, and can be used to confirm that the first monitoring subsystem and the second monitoring subsystem are during a subsequent system startup, as described herein.

At step 2004, the method can include receiving a second identification data at a second bridge circuit (e.g., bridge circuit 1710*b*) coupled to a second backplane (e.g., backplane 306*b*) of the second monitoring subsystem. The second identification data can characterize information identifying hardware of the first monitoring subsystem. As an example, the second identification data can be, or can include, a unique ID (e.g., a MAC address) of the first backplane and/or functional circuits coupled thereto. As another example, the second identification data can be, or can include, data describing the number of data lanes that the first backplane includes, as well as a network ID corresponding the first monitoring subsystem. In some embodiments, the second bridge circuit can receive unique IDs of the functional circuits from beacon packets or other data packets delivered to the second backplane from the first monitoring subsystem during operation. As another example, the second bridge controller can receive data describing the number of data lanes from beacon packets (e.g., number of lanes field 507). The bridge controller and/or a node controller (e.g., node controller 324*b* and bridge controller 1703*b*) of the second bridge circuit can store the second identification data in memory during operation. The second identification data can remain in memory during a system shutdown, and can be used to confirm that the first monitoring subsystem and the second monitoring subsystem are compatible during a subsequent system startup, as described herein.

In some embodiments, the second identification data can be stored in memory of the node controller and/or bridge controller of the first bridge circuit, and the first bridge circuit can provide the second identification data to the second bridge circuit. Similarly, the first identification data can be stored in memory of the node controller and/or bridge controller of the second bridge circuit, and the second bridge circuit can provide the first identification data to the first bridge circuit. As another example, the first and second identification data can be stored in memory of node controllers and/or bridge controllers of the first and second bridge circuits.

At step 2006, the first identification data and the second identification data can be used to determine that the first monitoring subsystem is compatible with the second monitoring subsystem. For example, the bridge controllers and/or node controllers of the first and second bridge circuits can confirm that the first backplane and the second backplane have the same number of data lanes. As another example, bridge controllers and/or node controller of can use the unique IDs of functional circuits and/or backplanes of the first and second monitoring subsystems to determine that the first and second monitoring subsystems are compatible. The bridge controllers and/or node controllers can also compare network IDs provided with the first and second identification data to determine that the first and second monitoring systems are compatible. For example, if the network IDs are the same, the monitoring system can be determined to be compatible.

At step 2008, the method can include receiving a first schedule at the second bridge circuit. The first schedule can characterize a first communication schedule for a first set of functional circuits that are in electronic communication with the first backplane. In some embodiments, the first schedule can be stored in memory of the node controller and/or bridge controller of the first bridge circuit, and the first bridge circuit can provide the first schedule to the second bridge circuit. As another example, the bridge controller and/or a node controller of the second bridge circuit receive the first schedule in a beacon packet during operation. The bridge controller and/or a node controller of the second bridge circuit can store the first schedule in memory. The first schedule can remain in memory during a system shutdown, and can be available for use in a subsequent system startup, as described herein.

At step 2010, the method can include receiving a second schedule at the first bridge circuit. The second schedule can characterize a second communication schedule for a second set of functional circuits that are in electronic communication with the second backplane. In some embodiments, the second schedule can be stored in memory of the node controller and/or bridge controller of the second bridge circuit, and the second bridge circuit can provide the second schedule to the first bridge circuit. As another example, the bridge controller and/or a node controller of the first bridge circuit receive the second schedule in a beacon packet during operation. The bridge controller and/or a node controller of the first bridge circuit and can store the second schedule in memory. The first schedule can remain in memory during a system shutdown, and can be available for use in a subsequent system startup, as described herein.

The first communication schedule can be compared to the second communication schedule at step 2012. For example, the first and second bridge circuits can compare the first and second schedule to ensure that functional circuits of the first monitoring subsystem are not scheduled to deliver data to data lanes of the first backplane at the same time that functional circuits of the second monitoring subsystem are schedule to deliver data to corresponding data lanes of the second backplane.

At step 2014, the method can include determining that the first schedule is compatible with the second schedule. For example, if the comparison indicates that functional circuits of the first monitoring subsystem are not scheduled to deliver data to data lanes of the first backplane at the same time that functional circuits of the second monitoring subsystem are schedule to deliver data to corresponding data lanes of the second backplane, the first and second bridge circuits can determine that the first and second schedule are compatible.

At step 2016, the method can include providing a first signal to at least one first gate (e.g., transmitter 330*a*) of the first bridge circuit and providing a second signal to at least one second gate (e.g., the transmitter 330*b*) of the second bridge circuit, thereby activating the at least one first gate and the at least one second gate, and facilitating electronic communication between the first backplane and the second backplane. As an example, node controllers of the first and second bridge circuits can provide data to the gate controllers of the first and second bridge circuit to confirm that the schedules of the first and second monitoring subsystem are compatible. The gate controllers can activate gates (e.g., transmitters 330a, 330b) of the first and second bridge circuits by delivering signals to the gates to set the gates to operate in the first operating mode, thereby allowing data to be transmitted from the bridge circuits, and allowing data to be transferred between the first and second monitoring subsystems.

In some embodiments, network IDs of the first and second monitoring subsystems can be used to determine of the first and second monitoring subsystems are compatible. The network IDs can also be used to determine if the first and second schedules are compatible.

As an example, the first bridge circuit can provide the second bridge circuit with a first network ID that characterizes a configuration of the first monitoring subsystem. The second bridge circuit can provide the first bridge circuit with a second network ID that characterizes a configuration of the second monitoring subsystem. The first and second network IDs can include data such as, e.g., unique IDs of functional circuits and/or the backplane, number of data lanes on the backplane, etc. corresponds to hardware of the first and second monitoring subsystems as well as operating parameters such as e.g., communication schedules, the baud rate, etc. of the first and second monitoring subsystems. The bridge controllers and/or node controllers of the first and second bridge circuits can compare the first network ID with the second network ID to determine if the hardware and operating parameters of the first and second monitoring subsystems are compatible. If the network IDs indicate that the hardware and operating parameters of the first and second monitoring subsystem are compatible, node controllers of the first and second bridge circuits can provide data to the gate controllers of the first and second bridge circuit to confirm the compatibility of the first and second monitoring subsystems. The gate controllers can activate gates (e.g., transmitters 330a, 330b) of the first and second bridge circuits by delivering signals to the gates to set the gates to operate in the first operating mode, thereby allowing data to be transmitted from the bridge circuits, and allowing data to be transferred between the first and second monitoring subsystems.

After the gates first and second bridge circuit are set to operate in the first operating mode, functional circuits of the first and second monitoring subsystem can then execute an initialization process to select a master node, as described above with regard to FIG. 13. The master circuit can generate and distribute a third schedule, and monitor data delivered to the backplanes, as described above with regard to FIGS. 14-17.

In some embodiments, when the monitoring subsystems are powered, the first and second bridge circuits may not have access to preexisting data (e.g., identification data, network IDs, schedules, etc.) that can be used to determine if hardware and operating parameters of the first and second subsystems are compatible. In that case, the first and second bridge circuits can used data from beacon packets to determine if hardware and operating parameters of the first and second subsystems are compatible.

Initially, upon system startup one or more functional circuits coupled to each of the first and second backplanes (e.g., backplanes 306a, 306b) can begin an initialization process to assume arbitration responsibilities and become a master circuit, as described above with respect to FIG. 13. At the end of the initialization processes, the first monitoring subsystem (e.g., monitoring subsystem 1801a) can include a first master circuit, and the second monitoring subsystem (e.g., monitoring subsystem 1801b) can include a second master circuit.

The first and second master circuits can deliver first and second beacon packets to data lanes of the first and second backplanes, respectively. The beacon packets can generally be similar to the beacon packet 500, describe with regard to FIG. 8. Each beacon packet can include a preamble, type, current time, number of lanes, baud rate, schedule header, and schedule entries fields.

The bridge controller (e.g., bridge controller 1703a) of the first bridge circuit can receive the first beacon packet, and the bridge controller (e.g., bridge controller 1703b) of the second bridge circuit can receive the second beacon packet. The bridge controller and/or node controller of the first bridge circuit can store data corresponding to the fields of the first beacon packet in memory. The bridge controller and/or node controller of the second bridge circuit can store data corresponding to the fields of the second beacon packet in memory.

The bridge controller of the first bridge circuit can deliver the first beacon packet to a range extending element (e.g., range extending element 1705a) of the first bridge circuit. The range extending element can amplify power (e.g., voltage and/or current) of a signal corresponding to the first beacon packet, and can provide the first beacon packet to the bridge controller and/or node controller of the second bridge circuit. The bridge controller of the second bridge circuit can deliver the second beacon packet to a range extending element (e.g., range extending element 1705b) of the second bridge circuit. The range extending element can amplify power (e.g., voltage and/or current) of a signal corresponding to the second beacon packet, and can provide the second beacon packet to the bridge controller and/or node controller of the first bridge circuit.

The bridge controllers and/or note controllers of the first and second bridge circuits can compare the data corresponding to the fields (e.g., preamble, type, current time, number of lanes, baud rate, schedule header, and schedule entries fields) provided within the first and second beacon packets to determine if the first and second monitoring subsystems are compatible.

If the first and second monitoring subsystems are determined to be compatible, node controllers of the first and second bridge circuits can provide data to the gate controllers of the first and second bridge circuit to confirm that the first and second monitoring subsystems are compatible. The gate controllers can activate gates (e.g., transmitters) of the first and second bridge circuits by delivering signals to the gates to set the gates to operate in the first operating mode, thereby allowing data to be transmitted from the bridge circuits, and allowing data to be transferred between the first and second monitoring subsystems.

After the monitoring subsystems are in electronic communication, one of the master circuits can relinquish arbitration capabilities such that only one master circuit is shared between the first and second backplane. For example, if one of the master circuits detects a beacon packet, the master circuit can enter a state of random back-off, as described above with regard to step 1112, shown in FIG. 13. In some embodiments, the former master circuit can remain in a state of random back-off and function as a slave note until it does not receive a beacon packet during a beacon time slice (e.g., beacon time slice 410A). If the former master circuit does not receive a beacon packet during beacon time slice, the former master circuit can assume arbitration responsibilities, thereby becoming the master circuit, as described with regard to step 1114, shown in FIG. 13.

Bridge circuits can function to electrically couple backplanes to form an extended logical bus such that all data is transferred between the backplanes. This allows monitoring systems to span between multiple locations while retaining the full functionality that is available when using monitoring systems that include a single backplane. Additionally, since all data is shared between bridged backplanes, the bridges allow for resources (e.g., functional circuits) to be distributed between the backplanes as desired.

Figure 24:
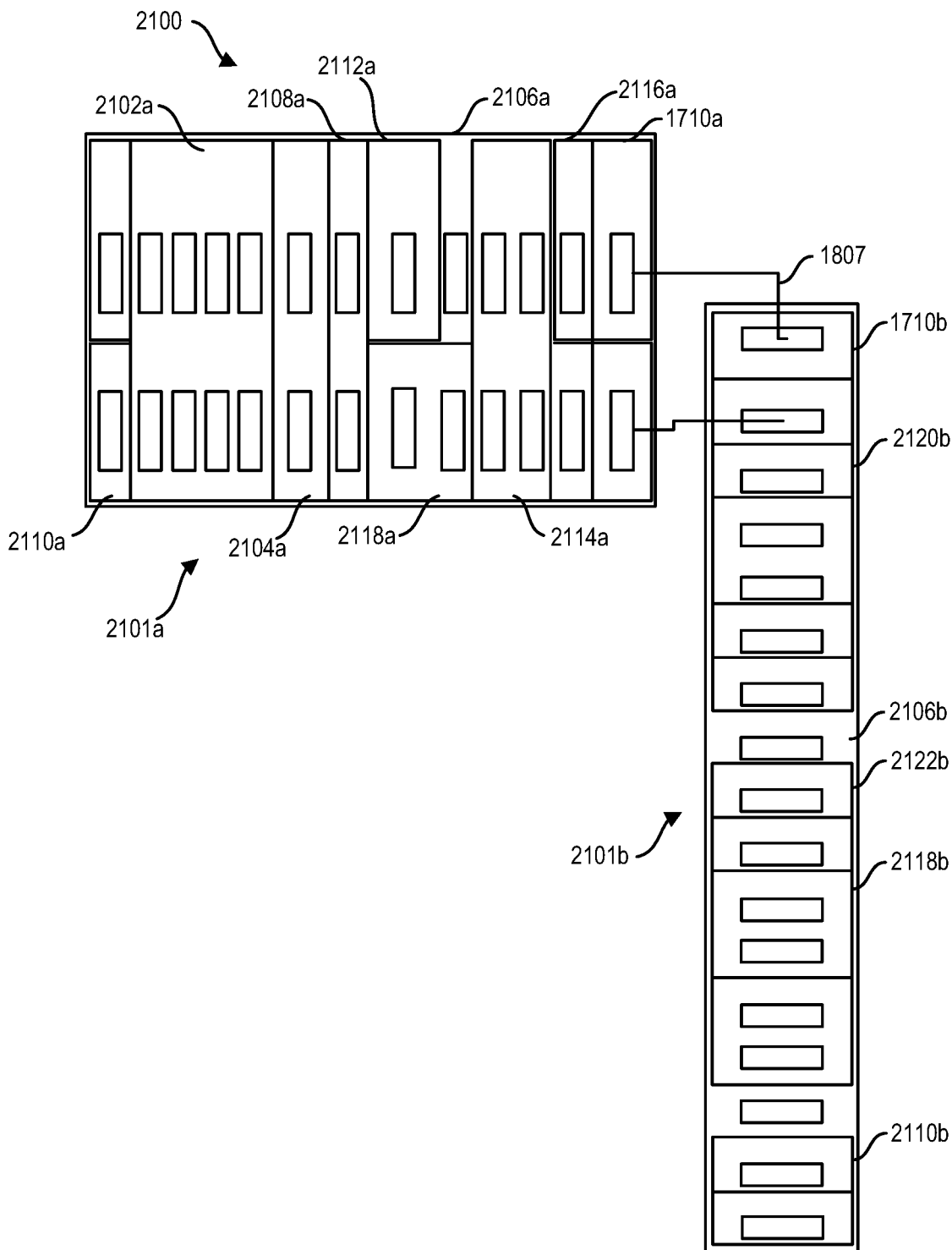
FIG. 24 is a block diagram of another exemplary monitoring system that includes two monitoring subsystems that are coupled using bridge circuits.

FIG. 24 shows block diagram of another exemplary monitoring system 2100. As shown in the illustrated example, the monitoring system include monitoring subsystems 2101a, 2101b that can be electrically coupled using bridge circuits 1710a, 1710b. Coupling elements 1807 can electrically couple the bridge circuits 1710a, 1710b. The first and second monitoring subsystems 2101a, 2101b can include backplanes 2106a, 2106b that can generally be similar to the backplane 306a, 306b.

The monitoring subsystems 2101a, 2101b can include various different functional circuits that can be coupled to ports of the backplanes 2106a, 2106b. The backplanes 2106a, 2106b can be, include, or form part of, a physical bus. The backplanes 2106a, 2106b can generally be similar to the backplanes 306a, 306b described above with regard to FIGS. 4, 20.

The first monitoring subsystem 2101a include condition monitoring circuits 2102a, gateway circuits 2104a, system interface circuits 2108a, power input circuits 2110a, a discrete input circuit 2112a, protection circuits 2114a, 4-20 output circuits 2116a, relay circuits 2118a, and bridge circuits 1710a. The second monitoring subsystem 2101b can include dynamic input circuits 2120b, static input circuits 2122b, relay circuits 2118b, and PIM circuits 2110b. As shown in the illustrated example, the monitoring subsystems 2101a, 2101b can be coupled via multiple bridge circuits 1710a, 1710b for the purpose of redundancy. If one of the bridge circuits fails, another pair of bridge circuits is available to bridge communications between the backplanes 2106a, 2106b.

As shown in the illustrated example, the monitoring subsystem 2101b can primarily function receive analog sensor data, digitize the sensor data, and provide data packets corresponding to the sensor data to data lanes of the backplane 2106b using the various input circuits. The monitoring subsystem 2101a can primarily function to provide updates to the monitoring system (e.g., via the system interface circuit 2108a), process the sensor data (e.g., using the protection circuits 2114a), and provide processed data to users (e.g., via the gateway circuit 2104a, condition monitoring circuit 2102a).

Bridging can allow for monitoring subsystem to share common resources (e.g., functional circuits), which can provide flexibility when designing and installing monitoring systems. For example, the monitoring subsystem 2101b can be installed remotely near industrial equipment such that the input circuits can receive sensor data, while the monitoring subsystem 2101a can be installed at another location that may be more convenient, or easier to access. Installing the monitoring subsystem near the industrial equipment to be monitored, can also reduce costs of running cables from the sensors to the input circuits, as well as improve the quality of the signals delivered from sensors to the input circuits by reducing exposure to noise and ground loops. As an example, ground loops be described as interference resulting from portions of a circuit that are at different ground reference voltages, rather than the same ground reference voltage. Ground loops can cause undesirable signal degradation and/or noise within signals. The monitoring subsystem 2101b can take advantage of resources (e.g., condition monitoring circuits 2102a, gateway circuits 2104a, system interface circuits 2108a, PIM circuits 2110a, a discrete input circuit 2112a, protection circuits 2114a, 4-20 output circuits 2116a, relay circuits 2118a,) installed on the monitoring subsystem 2101a.

Figure 25:
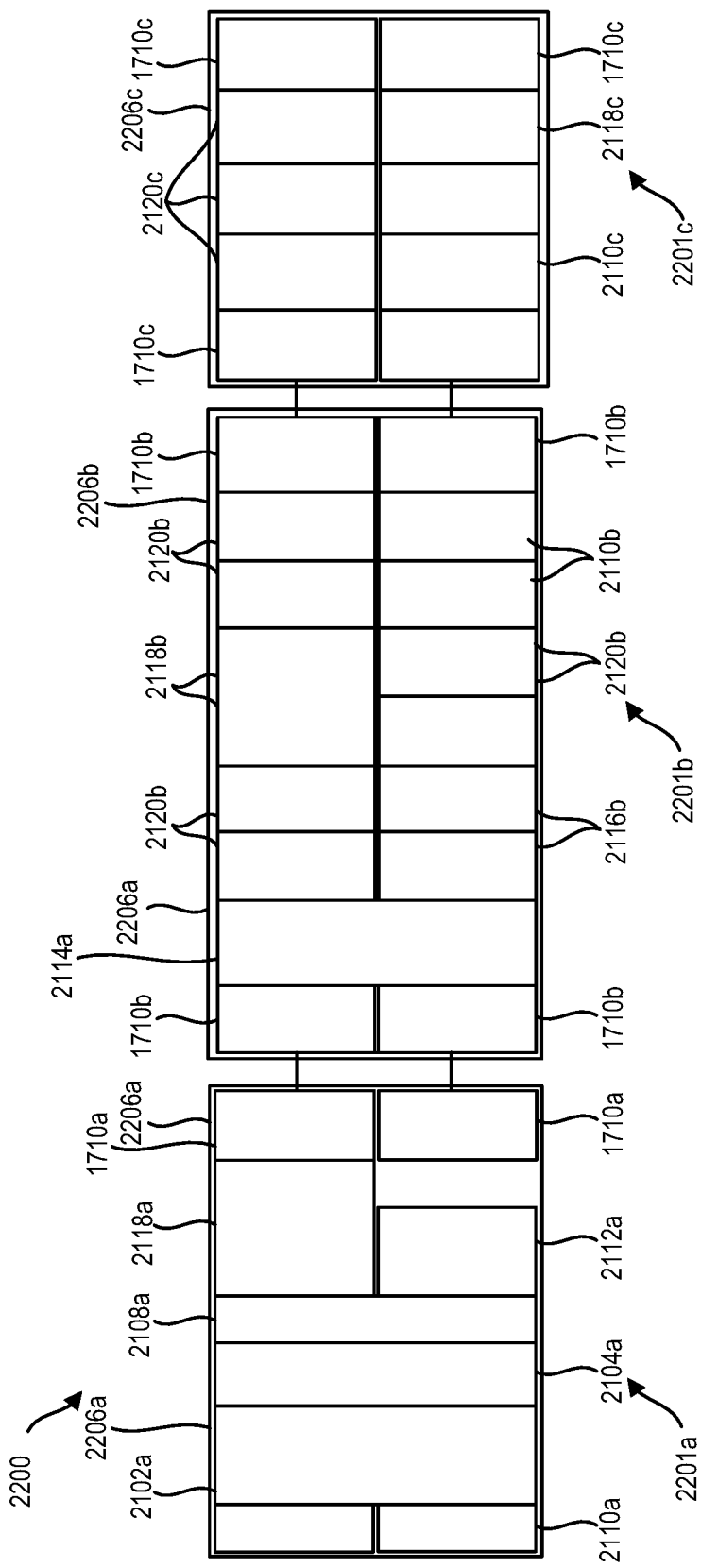
FIG. 25 is block diagram of another exemplary monitoring system that includes two monitoring subsystems that are coupled using bridge circuit.

FIG. 25 shows block diagram of another exemplary monitoring system 2200. As shown in the illustrated example, the monitoring system 2200 include monitoring subsystems 2201a, 2201b, 2201c that can be electrically coupled via bridge circuits 1701a, 1701b, 1701c. The monitoring subsystems 2201a, 2201b, 2201c can include backplanes 2206a, 2206b, 2206c that can be coupled via the bridge circuits 1701a, 1701b, 1701c. The backplanes 2206a, 2206b, 2206c can generally be similar to the backplanes 2106a, 2106b. The coupled backplanes 2206a, 2206b, 2206c form an extended logical bus.

The monitoring subsystems 2201a, 2201b, 2201c can include various monitoring circuits that can be coupled to the respective backplanes. The monitoring subsystem 2201a can include a condition monitoring circuit 2102a, a gateway circuit 2104a, a system interface circuit 2108a, a discrete input circuit 2112a, a relay circuit 2118a, PIM circuits 2110a, and bridge circuits 1710a. The monitoring subsystem 2201b can include a protection circuit 2114b, dynamic input circuits 2120b, 4-20 output circuits 2116b, relay circuits 2118b, power input circuits 2110b, and bridge circuits 1710b. The monitoring subsystem 2201c can include dynamic input circuits 2120c, a PIM circuit 2110c, a relay circuit 2118c, and bridge circuits 1710c.

In some embodiments, the monitoring subsystem 2201b can function as the primary monitoring subsystem. For example, the monitoring subsystem 2201b can be positioned locally near a critical piece of industrial equipment. The 4-20 output circuits 2116b can be configured to output analog sensor data, which can allow local users to troubleshoot operation of the dynamic input circuits and/or sensors coupled to the dynamic input circuits of the monitoring subsystem 2201b to ensure that the monitoring subsystem 2201b is functioning properly. In some embodiments, the monitoring subsystems 2201c can be installed remotely near another industrial system. The monitoring subsystem 2201a can primarily function to provide updates to the monitoring system (e.g., via the system interface circuit 2108a), and provide processed data to users (e.g., via the gateway circuit 2104a, and the condition monitoring circuit 2102a). For example, the gateway circuit 2104a can function to provide data to, and receive data from, trusted users (e.g., plant operators). The condition monitoring circuit, which cannot deliver data packets to the backplane 2206a, can function to provide untrusted users (e.g., remote technical support operators) with data characterizing operation of the industrial system.

Bridging can allow for monitoring subsystem to share common resources, which can provide flexibility when designing and installing monitoring systems. For example, monitoring subsystems (e.g., monitoring subsystem 2201c) can be installed remotely near industrial equipment such that the input circuits can receive sensor data, while other monitoring subsystems (e.g., monitoring subsystem 2201b) can be installed at another location that may be more convenient, or easier to access, or have a system that is more critical to monitor. Installing monitoring subsystems near the industrial equipment to be monitored, can also reduce costs of running cables from the sensors to input circuits, as well as improve the quality of the signals delivered from sensors to the input circuits by reducing exposure to noise and ground loops. Since monitoring system can share common resources, bridging can also allow monitoring systems to be expanded more cost effectively. For example, monitoring subsystems (e.g., monitoring subsystem XC) can be added to monitoring systems to monitor operation of industrial equipment that might not be critical, or might otherwise be cost prohibitive to monitor.

In some embodiments, rather than using passive backplanes (e.g., backplanes 306a, 306b 2106a, 2106b, etc.) to facilitate communication between functional circuits of a monitoring system, Ethernet networks can be used to facilitate communication between functional circuits. In some embodiments, Ethernet protocols such as, e.g., TCP/IP and/or TSN can be used to facilitate and control communication between functional circuits.

Figure 26:
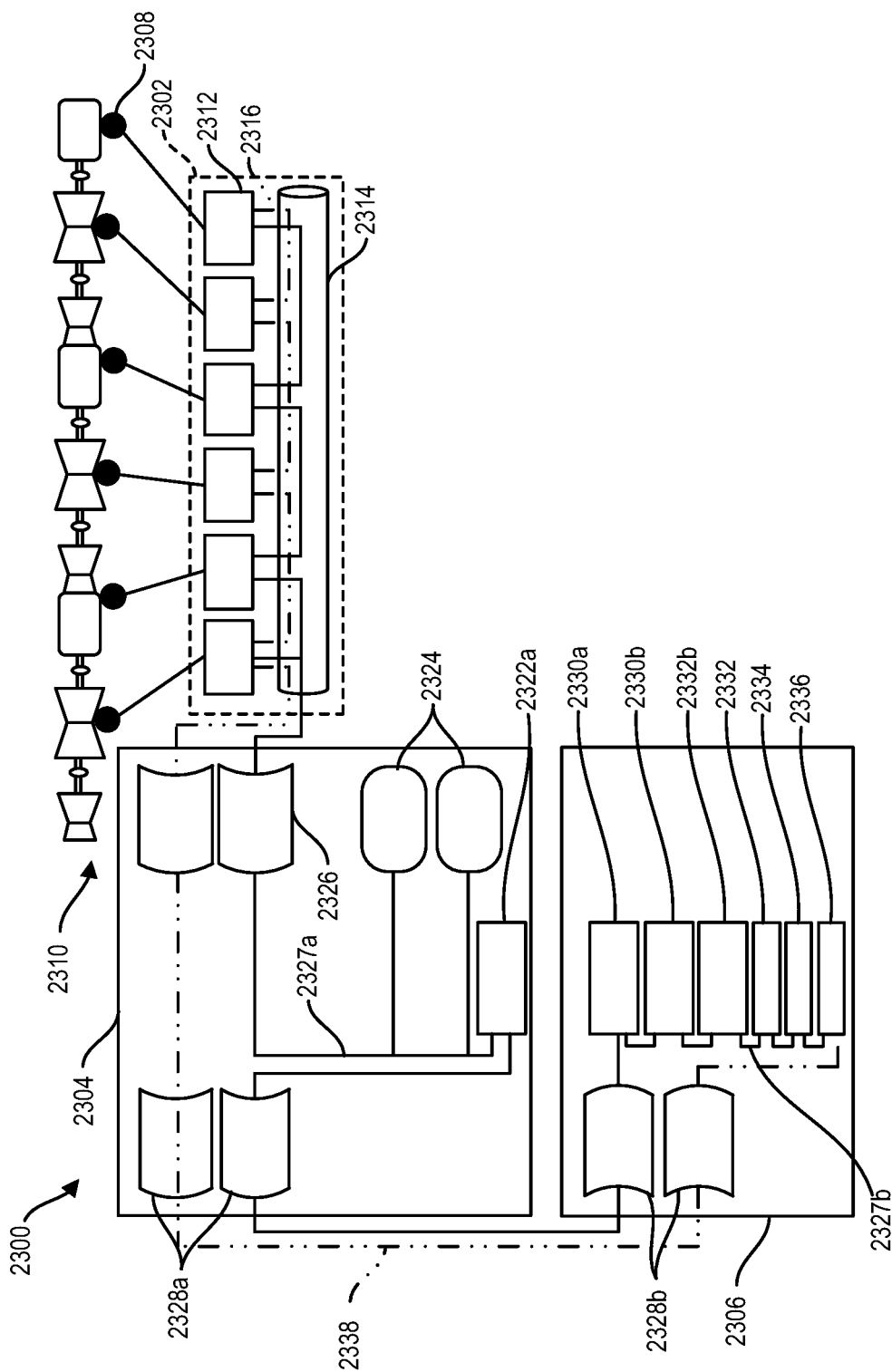
FIG. 26 is a block diagram of an exemplary monitoring system that utilizes a time-sensitive networking (TSN) Ethernet protocol to facilitate communication between functional circuits of the monitoring system.

FIG. 26 shows a block diagram of an exemplary monitoring system 2300 that utilizes the TSN Ethernet protocol to facilitate communication between functional circuits of the monitoring system 2300. As shown in the illustrated example, the monitoring system 2300 includes a sensor input subsystem 2302, a marshalling cabinet 2304, and an instrument cabinet 2306. The sensor input subsystem 2302 can be configured to receive signals from sensors 2308 configured to measure operating parameters of an industrial system 2310, and provide digital signals characterizing the sensor measurements to the marshalling cabinet 2304. The marshalling cabinet 2304 can be configured provide alarm/alerts to a control system (e.g., customer control system 212), and to facilitate communication between the instrument cabinet 2306 and the sensor input subsystem 2302. The instrument cabinet 2306 can be configured to process sensor data, receive and distribute updates to the monitoring system 2300, and provide users with data characterizing operation of the industrial system 2310.

As shown in FIG. 26, the sensor input subsystem 2302 can include junction 2312 boxes that are configured to receive the sensor signals, and a conduit 2314 that can house coupling elements 2316 (e.g., Ethernet cables) that extend between the junction boxes 2312 and to the marshalling cabinet 2304. The junction boxes 2312 can be configured to receive signals from the sensors, condition the signals, and provide digital signals characterizing the sensor measurements to the marshalling cabinet 2304. In some embodiments, sensors 2308 can be configured to provide analog signals, discrete signals, and/or digital signal streams.

Figure 27:
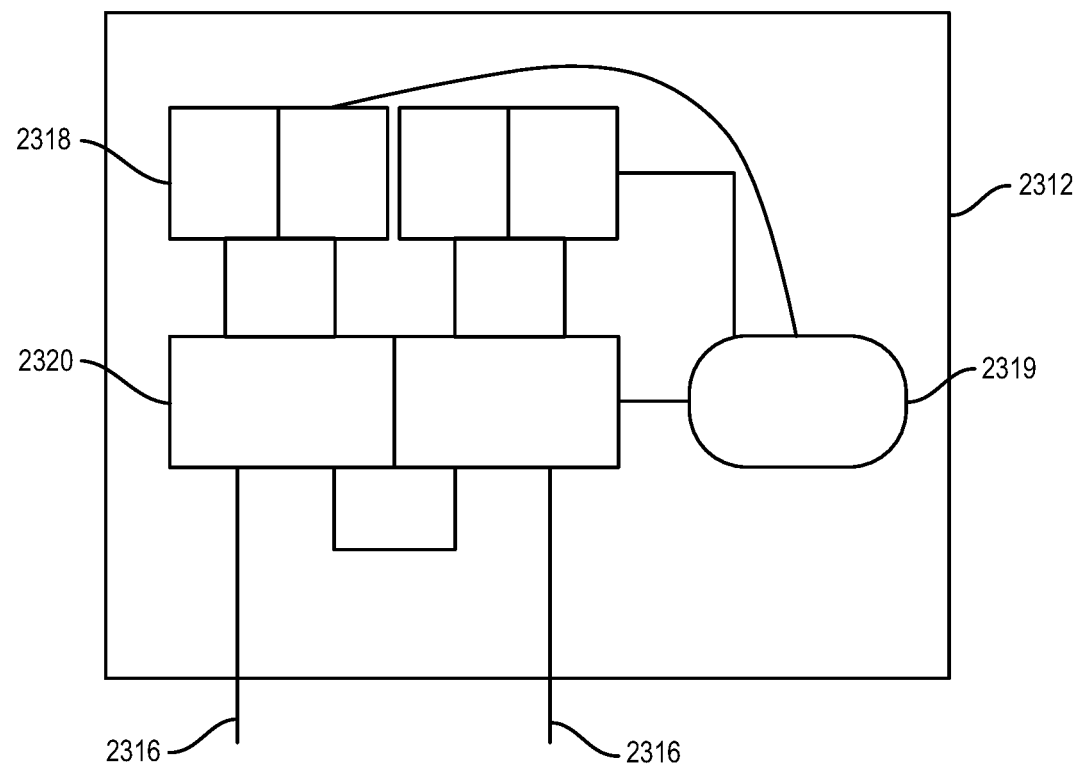
FIG. 27 is a detailed view of a portion of the monitoring system shown in FIG. 27.

FIG. 27 shown a detailed view of components within the junction boxes 2312. As shown in FIG. 27, the junction boxes 2312 can include multiple signal conditioners 2318 that can be in electronic communication with the sensors 2308 and with input circuits 2320. The junction boxes 2312 can also include a power supply 2319 that can be electrically coupled to the signal conditioners 2318 and to the input circuits 2320. The power supply 2319 can be configured to power the signal conditioners 2318 and the input circuits 2320. The signal conditioners 2318 can be configured to receive signals from the sensors 2308, adjust a voltage and/or current of the signal, and provide the adjusted signal to the input circuits 2320.

Depending on the type of signal provided by the sensors 2308 the input circuits 2320 can be configured to receive the adjusted signals from the signal conditioners 2318, convert the signals to digital signals, adjust a voltage and/or current of a discrete signal, adjust a current and/or voltage of a digital signal stream, and provide adjusted digital signal to the marshalling cabinet 2304 via the coupling elements.

As shown in the illustrated example, the marshalling cabinet can include a relay circuit 2322, power supplies 2324, signal barriers 2326, and cable couplings 2328a. The power supplies 2324 can be electrically coupled to the relay circuit 2322. The power supplies 2324 can be configured to provide power to the relay circuit 2322a. The signal barriers 2326 can function to prevent potentially dangerous signals from being transmitted to the sensor input system 2302. For example, if the sensor input subsystem 2302 is positioned within an environment that contains combustible gasses, the signal barriers 2326 can be configured to prevent signals that are beyond a predetermine voltage and/or current from being delivered to the sensor input subsystem 2302. The relay circuit 2322a can be electrically coupled to the sensor input subsystem 2302 via the coupling elements 2327a and the signal barrier 2316. The relay circuit 2322a can also be electrically coupled to the cable coupling 2328a such that it is in electrical communication with functional circuits within the instrument cabinet 2306.

The instrument cabinet 2306 can include protection circuits 2330a, 2330b a relay circuit 2322b, a 4-20 output circuit 2332, a system interface circuit 2334, gateway circuit 2336, and cable couplings 2328b. The power supplies 2324 can also provide power to the protection circuits 2330a, 2330b, relay circuit 2322b, 4-20 output circuit 2332, system interface circuit 2334, and gateway circuit 2336 within the instrument cabinet 2306. The protection circuits 2330a, 2330b, relay circuit 2322b, 4-20 output circuit 2332, system interface circuit 2334, and gateway circuit 2336 can generally function similarly to other protection circuits, relay circuit, 4-20 output circuit, system interface circuit, and gateway circuits as described herein. Coupling elements 2327b can extend from the cable couplings 2328b to the protection circuit 2330a and the gateway circuit 2336. Coupling elements 2327b can also extend between the protection circuits 2330a, 2330b the relay circuit 2322b, 4-20 output circuit 2332, system interface circuit 2334, and gateway circuit 2336, such that the protection circuits 2330a, 2330b, relay circuit 2322b, 4-20 output circuit 2332, system interface circuit 2334, and gateway circuit 2336 can be electrically coupled between the cable couplings 2328b.

The instrument cabinet 2306 can be electrically coupled to the marshalling cabinet 2304 via coupling elements 2338. In some embodiments, the coupling elements 2338 can be fiber optic cabling that can extend between cable couplings 2328a, 2328b of the marshalling cabinet 2304 and the instrument cabinet 2306. The cable couplings 2328a, 2328b can be configured to function as an interface between coupling elements 2327a, 2327b within the marshalling cabinet 2304 and the instrument cabinet 2306, and coupling elements 2338 that extend between the marshalling cabinet 2304 and the instrument cabinet 2306.

In operation, the sensor input subsystem 2302 can provide digital signals characterizing sensor measurements to the marshalling cabinet 2304. The digital signals can travel through the coupling elements 2327 within the marshalling cabinet 2304 to the relay circuit 2322. The digital signals can also be provided to the instrument cabinet 2306 via the cable couplings 2328a, 2328a, and the coupling elements 2338 that extend therebetween. Within the instrument cabinet 2306, the digital signals can be provided to the protection circuits 2330, the relay circuit 2322b, the 4-20 output circuit 2332, the system interface circuit 2334, and gateway circuit 2336.

Figure 28:
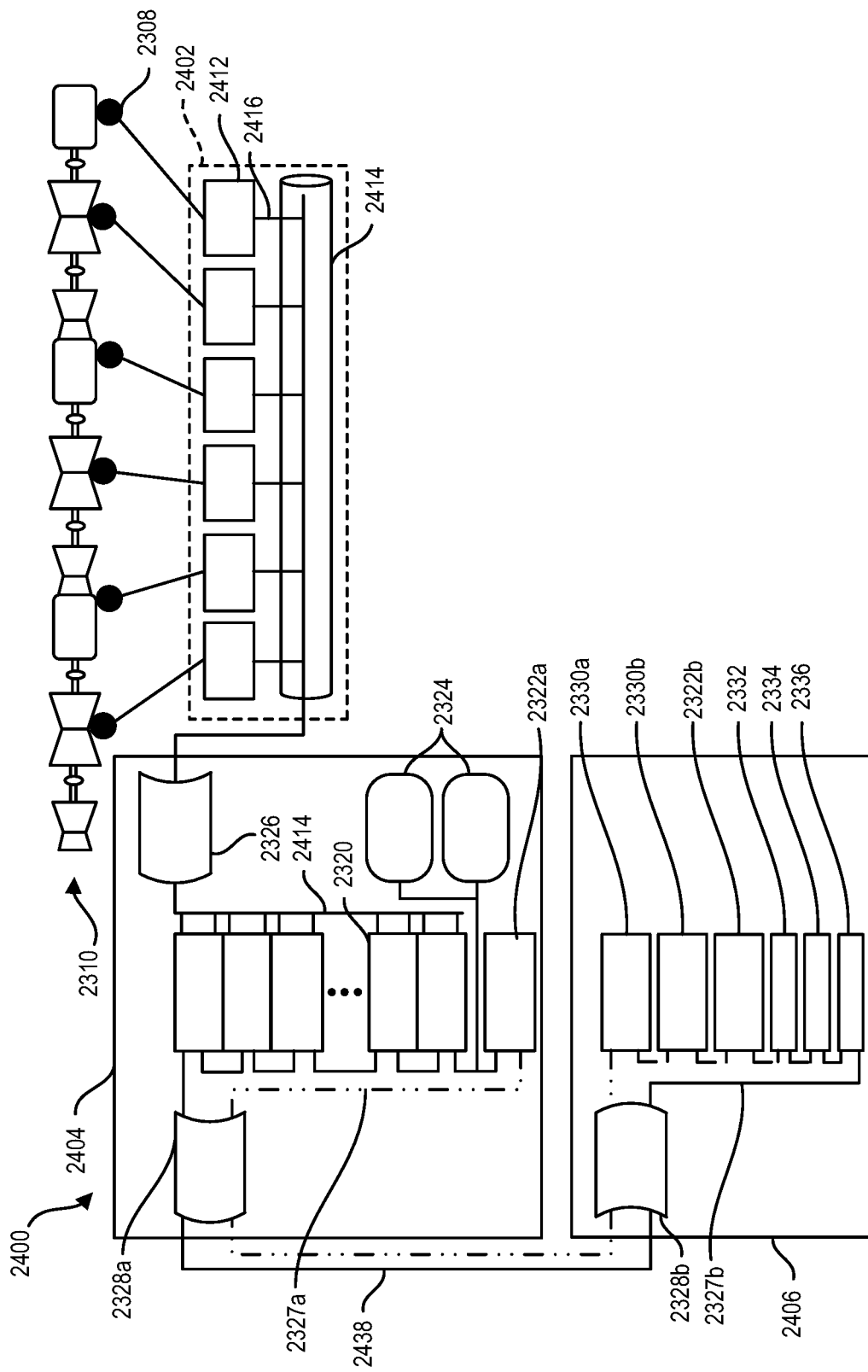
FIG. 28 is block diagram of another exemplary monitoring system that utilizes TSN Ethernet protocol to facilitate communication between functional circuits of the monitoring system.

In some embodiments, input circuits can be positioned within a marshalling cabinet of monitoring system that utilizes the TSN Ethernet protocol to facilitate communication between functional circuits of a monitoring system. FIG. 28 shows a block diagram of another exemplary monitoring system 2400 that utilizes the TSN Ethernet protocol to facilitate communication between functional circuits of a monitoring system. The monitoring system 2400 can generally be similar to the monitoring system 2300 illustrated in FIG. 26, but can include input circuits positioned within a marshalling cabinet 2404.]

As shown in the illustrated example, the monitoring system 2400 includes a sensor input subsystem 2402, a marshalling cabinet 2404, and an instrument cabinet 2406. The sensor input subsystem 2402 can be configured to receive signals from sensors 2308 configured to measure operating parameters of an industrial system 2310, condition the sensor signals, and provide conditioned sensor signals characterizing the sensor measurements to the marshalling cabinet 2404. The marshalling cabinet 2404 can be configured receive the conditioned sensor signals and provide digital signals characterizing the sensor measurements to the instrument cabinet 2406. The marshalling cabinet 2404 can also be configured provide alarm/alerts to a control system (e.g., customer control system 212), and to facilitate communication between the instrument cabinet 2306 and the sensor input subsystem 2302. The instrument cabinet 2406 can be configured to process sensor data, receive and distribute updates to the monitoring system 24000, and provide users with data characterizing operation of the industrial system 2310.

The sensor input subsystem 2402 can include junction 2412 boxes that can be configured to receive the sensor signals, and a conduit 2414 that can house coupling elements 2416 (e.g., Ethernet cables) that extend between the junction boxes 2412 and to the marshalling cabinet 2404. The junction boxes 2412 can generally be similar to the junction boxes 2312 but do not include input circuits. The junction boxes 2412 can be configured to receive signals from sensors 2308, condition the sensor signals, and provide conditioned sensor signals characterizing the sensor measurements to the marshalling cabinet 2404 via the coupling elements 2416. In some embodiments, the coupling elements 2416 can be analog field wires.

The marshalling cabinet 2404 can include input circuits 2320, power supplies 2324, a relay circuit 2322, signal barriers 2326, and cable couplings 2328a. The power supplies 2324 can be electrically coupled to the input circuits 2320, the relay circuits 2322a, and other functional circuits within the instrument cabinet 2406. The signal barrier 2326 can be coupled to the coupling elements 2416. The input circuits 2320 can be coupled to the junction boxes 2412 via a coupling element 2417 that extends between each of the input circuits 2320 and the signal barrier 2326. The input circuits 2320 and the relay circuit 2322a can be in electrically coupled via coupling elements 2327a that extend between each of the input circuits 2320a, the relay circuit 2322a, and the cable coupling 2328a.

The instrument cabinet 2406 can include protection circuits 2330a, 2330b a relay circuit 2322b, a 4-20 output circuit 2332, a system interface circuit 2334, gateway circuit 2336, and a cable coupling 2328b. The power supplies 2324 can provide power to the protection circuits 2330a, 2330b, relay circuit 2322b, 4-20 output circuit 2332, system interface circuit 2334, and gateway circuit 2336 within the instrument cabinet 2306. Coupling elements 2327b can extend from the cable coupling 2328b to the protection circuit 2330a and the gateway circuit 2336. Coupling elements 2327b can also extend between the protection circuits 2330a, 2330b the relay circuit 2322b, 4-20 output circuit 2332, system interface circuit 2334, and gateway circuit 2336, such that the protection circuits 2330a, 2330b, relay circuit 2322b, 4-20 output circuit 2332, system interface circuit 2334, and gateway circuit 2336 can be electrically coupled.

The instrument cabinet 2406 can be electrically coupled to the marshalling cabinet 2406 via coupling elements 2438. In some embodiments, the coupling elements 2338 can be fiber optic cabling that can extend between cable couplings 2328a, 2328b of the marshalling cabinet 2404 and the instrument cabinet 2406. The cable couplings 2328a, 2328b can be configured to function as an interface between coupling elements 2327a, 2327b within the marshalling cabinet 2404 and the instrument cabinet 2406, and coupling elements 2438 that extend between the marshalling cabinet 2404 and the instrument cabinet 2406.

In operation, the sensor input subsystem 2402 can provide conditioned signals characterizing sensor measurements to the marshalling cabinet 2304. The input circuits 2320 can receive the conditioned signals. The input circuits 2320 can generate digital signals based on the conditioned signals, and provide the digital signals to the relay circuit 2322a and the he instrument cabinet 2406 via the cable couplings 2328a, 2328a, and the coupling elements 2438 that extend therebetween. Within the instrument cabinet 2306, the digital signals can be provided to the protection circuits 2330, the relay circuit 2322b, the 4-20 output circuit 2332, the system interface circuit 2334, and gateway circuit 2336.

Traditional monitoring systems can be limited in terms of flexibility and scalability. Additionally, costs and complexity of installation can create a significant barrier to entry for users that want to monitor low cost and/or low priority components/systems. By utilizing functional circuits that can be detachably coupled to the backplane, performance of the monitoring systems described herein can be adjusted and/or scaled to fit individual monitoring needs. For example, processing power can be increased by coupling additional processing circuits to the backplane. Additionally, utilizing bridge circuits to facilitate communication between multiple backplanes can allow for monitoring subsystem of a monitoring system to share common resources, which can provide flexibility when designing and installing monitoring systems. For example, monitoring subsystems (e.g., monitoring subsystem 2101b) can be installed remotely near industrial equipment such that the input circuits can receive sensor data, while other monitoring subsystems (e.g., monitoring subsystem 2101a) can be installed at another location that may be more convenient, or easier to access. Installing monitoring subsystems near the industrial equipment to be monitored can also reduce costs of running cables from the sensors to input circuits, as well as improve the quality of the signals delivered from sensors to the input circuits by reducing exposure to noise and ground loops. Since monitoring system can share common resources, bridging can also allow monitoring systems to be expanded more cost effectively. For example, monitoring subsystems (e.g., monitoring subsystem 2201c) can be added to monitoring systems to monitor operation of industrial equipment that might not be critical, or might otherwise be cost prohibitive to monitor.

Exemplary technical effects of the subject matter described herein can include the ability to bridge multiple backplanes of a monitoring system to create an extended logical bus. The extended logical bus allows monitoring systems to span between multiple locations while retaining the full functionality that is available when using monitoring systems that include a single backplane. Additionally, since all data is shared between bridged backplanes, the bridges allow for resources (e.g., monitoring circuits) to be distributed between the backplanes as desired. For example, monitoring subsystems can be installed remotely near industrial equipment such that the input circuits can receive sensor data, while other monitoring subsystems can be installed at another location that may be more convenient, or easier to access. Installing monitoring subsystems near the industrial equipment to be monitored can also reduce costs of running cables from the sensors to input circuits, as well as improve the quality of the signals delivered from sensors to the input circuits by reducing exposure to noise and ground loops.

Figure 29:
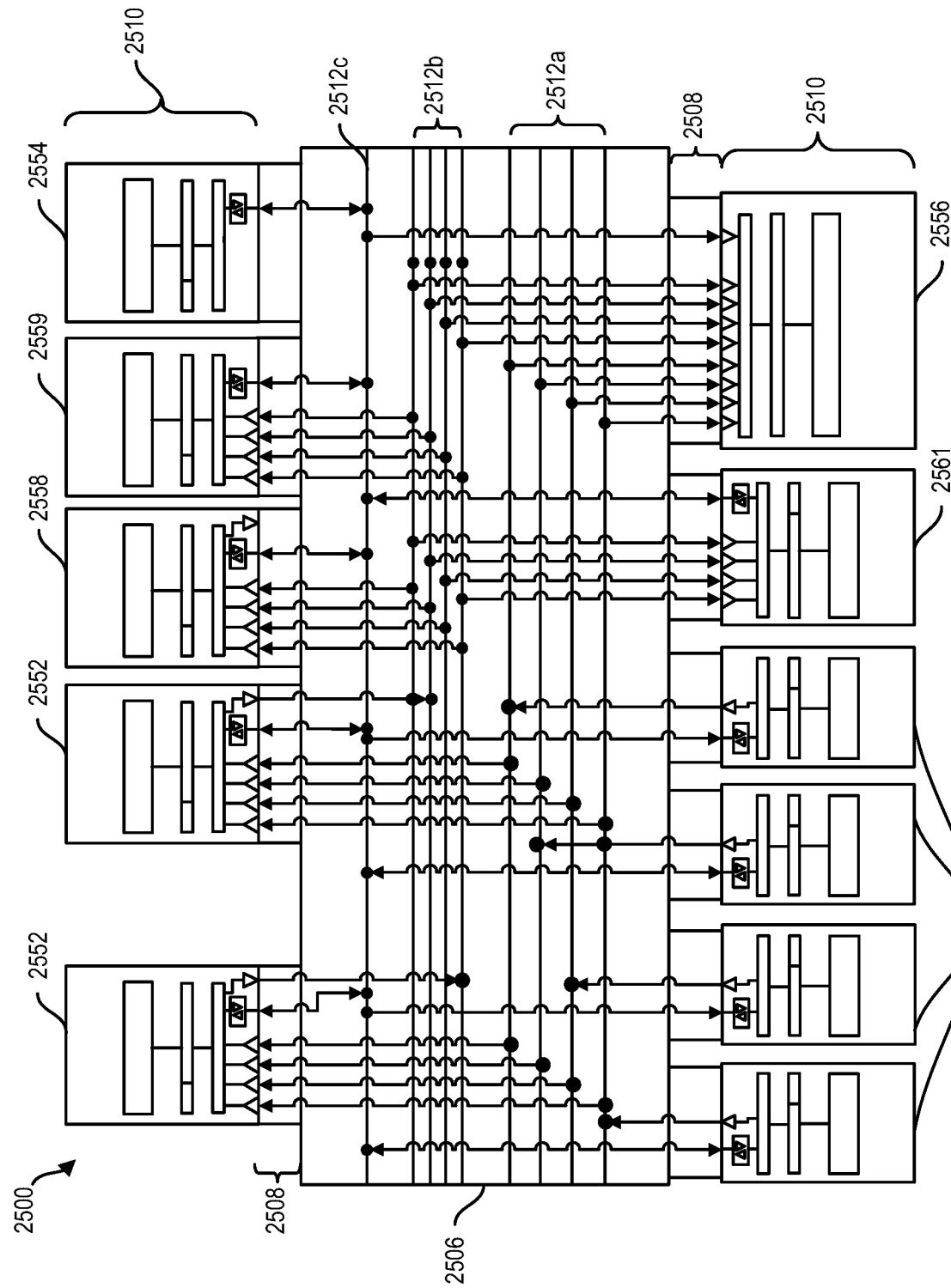
FIG. 29 is a block diagram of a portion of an exemplary embodiment of a monitoring system utilizes dedicated data lanes to facilitate communication between functional circuits.

In some embodiments, a monitoring system can utilize a backplane that has dedicated data lanes that only receive data from one input circuit. Therefore, if a data lane fails during operation, the impact of that failure can be limited to a single monitoring circuit that is configured to deliver data to that particular data lane. FIG. 29 shows a block diagram of a portion of an exemplary embodiment of a monitoring system 2500 utilizes dedicated data lanes to facilitate communication between monitoring circuits 2510.

The monitoring system 2500 can include any number of monitoring circuits 2510, which can be detachably coupled to a backplane 2506 via ports 2508 of the backplane 2506. As shown in the illustrated example, the monitoring system includes input circuits 2550, protection circuits 2552, a system interface circuit 2554, a condition monitoring circuit 2556, a 4-20 output circuit 2561, a relay circuit 2558, and a gateway circuit 2559. In some embodiments the input circuits 2550 can be, e.g., dynamic input circuits. The backplane can be, include, or form part of, a physical bus. In some embodiments, the backplane can have a unique ID that can be used to identify the backplane. The backplane can be a passive backplane configured to facilitate multipoint asynchronous electronic communication between the functional circuits that are coupled to the backplane. Therefore, all data that is delivered to the backplane can be received by all functional circuits 2510 that are coupled to the backplane 2506.

In the illustrated example, the backplane includes a set of input data lanes 2512a, a set of protection data lanes 2512b, and at least one system data lane 2512c. The protection data lanes 2512b and input data lanes 2512a can be single-direction serial communication lanes. Each of the input data lanes 2512a can be configured to receive data packets from an input circuits 2550 coupled to a port that can be configured to facilitate data delivery to the corresponding monitoring lane. As shown in the illustrated example, each input data lane 2512a can receive data packets from a single input circuit 2550. Each input data lane 2512a can be in electronic communication with ports 2508 configured to receive input circuits 2550, protection circuits 2552, the system interface circuit 2554, the condition monitoring circuit 2556, the 4-20 output circuit 2561, the relay circuit 2558, and the gateway circuit 2559.

In some embodiments, all of the input, protection, and system data lanes 2512a, 2512b, 2512c can be electrically coupled to each of the ports. However, for clarity, unused connections between the ports 2508 and the input, protection, and system data lanes 2512a, 2512b, 2512c are omitted in FIGS. 29-34.

The protection data lanes 2512b can function to provide trusted systems/users with alarms and/or other data characterizing operation of the industrial equipment being monitored. As shown in the illustrated example, each of the protection data lanes 2512b can be in electronic communication with a port configured to couple to a protection circuit such that the protection data lane is configured to receive data packets from the protection circuit. All of the protection data lanes 2512b can be in electronic communication with ports configured to receive relay circuits 2558 such that alarm signals provided by the protection circuits can be provided to trusted systems (e.g., customer control system 212).

Each of the input data lanes 2512a and protection data lanes 2512b can be dedicated data lanes, such that each of the input data lanes 2512a and protection data lanes 2512b are configured to receive data from one input circuit 2550 and one protection circuit 2552, respectively.

The system data lane 2512c can be a bi-directional serial communication lane. The system data lane 2512c can function as a communication lane for the system interface circuit to perform update operating parameters, operating thresholds, or configurations, of any of the functional circuits. The system data lane 2512c can also allow the system interface circuit to adjust, or set, alarm conditions for protection circuits as well as conditions for actuation of relay circuits 2558. The system data lane 2512c can be in electronic communication with all of the ports of the backplane, such that functional circuits coupled to each port can deliver data packets to, and receive data packets from, the system data lane 2512c. In some embodiments, the system data lane 2512c can be a command/response lane that can be controlled by the system interface circuit 2554, as described in more detail below.

Each input circuit 2550 can be in electronic communication with one of the input data lanes 2512a, as well as with the system data lane 2512c. The input circuits 2550 can be configured to receive sensor signals, perform signal conditioning on the sensor signals, and output the conditioned sensor signals to the input data lanes 2512a backplane. The input circuits 2550 can also be configured to receive data packets from the system data lane 2512c, as well as provide data packets to the system data lane 2512c when commanded. In some embodiments, the input circuits can provide various coupling interfaces for different sensors supported by the monitoring system.

Figure 30:
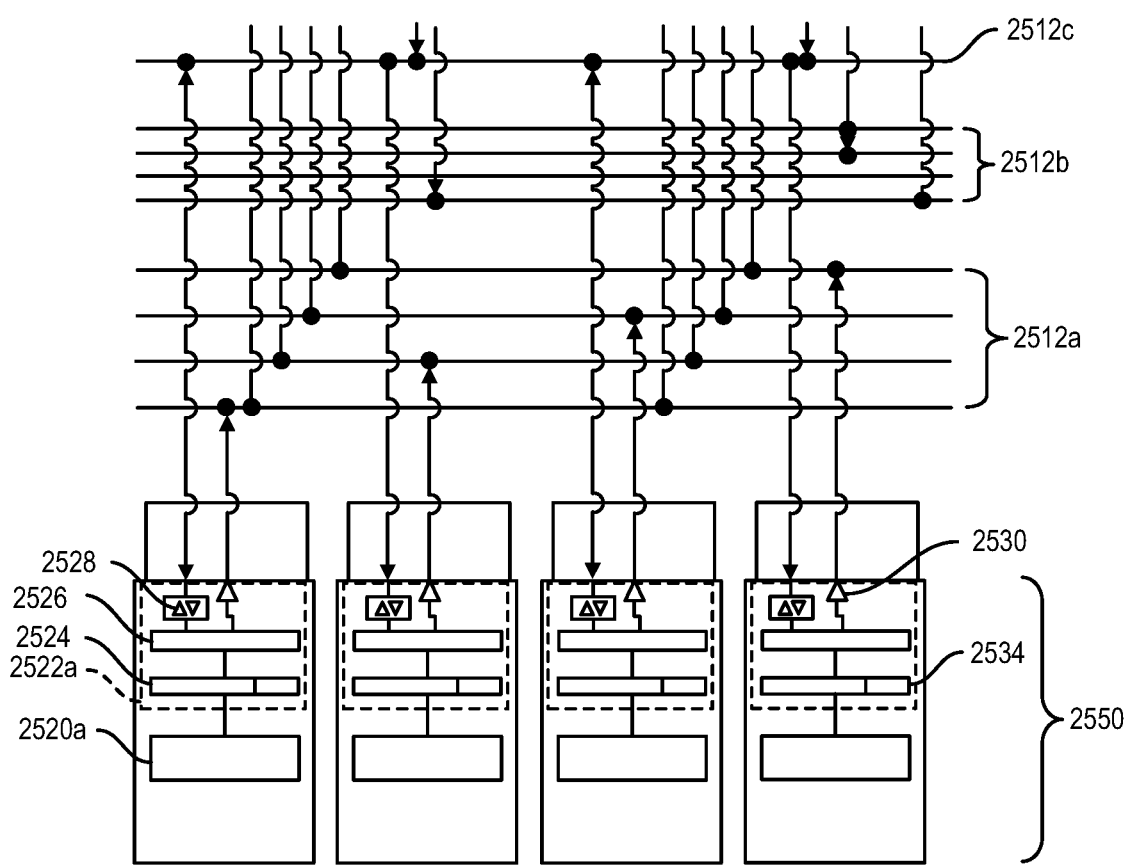
FIG. 30 is a magnified view input circuits of the monitoring system shown in FIG. 30.

FIG. 30 shows a magnified view of the input circuits 2550. As shown in the illustrated example, the input circuits 2550 can include a circuit controller 2520a and a node 2522a configured to facilitate and control electronic communication between the circuit controller and the backplane. The circuit controller 2520a can generally be similar to the circuit controller 320. The circuit controller 2520a can be configured to receive analog sensor signals from the sensors and convert the analog sensor signals to digital signals at a fixed rate. The circuit controller 2520a can also be configured to normalize the digital signals and provide the normalized digital signals to a corresponding input data lane on the backplane (e.g., via the node 2522a). In some embodiments, the circuit controller 2520 can be configured to filter the analog sensor signals to provide aliasing protection for an output rate of the digitized sensor signal. The circuit controllers 2520a can also communicate with smart sensors (e.g., transducers) to receive asset data and to issue commands to the transducers. In some embodiments, the input circuits can also provide power to the sensors.

Each node 2522*a* of the input circuits 2550 can include schedule controller 2534, a node controller 2524, a gate controller 2526, a gate pairs 2528, as well as a transmitter 2530. The schedule controller 2534, a node controller 2524, a gate controller 2526, a gate pairs 2528, as well as a transmitter 2530, can generally be similar to the schedule controller 334, node controller 324, gate controllers, 326, gate pairs 328, and transmitter 330. The gate pair 2528 can include a transmitter and a receiver. The node controller 2524 can function as an interface between the circuit controller 2520*a* and the gate controller 2526, transmitters 330 and/or receivers 332. For example, the node controller 2524 can be configured to control which data is transferred from the system data lane 2512*c* to the circuit controller 2520*a* using, e.g., packet filtering techniques. In some embodiments, the node controller 2524 can be configured to receive signals from the circuit controller 2520*a*, encode the signals into bits, and deliver signals (e.g., data packets) corresponding to the encoded bits to the gate controller 2526 for the data to be delivered to the input data lane 2512*a* of the backplane 2506.

In some embodiments, the schedule controller 2534 can be configured manage timing of communication from the input circuits 2550 to the input data lanes 2512*a* and/or the serial data lanes. For example, in some embodiments, data packets can be delivered to input data lanes 2512*a* using time division multiplexing. The schedule controllers 2534 can generate schedules and/or algorithms that can be managed by the node controllers 2524 and/or gate controllers 2526 to enable successful deliver of data packets. The schedules can generally be similar to the schedules described above with regard to FIGS. 4, 7-9. Utilizing time division multiplexing can allow multiple input circuits 2550 to deliver data to a single input data 2512*a* lane while eliminating, or mitigating, collisions between data packets.

The gate pair 2528 can be configured to facilitate electronic communication between the input circuit 2550 and the system data lanes 2512*c* of the backplane 306. In some embodiments, the gate pair 2528 can be a half-duplex transceiver or a full-duplex transceiver. Each gate controller 2526 can be configured to control operation of the transmitter 2530 as well as a transmitter and receiver of the gate pair 2528.

Figure 31:
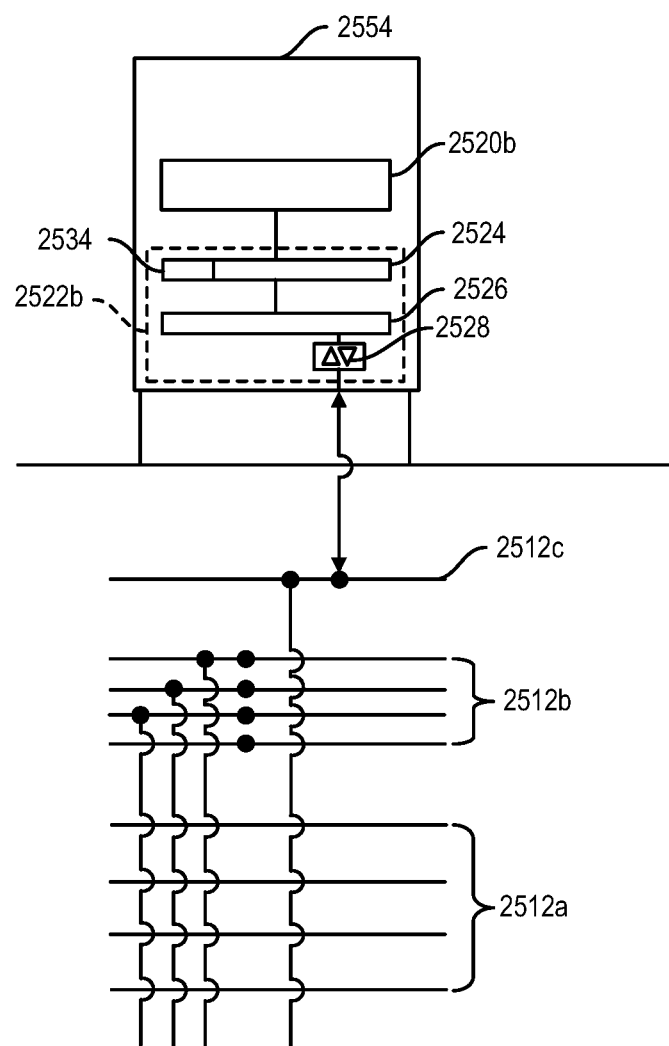
FIG. 31 is a magnified view of a system interface circuit of the monitoring system shown in FIG. 29.

FIG. 31 shows a magnified view of the system interface circuit 2554. The system interface circuit 2554 can be in electronic communication with one of the input data lanes 2512*a*, as well as with the system data lane 2512*c*. The system interface circuit 2554 can be configured to enable adjustment of operating parameters of functional circuits coupled to the backplane. As shown in the illustrated example, the system interface circuit 2554 can include a circuit controller 2520*b* and a node 2522*b* configured to enable and control electronic communication between the circuit controller 2520*b* and the system data lane 2512*c* of the backplane. Circuit controllers 2520*b* of system interface circuits can function to enable configuration of any of the functional circuits, alarm conditions for protection of the industrial equipment, and conditions for actuation of relay circuits 2558. In some embodiments, the circuit controller 2520*b* of the system interface circuit 2554 can be coupled to the control system and/or a HMI (e.g., HMI 220). A trusted user, such as, e.g., a plant operator, can provide configuration data to the circuit controller 2520*b* of the system interface circuit 2554 via the control system and/or the HMI, and the system interface circuit 2554 can provide data packets characterizing the configuration data to the system data lane 2512*c* of the backplane 2506.

The node 2522*b* of the system interface circuit 2554 can include schedule controller 2534, a node controller 2524, a gate controller 2526, and a gate pair 2528. The schedule controller 2534, node controller 2524, gate controller 2526, gate pairs 2528, and transmitters 2530, can generally be similar to the schedule controller 334, node controller 324, gate controllers, 326, gate pairs 328. The gate pair 2528 can include a transmitter and a receiver. In some embodiments, the gate pair 2528 can be a half-duplex transceiver or a full-duplex transceiver. The node controller 2524 can function as an interface between the circuit controller 2520*b* and the gate controller 2526 and/or the gate pair 2528. In some embodiments, the node controller 2525 be configured to receive signals from the circuit controller 2520*b*, encode the signals into bits, and deliver signals (e.g., data packets) corresponding to the encoded bits to the gate controller 2526 for the data to be delivered to the system data lane 2512*c* of the backplane 2506.

The gate pair 2528 can be configured to facilitate electronic communication between the system interface circuit and the system data lanes 2512*c* of the backplane. Each gate controller 2526 can be configured to control operation of the transmitter as well as the transmitter and receiver of the gate pair 2528.

In some embodiments, the system interface circuit 2554 can be in a master/slave relationship with other monitoring circuits 2510 that are in electronic communication with the system data lane 2512*c*. Therefore, the system interface circuit 2554 can deliver commands to the input circuits 2550, protection circuits 2552, relay circuit 2558, gateway circuit 2559, and 4-20 output circuit 2561, thereby commanding responses from the input circuits 2550, protection circuits 2552, relay circuit 2558, gateway circuit 2559, and 4-20 output circuit 2561. The input circuits 2550, protection circuits 2552, relay circuit 2558, gateway circuit 2559, and 4-20 output circuit 2561 can receive the command, and deliver data to the system data lane 2512*c* based on the response. As another example, in some embodiments, if the input data lanes 2512*a* and/or protection data lanes 2512*b* are configured to each receive data from more than one input circuit 2550 and protection circuit 2552, respectively, the schedule controller 2534 can be configured to generate a communication schedule that determines when each of the input circuit 2550 and/or protection circuits 2552 can deliver data to the system data lane 2512*c*. The schedules can generally be similar to the schedules described above with regard to FIGS. 4, 7-9. The schedule controller 2534 can generate a schedule and deliver the schedule to the system data lane 2512*c* via the node controller 2524 and/or the gate controller 2526. Monitoring circuits 2510 that are in electronic communication with the system data lane 2512*c* can receive the schedule, and deliver data packets to the system data lane 2512*c* based on time slices that they have been assigned.

In some embodiments, if multiple monitoring circuits communicate over a single data lane (e.g., using time division multiplexing), the system interface circuit 2554 can be configured to monitor the all of the data lanes.

Figure 32:
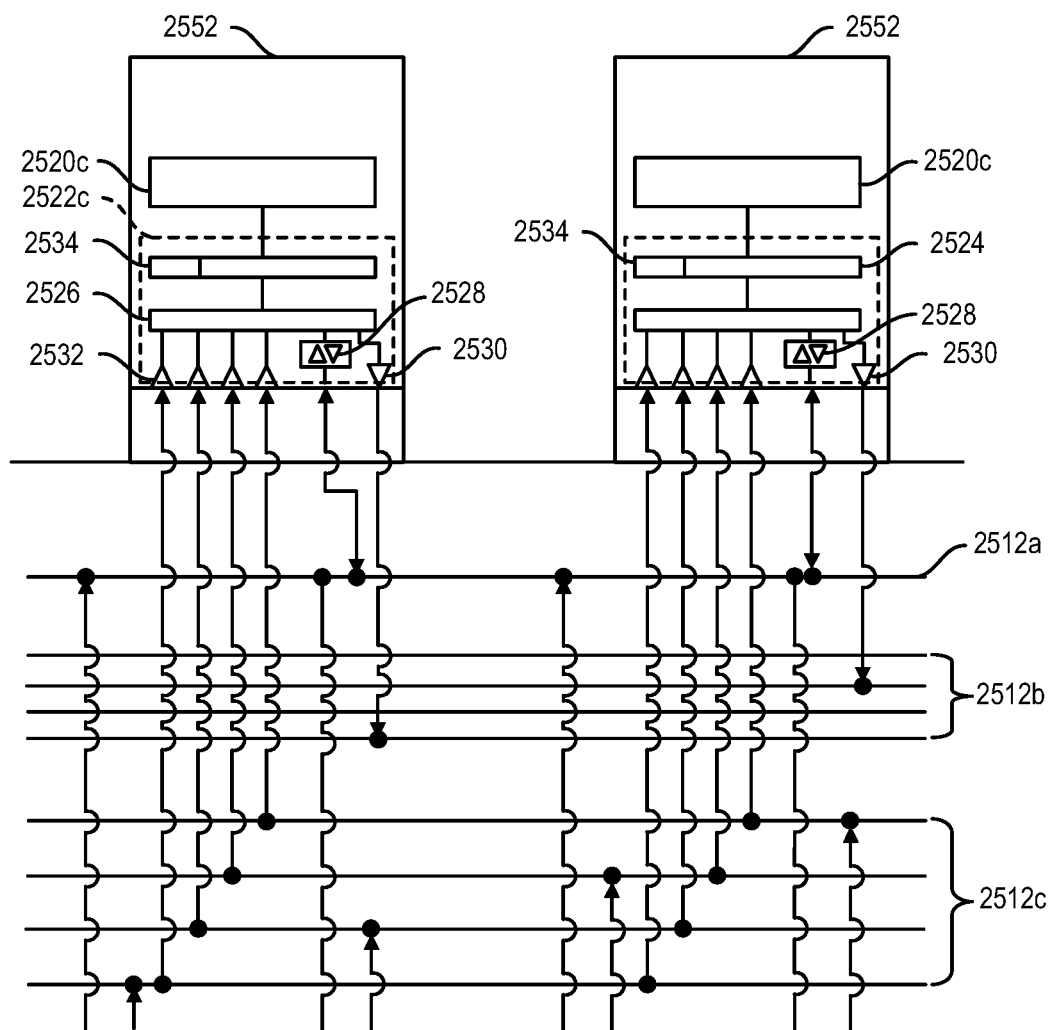
FIG. 32 is a magnified view of protection circuit of the monitoring system shown in FIG. 29.

FIG. 32 shows a magnified view of the protection circuits 2552. The protection circuits can be configured to monitor sensor data provided to the input data lanes 2512*a*. The protection monitoring system can also be configured to determine a status (e.g., OK, alert, danger, etc.) of the industrial equipment that is being monitored based on the sensor data. As shown in the illustrated example, the protection circuit 2552 can include a circuit controller 2520c and a node 2522c configured to facilitate and control electronic communication between the circuit controller 2520c and the system data lane 2512c, a protection data lane, and the input data lanes 2512a of the backplane 2506.

The circuit controller 2520c can be configured to retrieve any data packets (e.g., data packets corresponding to sensor measurements) from the input data lanes 2512a of the backplane 2506 (e.g., via the node 2522c), analyze the retrieved data packets, and provide the results of such analysis to one of the protection data lanes 2512b of the backplane 2506 (e.g., via the node 2522c). For example, circuit controllers 2520c of protection circuits 2552 can also be configured to compare data received from the backplane 2506 to pre-determined alarm conditions in real-time and determine a status (e.g., OK, alert, danger, etc.) for any measured operational parameter or variable, alone or in combination. The determined status can be subsequently output to one or more of the protection data lanes 2512b of the backplane 2506. The protection circuits 2552 can also be configured to receive data packets from the system data lane 2512c, as well as provide data packets to the system data lane 2512c, when commanded (e.g., when scheduled to communicate).

Each node 2522c of the protection circuit can include schedule controller 2534, anode controller 2524, a gate controller 2526, and a gate pair 2528, a transmitter 2530, and receivers 2532. The schedule controller 2534, node controllers 2524, gate controllers 2526, gate pair 2528, transmitters 2530, and receivers 2532 can generally be similar to the schedule controller 334, node controller 324, gate controllers 326, gate pairs 328, transmitters 330, and receivers 332. The gate pair 2532 can include a transmitter and a receiver. In some embodiments, the gate pair 2528 can be a half-duplex transceiver or a full-duplex transceiver. The node controller 2524 can function as an interface between the circuit controller 2520c and the gate controller 2526 and/or gates and the gate pair. For example, the node controller 2524 can be configured to control which data is transferred from the input data lanes 2512a to the circuit controller 2520c using, e.g., packet filtering techniques. In some embodiments, the node controller 2524 can be configured to receive signals from the circuit controller 2520c, encode the signals into bits, and deliver signals (e.g., data packets) corresponding to the encoded bits to the gate controller 2526 for the data to be delivered to the system data lane 2512c of the backplane 2506.

The gate pairs 2528 can be configured to facilitate electronic communication between the protection circuit 2552 and the system data lane 2512c. The receivers 2532 can be configured to facilitate communication between the protection circuits 2552 and the input data lanes 2512a. The transmitter 2530 can be configured to facilitate deliver of data packets (e.g., corresponding to alarms) to one or more of the protection data lanes 2512b. Each gate controller 2526 can be configured to control operation of the transmitter 2530, the receivers 2532, and the gate pair 2528.

As shown in FIGS. 29, 30, and 32, each input circuit 2550 is configured to deliver data to a different input data lane 2512a, and each protection circuit 2552 is configured to deliver data to a different protection data lane 2512b. Therefore, each of the input data lanes 2512a and protection data lanes 2512b is dedicated to a single input circuit 2550 and protection circuit 2552, respectively.

Figure 33:
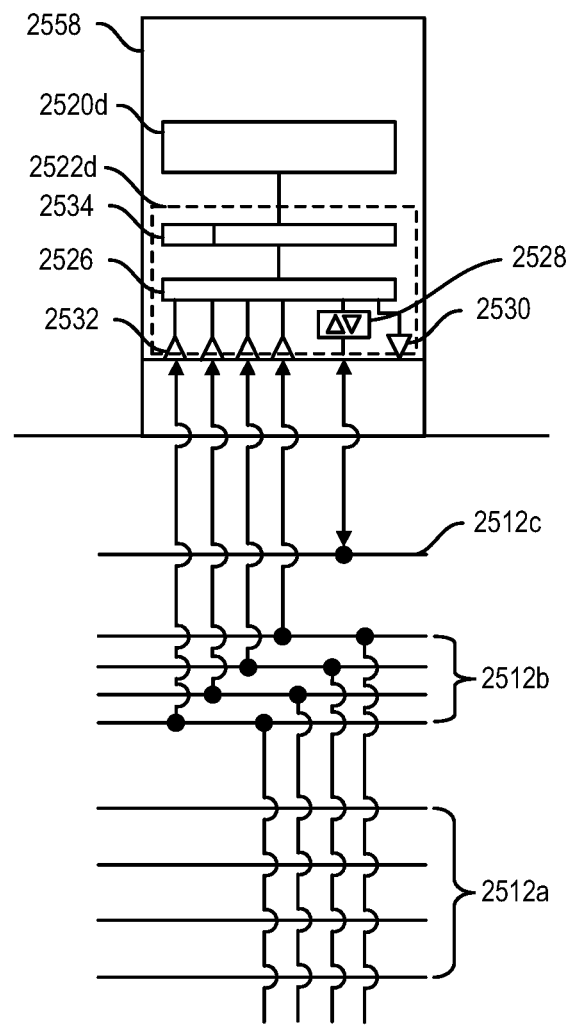
FIG. 33 is a magnified view of relay circuits of the monitoring system shown in FIG. 30.

FIG. 33 shows a magnified view of the relay circuit 2558. The relay circuit 2558 can be configured to receive status data (e.g., data provided by the protection circuits) from the protection data lanes 2512b and deliver a signal to trusted system (e.g., customer control system 212) to alert plant operators of potential problems related to operation of industrial systems, and or trigger a shutdown of the industrial system. In some embodiments, the one or more of the relay circuit 2558 can be a protection fault relay and will also have provide an alert, or indication, when the user has placed the system in a mode of operation that compromises protection.

As shown in the illustrated example, the relay circuit 2558 can include a circuit controller 2520d and node 2522d configured to facilitate and control electronic communication between the circuit controller 2520d and the system data lane 2512c as well as each of the protection data lanes 2512b. The circuit controller 2520d of the relay circuit 2558 can be configured to retrieve status data (e.g., data delivered by protection circuits) from protection data lanes 2512b of the backplane 2506 (e.g., via the node 2522d) and to actuate based on the system status. In one example, circuit controllers 2520d of relay circuit 2558 can actuate based upon a single status. In another example, relay circuit 2558 can actuate based upon Boolean expressions (e.g., AND or voting) that combine two or more statuses. In some embodiments, upon actuation, relay circuit 2558 can be configured to deliver a monitoring signal (e.g., monitoring signal 106s) to a control system (e.g., customer control system 212). The control system can then stop operation of the equipment being monitored to prevent damage or failure.

Each node 2522d of the relay circuit 2558 can include schedule controller 2534, anode controller 2524, a gate controller 2526, and a gate pair, a transmitter 2530, and receivers 2532. The schedule controller 2534, node controllers 2524, gate controllers 2526, gate pair 2528, transmitters 2530, and receivers 2532 can generally be similar to the schedule controller 334, node controller 324, gate controllers 326, gate pairs 328, transmitters 330, and receivers 332. In some embodiments, the gate pair 2528 can be a half-duplex transceiver or a full duplex transceiver. The node controller 2524 can function as an interface between the circuit controller 2520d and the gate controller 2526, transmitter 2530, receivers 2532 and/or the gate pair 2528. For example, the node controller 2524 can be configured to control which data is transferred from the protection data lanes 2512b to the circuit controller 2520d using, e.g., packet filtering techniques. In some embodiments, the node controller 2524 can be configured to receive signals from the circuit controller 2520d, encode the signals into bits, and deliver signals (e.g., data packets) corresponding to the encoded bits to the gate controller 2526 for the data to be delivered to the system data lane 2512c of the backplane 2506.

Figure 34:
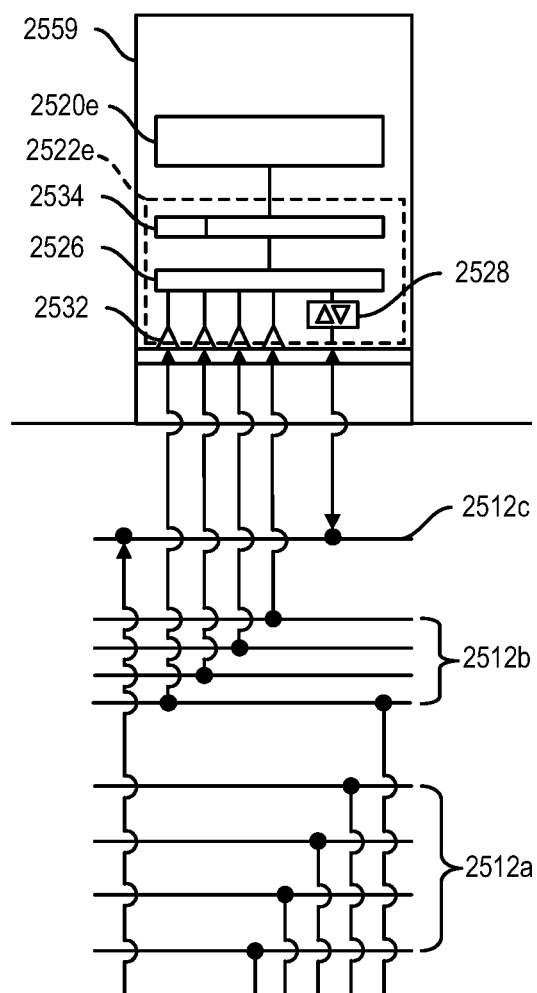
FIG. 34 shows a magnified view of the gateway circuit of the monitoring system shown in FIG. 29.

FIG. 34 shows a magnified view of the gateway circuit 2559. As shown in the illustrated example, the gateway circuit 2559 can include a circuit controller 2520e and a node 2522e configured to enable and control electronic communication between the circuit controller 2520e and the system data lane 2512c as well as each of the protection data lanes 2512b. The gateway circuit 2559 can enable communication between the flexible monitoring system 202 and trusted system such as, e.g., the HMI 220, customer historian 216, and customer control systems 212. For example, the protection circuits 2552 can deliver data characterizing operation of a machine (e.g., machine 102) to the gateway circuit 2559. The gateway circuit 2559 can provide the data to a trusted user and/or system (e.g., HMI 220, customer historian 216, and customer control systems 212). In some embodiments, the gateway circuit 2559 can also functions as input circuit. For example, a trusted user and/or system such as, e.g., the HMI 220, customer historian 216, and customer control systems 212, can provide data to the gateway circuit, and the gateway circuit 2559 can deliver the data to the backplane 2506 such that the data is available to other functional circuits. For example, a trusted user can deliver data to the gateway circuit 2559 to request that the protection circuit 2552 perform certain analyses on sensor data. In some embodiments, if the gateway circuit 2559 can include a transmitter such that the gateway circuit can receive the request and deliver the data characterizing the request to the backplane 2506.

Each node 2522e of the gateway circuit 2559 can include schedule controller 2534, a node controller 2524, a gate controller 2526, and a gate pair 2528, and receivers 2532. The schedule controller 2534, node controllers 2524, gate controllers 2526, gate pair 2528, transmitters 2530, and receivers 2532 can generally be similar to the schedule controller 334, node controller 324, gate controllers 326, gate pairs 328, transmitters 2530, and receivers 2532. The gate pair 2528 can include a transmitter and a receiver. In some embodiments, the gate pair can be a half-duplex transceiver or a full-duplex transceiver. The node controller 2524 can function as an interface between the circuit controller 2520e and the gate controller 2526, receivers 2532, and/or the gate pair 2528. For example, the node controller 2524 can be configured to control which data is transferred from the protection data lanes 2512b to the circuit controller 2520e using, e.g., packet filtering techniques. In some embodiments, the node controller 2524 can be configured to receive signals from the circuit controller 2520e, encode the signals into bits, and deliver signals (e.g., data packets) corresponding to the encoded bits to the gate controller 2526 for the data to be delivered to the system data lane 2512c of the backplane 2506.

Figure 35:
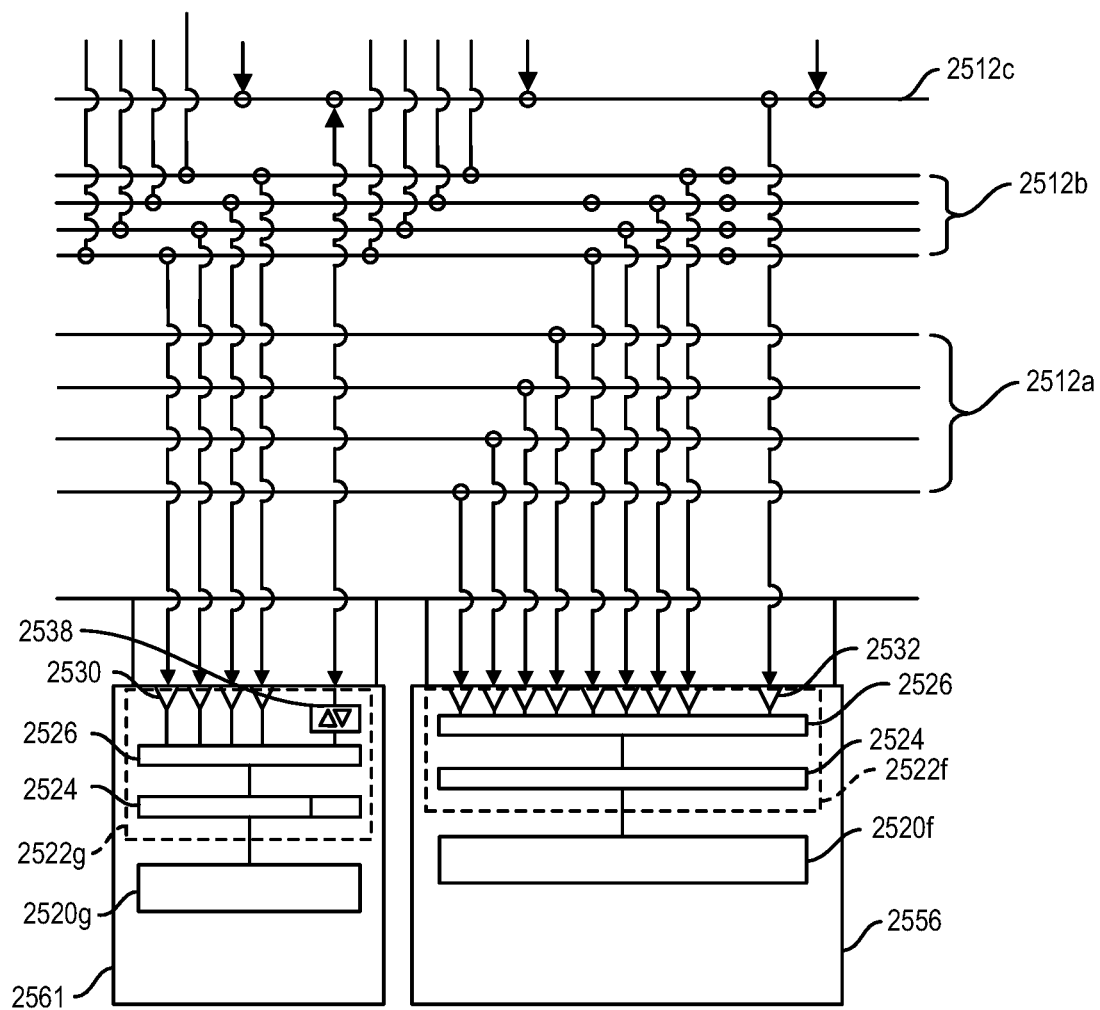
FIG. 35 is a magnified view of a 4-20 output circuit of the monitoring system shown in FIG. 29.

FIG. 35 shows a magnified view of the condition monitoring circuit 2556 and the 4-20 output circuit 2561, both of which can be configured to output 4-20 mA record outputs. The condition monitoring circuit 2556 and the 4-20 output circuit 2561 can be configured to output monitoring signals as 4-20 mA recorder outputs. The condition monitoring circuit 2556 can be configured to receive all data delivered to the input data lanes 2512a, protection data lanes 2512b, and system data lane 2512c.

As shown in the illustrated example, the condition monitoring circuit 2556 can include a circuit controller 2520f and a node 2522f configured to enable and control electronic communication between the circuit controller 2520f and the system data lane 2512c as well as each of the input data lanes 2512a. The node 2522f of the condition monitoring circuit 2556 can include a node controller 2524, a gate controller 2526, and receivers 2532. However the node 2522f of the condition monitoring circuit 2556 does not include transmitters. Due to the lack of transmitters, nodes 2522 of 4-20 functional circuit 2556 can is unable to deliver data to the input data lanes 2512a, protection data lanes 2512b, and the system data lane 2512c.

The 4-20 output circuit 2561 can be configured to receive all data delivered to the protection data lanes 2512b and the system data lane 2512c. As shown in the illustrated example, the 4-20 output circuit 2561 can include a circuit controller 2520g and a node 2522g configured to enable and control electronic communication between the circuit controller 2520g and the system data lane 2512c as well as each of the protection data lanes 2512b. The node 2522g of the 4-20 output circuit 2561 can include a node controller 2524, a gate controller 2526, and receivers 2532. The node controllers 2524, gate controllers 2526, and receiver 2532 can generally be similar to the node controller 324, gate controllers 326, and receivers 332.

As shown in FIGS. 29-34, transmitters 2530 of each of the input circuits 2550 is electrically coupled to a different input data lane 2512a. Therefore, each of the input circuits 2550 delivers data packets to a different input data lane 2512a than the other input circuits 2550. Similarly, transmitters 2530 of protection circuits 2552 are electrically coupled to different protection data lanes 2512b. Therefore, each of the protection circuits 2552 delivers data packets to a different protection data lane 2512b than the other input circuits 2550. By coupling different input data lanes 2512a and protection data lanes 2512b to each input circuit 2550 and protection circuit 2552 respectively, there is no risk of collisions when delivering data to the backplane 2506. Since the input data lanes 2512a and protection data lanes 2512b do not receive inputs from multiple input circuits 2550 and protection circuits 2552, respectively, a communication protocol governing data delivery to the backplane 2506 can be simplified. For example, in some embodiments, there is no need to schedule communication from input circuits 2550 and protection circuits 2552.

Figure 36:
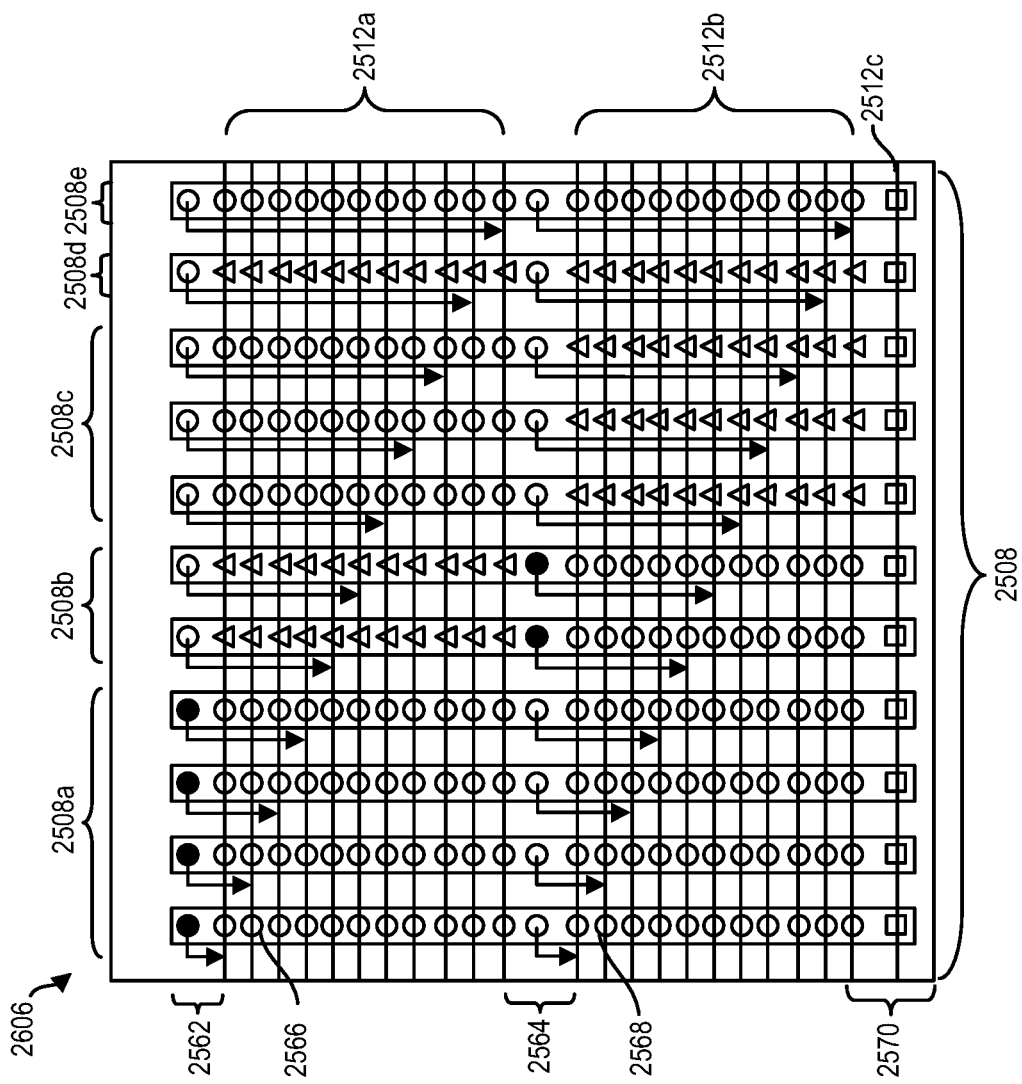
FIG. 36 is a block diagram of an exemplary backplane of the monitoring system shown in FIG. 29.

In some embodiments, the data lanes that receive data packets from input circuit 2550 and protection circuit 2552 can be determined by the ports 2508 of the backplane 2506. FIG. 36 shows a top view of the backplane 2506 of the monitoring system 2500. As shown in the illustrated example, each port includes first and second input links 2562, 2564. Each of input links 2562 can be in electronic communication with a different input data lane 2512a than the other input links 2562. Each port can also include first and second sets of output links 2566, 2568, and system links 2570. In FIG. 36, the first and second sets of output links 2566, 2568 are illustrated along the input data lanes 2512a and the protection data lanes 2512b, respectively. Each of the output links 2566, 2568 can be in electronic communication with a corresponding input data lane 2512a and protection data lane 2512b, respectively. Therefore, all functional circuits 2510 coupled to the ports 2508 can receive data from all of the data lanes 2512a, 2518b, 2512c. The system links 2570 can be in electronic communication with the system data lane 2512c and can be configured to facilitate bi-directional serial communication with the system data lane 2512c.

Referring to FIGS. 29-36, in the illustrated example, the input circuits are 2512 coupled to ports 2508a, the protection circuits 2552 are coupled to ports 2508b, the relay circuit 2558, the gateway circuit 2559, and the 4-20 output circuit are coupled to ports 2508c, the condition monitoring circuit 2556 is coupled to port 2508d, and the system interface circuit is coupled to port 2508e. However, since each port 2508 includes input links 2562, 2564, output links 2566, 2568, and system links 2570, functional circuits 2510 can be coupled to any given port 2508 of the backplane 2506. In FIGS. 29-36 transmitters 2530 of the input circuits 2550 can be electrically coupled to input links 2562 of the ports 2508a, and transmitters 2530 of the protection circuits 2552 can be electrically coupled to the input links 2564 of the ports 2508b.

Figure 37:
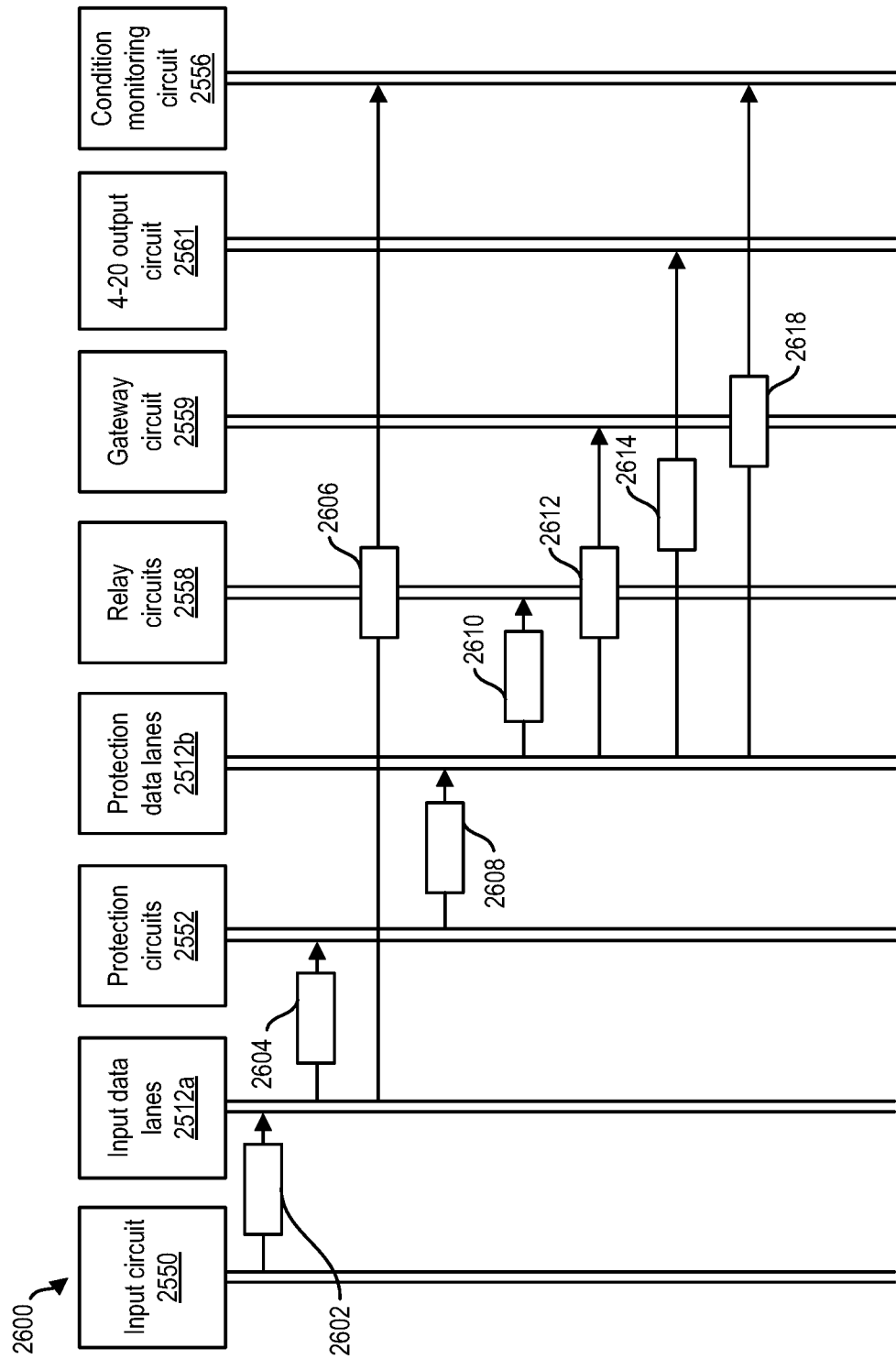
FIG. 37 is a data flow diagram illustrating exemplary communication between various components of the monitoring system shown in FIG. 29.

FIG. 37 shows a data flow diagram 2600 illustrating exemplary communication between various components of the monitoring system 2500. At step 2602, the input circuits can deliver data packets characterizing sensor measurements to respective input data lanes 2512a (e.g., via the first input links 2562 of the ports 2508a). At step 2604, the protection circuits 2552 can receive the data packets from the input data lanes 2512a. At step 2606, the condition monitoring circuit 2556 can receive the data packets from the input data lanes 2512a.

The protection circuits 2552 can analyze and process the data from the input data lanes. For example, the protection circuits 2552 can determine an operating status of a machine based on the sensor measurements. At step 2608, the protection circuits 2552 can provide the results of such analyses to the protection data lanes 2512b (e.g., via the second input links 2564 of the ports 2508b). At steps 2610, 2612, 2614, 2616, 2618, the relay circuit 2558, gateway circuit 2559, 4-20 output circuit 2561, and condition monitoring circuit 2556 can receive the data from the protection data lanes 2512b, respectively.

Based on the status of the machine, the relay circuit 2558 can deliver a signal to a control system (e.g., customer control system 212). The control system can then stop operation of the equipment being monitored to prevent damage or failure. In some embodiments, the condition monitoring circuit 2556 can perform further analysis on data received from the input data lanes 2512a and the protection data lanes 2512b. The condition monitoring circuit 2556 can provide data from the input data lanes 2512a and the protected data lanes 2512b to untrusted users or systems (e.g., remote technical support operators and condition monitoring system 214). The gateway circuit 2559 can provide data from the protection data lanes 2512b to trusted system such as, e.g., the HMI 220, customer historian 216, and customer control systems 212. The 4-20 output circuit can provide from the protection data lanes 2512b to a trusted user (e.g., a plant operator). During operation, the system interface circuit 2554 can deliver data packets to the system data lane 2512c to adjust operating parameters of functional circuits 2510 coupled to the backplane and/or request status updates from each of the other functional circuits 2510 coupled to the backplane 2506. A trusted user, such as, e.g., a plant operator, can provide configuration data to the circuit controller 2520b of the system interface circuit 2554 via the control system and/or the HMI, and the system interface circuit 2554 can provide data packets characterizing the configuration data to the system data lane 2512c of the backplane 2506. The input circuits 2550, protection circuits 2552, relay circuit 2558, gateway circuit 2559, 4-20 output circuit 2561, and the condition monitoring circuit 2556 can receive the data from the system data lane 2512c, update operating parameters based on the received data, and/or provide status responses to the system data lane 2512c if requested.

Periodically, each functional circuit 2510 of the monitoring system 2500 can perform self-tests to evaluate a status of internal processors, memory, and/or other circuitry. The functional circuit can also determine a current operating status. Each of the functional circuit can deliver the results of the self-test to the system data lane 2512c to be provided to the statuses will be sent on the system data lane 2512c and can be sent over the various data lanes. The system interface circuit 2554 can also provide an additional level of analysis at a system level. Included in the health analysis with telemetry data (system temperature, hours in use, supply voltage), configuration changes, network performance information. The system interface circuit 2554 can deliver data characterizing results of the health analysis to the system data lane 2512c such that each functional circuit can receive the data.

In some embodiments, the monitoring system can be configured to deliver data to a local displays such that the data can be displayed for a plant operator. In other embodiments, data can be transmitted using industrial protocols such that it is available for presentation on HMIs. The data can include current values, status, and/or trends of measure values.

In some embodiments, the system interface circuit 2554, a gateway circuit 2559, and/or a condition monitoring circuit 2556 can include a short range wireless communication components such that each of the system interface circuit 2554, a communication gateway, and/or a condition monitoring circuit 2556 can be configured to communicate wirelessly with a user device. In some embodiments, the system interface circuit 2554, a communication gateway, and/or a condition monitoring circuit can provide health information to a user device such as, e.g., a tablet, laptop, smartphone, etc. In some embodiments, the system can include a 4-20 mA recorder output.

By utilizing different input data lanes 2512a and protection data lanes 2512b to receive data from each input circuit 2550 and protection circuit 2552 respectively, there is no risk of collisions when delivering data to the backplane 2506. Since the input data lanes 2512a and protection data lanes 2512b do not receive inputs from multiple input circuits 2550 and protection circuits 2552, respectively, a communication protocol governing data delivery to the backplane 2506 can be simplified. For example, in some embodiments, there is no need to schedule communication from input circuits 2550 and protection circuits 2552. Additionally, by separating functionality of input data lanes 2512a and protection data lanes 2512b, circuitry of nodes 2522 of each functional circuit 2510 can be simplified such that it can be designed and constructed more efficiently.

Figure 38:
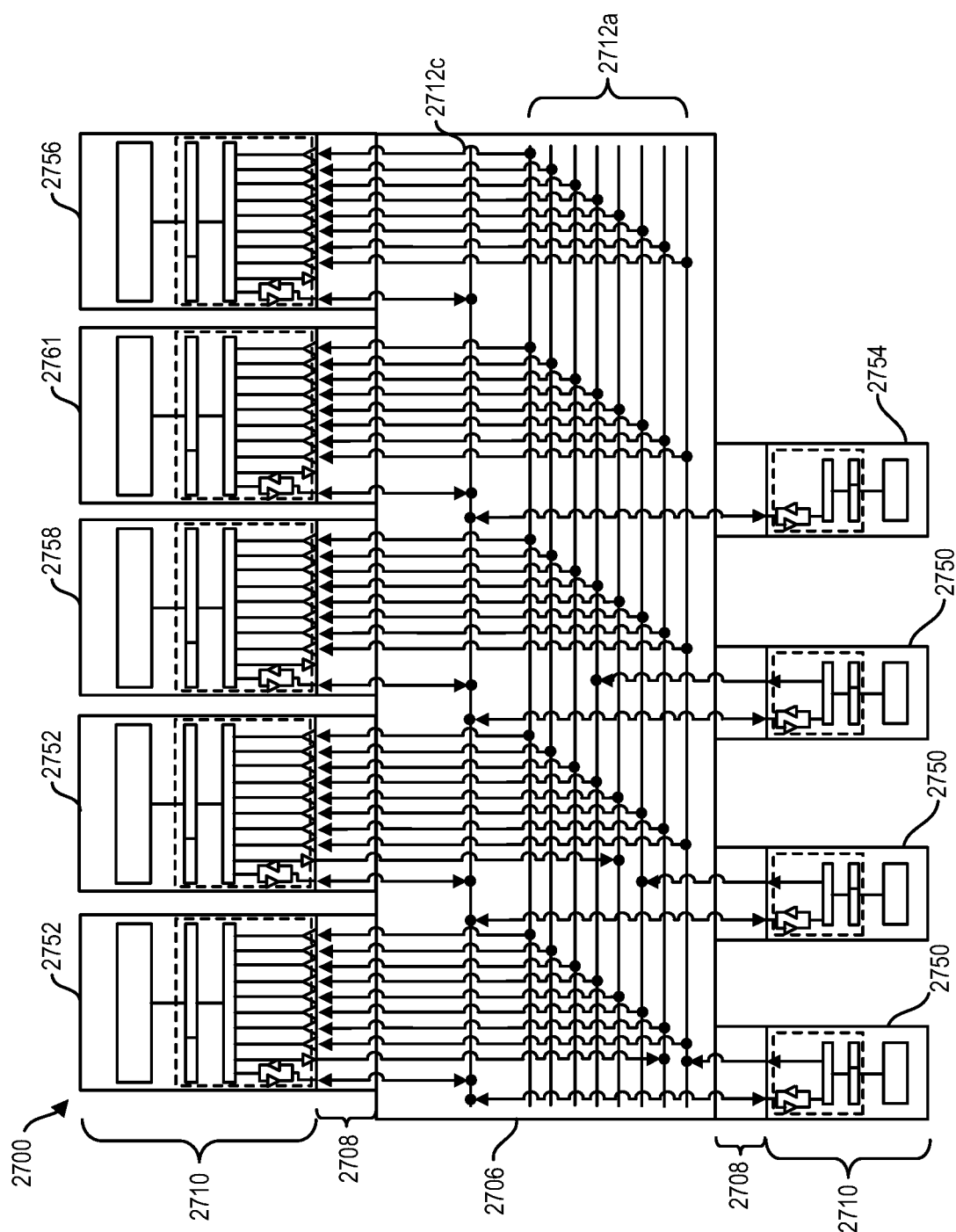
FIG. 38 is a block diagram another exemplary embodiment of a monitoring system that utilizes dedicated data lanes.

In some embodiments, a backplane of a monitoring systems can include dedicated data lanes that are not separated by functionality, but which are still configured to receive data input from a single monitoring circuit. FIG. 38 shows block diagram of a portion of another exemplary embodiment of a monitoring system 2700.

The monitoring system 2700 can include any number of functional circuits 2710, which can be detachably coupled to a backplane 2706 via ports 2708 of the backplane 2706. As shown in the illustrated example, the monitoring system 2700 includes input circuits 2750, protection circuits 2752, a system interface circuit 2754, a relay circuit 2758, a 4-20 output circuit 2761, and a condition monitoring circuit 2756. The input circuits 2750, protection circuits 2752, a system interface circuit 2754, relay circuit 2578, a 4-20 output circuit 2761, and condition monitoring circuit 2756 can generally be similar to the protection circuits 2552, system interface circuit 2554, relay circuit 2558, 4-20 output circuit 2561, and condition monitoring circuit 2556 describe herein with regard to FIGS. 29-36, with the exception of some slight difference between nodes of each, as described in more detail below.

In the illustrated example, the backplane includes a set of data lanes 2712a, and at least one system data lane 2712c. The data lanes 2712a can serve the same functions as the input data lanes 2512a and the protection data lanes 2512b. The system data lane 2712c can generally function similarly to the system data lane 2512c. Each of the input data lanes 2712a can be configured to receive data packets from an input circuits 2750 coupled to a port 2708 that can be configured to facilitate data delivery to the corresponding data lane 2712a. As shown in the illustrated example, each data lane 2712a can receive data packets from a single input circuit 2550 or a single protection circuit 2752. All of the data lanes 2712a and system data lanes 2712c can be electrically coupled to each of the ports 2708. However, for clarity, unused connections between the ports 2708 and data lanes 2712a and/or system data lanes 2712c are omitted in FIGS. 38-42.

The backplane 2706 can be a passive backplane configured to facilitate multipoint asynchronous electronic communication between the functional circuits that are coupled to the backplane. Therefore, all data that is delivered to the backplane 2706 can be received by all functional circuits 2710 that are coupled to the backplane 2706.

Figure 39:
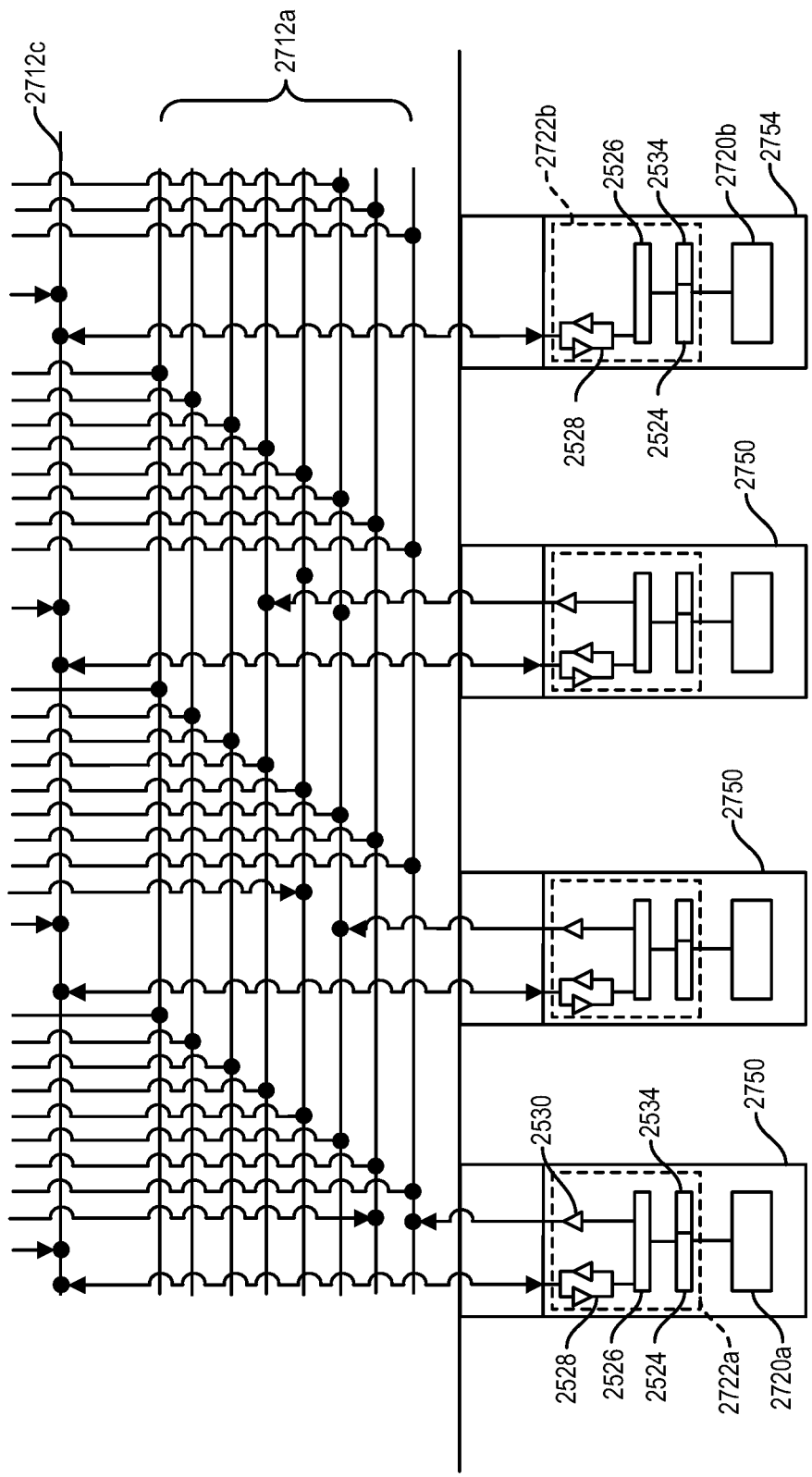
FIG. 39 shows a magnified view of input circuits and a system interface circuit of the monitoring system shown in FIG. 38.

FIG. 39 shows a magnified view of the input circuits 2750 and the system interface circuit 2754. As shown in the illustrated example, the input circuits 2750 can include a circuit controller 2720a and a node 2722a configured to facilitate and control electronic communication between the circuit controller and the backplane 2706. The circuit controller 2720a can generally be similar to the circuit controller 2520a. Each node 2722a of the input circuits 2750 can include a schedule controller 2534, a node controller 2524, a gate controller 2526, a gate pairs 2528, and a transmitter 2530. Each of the transmitters 2530 of the input circuits 2750 can be in electronic communication with one data lane 2712a. The transmitters 2530 can be configured to deliver data to one corresponding data lane 2712a. Each gate pair 2528 of the input circuits 2750 can be in electronic communication with the system data lane 2712c.

The system interface circuit 2754 can include a circuit controller 2720b and a node 2722b configured to facilitate and control electronic communication between the circuit controller and the backplane 2706. The circuit controller 2720b can generally be similar to the circuit controller 2520b. The node 2722b of the system interface circuit 2754 can include a schedule controller 2734, a node controller 2724, a gate controller 2726, and gate pairs 2728. The gate pair 2528 of the system interface circuit 2754 can be in electronic communication with the system data lane 2712c.

Figure 40:
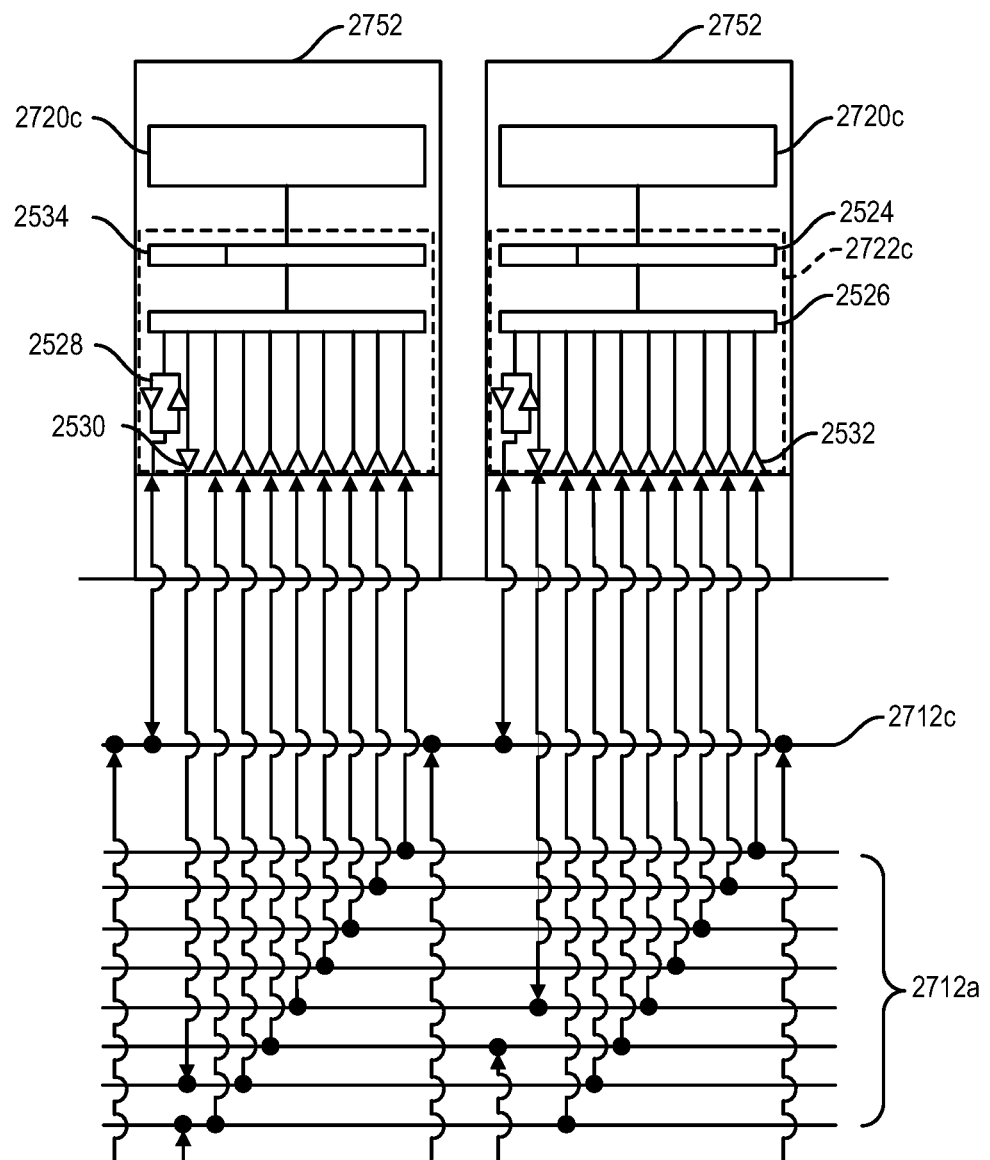
FIG. 40 is a magnified view of protection circuits of the monitoring system shown in FIG. 38.

FIG. 40 shows a magnified view of the protection circuits 2752. As shown in the illustrated example, the protection circuits 2752 can include a circuit controller 2720c and a node 2722c configured to facilitate and control electronic communication between the circuit controller 2720c and the backplane 2706. The circuit controller 2720c can generally be similar to the circuit controller 2520c. Each node 2722c of the protection circuits 2752 can include a schedule controller 2534, a node controller 2524, a gate controller 2526, a gate pairs 2528, a transmitter 2530, and receivers 2532. Each of the transmitters 2530 of the protection circuits 2752 can be in electronic communication with one data lane 2712a. The transmitters 2530 can be configured to deliver data to one corresponding data lane 2712a. Each gate pair 2528 of the input circuits 2750 can be in electronic communication with the system data lane 2712c. The receivers 2532 can be in electronic communication with the data lanes 2712a, and can be configured to receive data from the data lanes 2712a. The protection circuits 2752 can include a sufficient number of receivers 2532 to be able to receive data from all of the data lanes 2712a.

Figure 41:
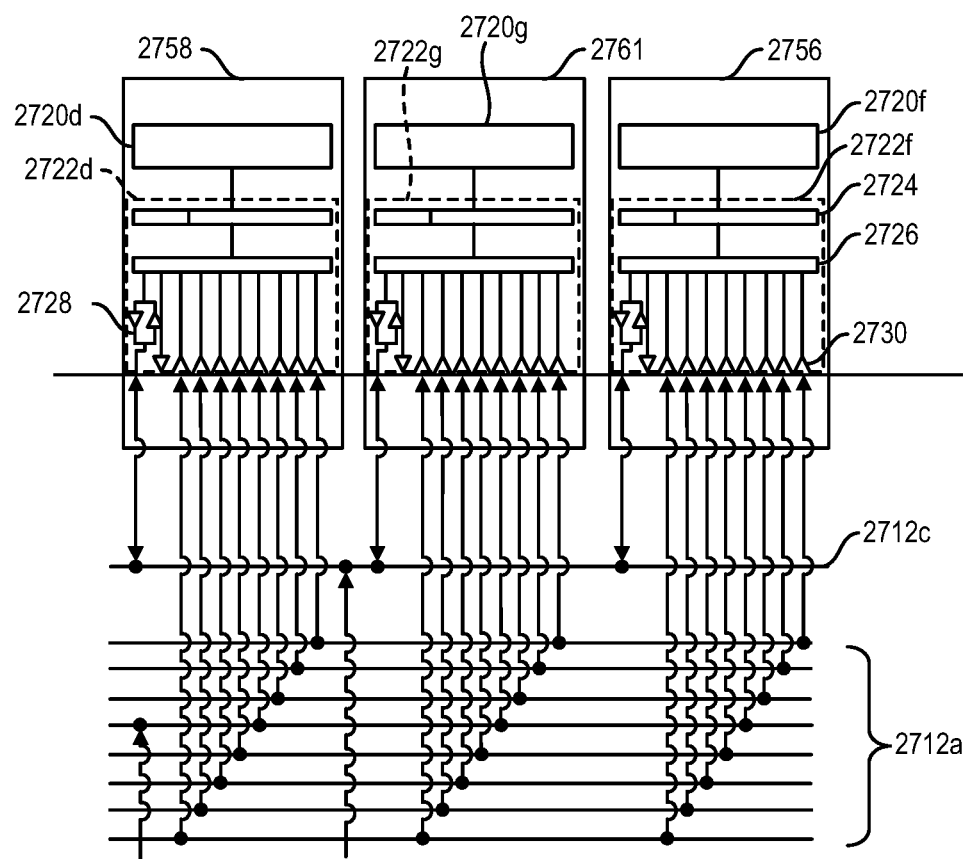
FIG. 41 is a magnified view of a relay circuit, a 4-20 output circuit, and a condition monitoring circuit of the monitoring system shown in FIG. 38.

FIG. 41 shows a magnified view of the relay circuit 2758, 4-20 output circuit 2761, and a condition monitoring circuit 2756. The relay circuit 2758, 4-20 output circuit 2761, and a condition monitoring circuit 2756 can include circuit controllers 2720d, 2720g, 2720f, and nodes 2722d, 2722g, 2722f. The nodes 2722d, 2722g, 2722f can be configured to facilitate and control electronic communication between the circuit controllers 2720d, 2720g, 2720f and the backplane 2706. The circuit controllers 2720d, 2720g, 2720f can generally be similar to the circuit controllers 2520d, 2520g, 2520f. Each of the nodes 2722d, 2722g, 2722f can include a schedule controller 2534, a node controller 2524, a gate controller 2526, a gate pairs 2528, and receivers 2532. The gate pairs 2528 of the relay circuit 2758, 4-20 output circuit 2761, and a condition monitoring circuit 2756 can be in electronic communication with the system data lane 2712c. The receivers 2532 can be in electronic communication with the data lanes 2712a, and can be configured to receive data from the data lanes 2712a. The relay circuit 2758, 4-20 output circuit 2761, and a condition monitoring circuit 2756 can each include a sufficient number of receivers 2532 to be able to receive data from all of the data lanes 2712a.

Figure 42:
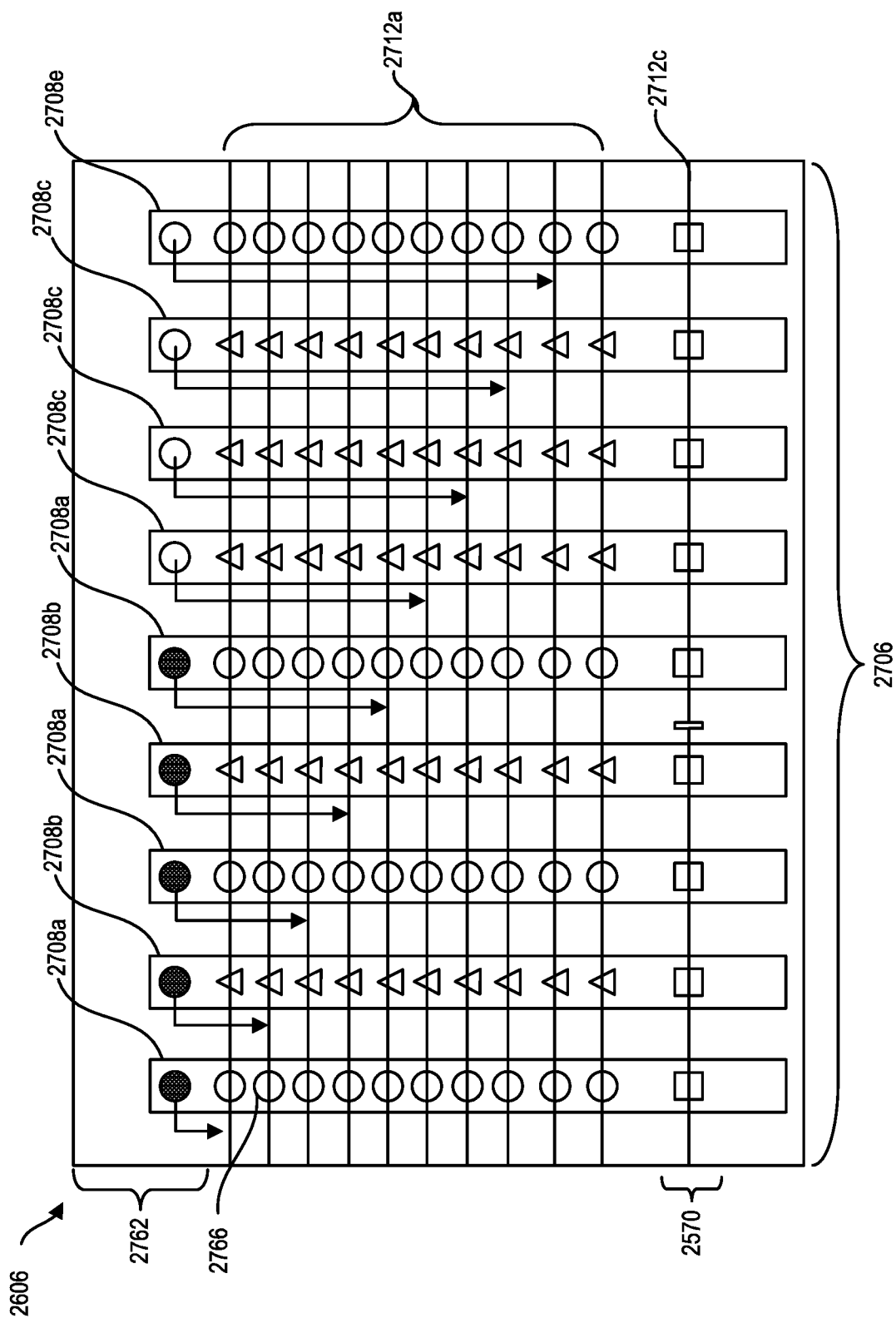
FIG. 42 is a block diagram of an exemplary backplane of the monitoring system shown in FIG. 38.

In some embodiments, the data lanes 2712a that receive data packets from input circuit 2750 and protection circuit 2752 can be determined by the ports 2708 of the backplane 2706. FIG. 42 shows a top view of the backplane 2706 of the monitoring system 2700. As shown in the illustrated example, each port 2706 includes an input link 2762. Each of input links 2762 can be in electronic communication with a different data lane 2712a than the other input links 2762. Each port 2706 can also include a sets of output links 2766, and system links 2570. In FIG. 42, the output links 2766 are illustrated along the data lanes 2712a. Each of the output links 2766 can be in electronic communication with a corresponding data lane 2712a. Therefore, all functional circuits 2710 coupled to the ports 2708 can receive data from all of the data lanes 2712a. The system links 2770 can be in electronic communication with the system data lane 2712c and can be configured to facilitate bi-directional serial communication with the system data lane 2512c.

Referring to FIGS. 38-42, in the illustrated example, the input circuits 2750 are coupled to ports 2708a, the protection circuits 2752 are coupled to ports 2708b, relay circuit 2758, 4-20 output circuit 2761, and a condition monitoring circuit 2756 are coupled to ports 2708c, and the system interface circuit is coupled to port 2708e. However, since each port 2708 includes input links 2762, output links 2766, and system links 2770, functional circuits 2710 can be coupled to any given port 2708 of the backplane 2706. In FIGS. 38-42, transmitters 2730 of the input circuits 2750 and protection circuits 2752 can be electrically coupled to input links 2762 of the ports 2708a, 2708b. Any receivers of the functional circuits 2710 can be coupled to the output links 2766.

Traditional monitoring systems can be limited in terms of flexibility and scalability. Additionally, costs and complexity of installation can create a significant barrier to entry for users that want to monitor low cost and/or low priority components/systems. By utilizing functional circuits that can be detachably coupled to the backplane, performance of the monitoring systems described herein can be adjusted and/or scaled to fit individual monitoring needs. For example, processing power can be increased by coupling additional processing circuits to the backplane. As another example, the monitoring system can be expanded by coupling additional input circuits to the backplane to such that the monitoring system can to receive and process sensor data from additional sensors.

Exemplary technical effects of the subject matter described herein can include the ability to customize and adjust capabilities of a monitoring system through selection and application of various different types of functional circuits, as described here. Another exemplary technical effect includes the ability to share all data delivered to a backplane of a monitoring system, thereby allowing for resources (e.g., functional circuits) to be distributed between the backplanes as desired. For example, monitoring subsystems can be installed remotely near industrial equipment such that the input circuits can receive sensor data, while other monitoring subsystems can be installed at another location that may be more convenient, or easier to access. Installing monitoring subsystems near the industrial equipment to be monitored can also reduce costs of running cables from the sensors to input circuits, as well as improve the quality of the signals delivered from sensors to the input circuits by reducing exposure to noise and ground loops. Additionally, utilizing backplanes that have dedicated data lanes can minimize disruption associated with hardware failure while maintaining flexibility and scalability of the monitoring system.

One skilled in the art will appreciate further features and advantages of the subject matter described herein based on the above-described embodiments. Accordingly, the present application is not to be limited specifically by what has been particularly shown and described. All publications and references cited herein are expressly incorporated herein by reference in their entirety.

Other embodiments are within the scope and spirit of the disclosed subject matter. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Further, in the present disclosure, like-named components of the embodiments generally have similar features, and thus within a particular embodiment each feature of each like-named component is not necessarily fully elaborated upon. Additionally, to the extent that linear or circular dimensions are used in the description of the disclosed systems, devices, and methods, such dimensions are not intended to limit the types of shapes that can be used in conjunction with such systems, devices, and methods. A person skilled in the art will recognize that an equivalent to such linear and circular dimensions can easily be determined for any geometric shape.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

What is claimed is:

1. A monitoring system, comprising:
    a first backplane having,
        a first set of data lanes, and
        a first set of ports, each port of the first set of ports being in electronic communication with at least one data lane of the first set of data lanes;
    a second backplane having,
        a second set of data lanes, and
        a second set of ports, each of the second set of ports being in electronic communication with at least one data lane of the second set of data lanes;
    a first bridge circuit detachably coupled to at least one of the first set of ports, and a second bridge circuit detachably coupled to at least one of the second set of ports;
    wherein the second bridge circuit is in electronic communication with the first bridge circuit;
    wherein the first bridge circuit is configured to receive a first set of data from the first set of data lanes, convert the first set of data to a first serial data stream, and to deliver the first serial data stream to the second bridge circuit, thereby delivering the first set of data to the second backplane; and
    wherein the second bridge circuit is configured to receive a second set of data from the second set of data lanes, convert the second set of data to a second serial data stream, and to deliver the second serial data stream to the first bridge circuit, thereby delivering the second set of data to the first backplane; and
    a first set of functional circuits, each functional circuit of the first set of functional circuits being detachably coupled to at least one port of the first set of ports, the first set of functional circuits being configured to deliver the first set of data to the first backplane and to selectively receive any data delivered to the first backplane; and
    a second set of functional circuits, each functional circuit of the second set of functional circuits being detachably coupled to at least one port of the second set of ports, the second set of functional circuits being configured to deliver a second set of data to the second backplane and to selectively receive any data delivered to the second backplane, wherein each functional circuit included in the first set of functional circuits includes a unique MAC address that is different from a unique MAC address of each functional circuit included in the second set of functional circuits.

2. The monitoring system of claim 1, wherein the first bridge circuit comprises:
    at least one first gate configured to facilitate electronic communication between the first bridge circuit and at least one data lane of the first set of data lanes, the at least one first gate being configured to operate in a first operating mode and in a second operating mode,
        wherein, the at least one first gate is configured to allow data to be transferred from the first bridge circuit to the at least one data lane of the first set of data lanes when in the first operating mode; and
        wherein, the at least one first gate is configured to prevent data from being transferred from the first bridge circuit to the at least one data lane of the first set of data lanes when in the second operating mode; and
    at least one first gate controller in electronic communication with the at least one first gate, the at least one first gate controller being configured control operation of the at least one first gate.

3. The monitoring system of claim 2, wherein the second bridge circuit comprises:
    at least one second gate configured to facilitate electronic communication between the second bridge circuit and at least one data lane of the second set of data lanes, the at least one second gate being configured to operate in a third operating mode and a fourth operating mode,
        wherein, the at least one second gate is configured to allow data to be transferred from the second bridge circuit to the at least one lane of the second set of data lanes when in the third operating mode, and
        wherein, the at least one second gate is configured to prevent data from being transferred from the second bridge circuit to the at least one lane of the second set of data lanes when in the fourth operating mode; and at least one second gate controller in electronic communication with the at least one second gate and the at least one first gate controller, the at least one second gate controller being configured control operation of the at least one second gate.

4. The monitoring system of claim 1, wherein the first set of functional circuits includes at least one first functional circuit having:
at least one second gate configured to facilitate electronic communication between the at least one first functional circuit and at least one of the first set of data lanes, the at least second one gate being configured to operate in a first operating mode and a second operating mode,
wherein, the at least one second gate is configured to allow data to be transferred from the at least one first functional circuit to the at least one lane of the first set of data lanes when in the first operating mode, and
wherein, the at least one second gate is configured to prevent data from being transferred from the at least one first functional circuit to the at least one lane of the first set of data lanes when in the second operating mode.

5. The monitoring system of claim 1, wherein the first set of data lanes comprises a plurality of data lanes.

6. The monitoring system of claim 1, wherein the second set of data lanes comprises a plurality of data lanes.

7. The monitoring system of claim 1, further comprising a sensor in electronic communication with a functional circuit of at least one of the first set of functional circuits and the second set of functional circuits, the sensor being configured to measure operating parameters of a machine and to deliver data characterizing the measured operating parameters to the functional circuit.

8. The monitoring system of claim 1, wherein the first set of functional circuits comprises a plurality of functional circuits, each functional circuit of the plurality of functional circuits being configured to receive data from at least one data lane of the first set of data lanes.

9. The monitoring system of claim 1, wherein the first backplane and the second backplane are passive backplanes and do not include active switches.

10. A method, comprising:
receiving a first identification data at a first bridge circuit coupled to a first backplane of a first monitoring subsystem, the first identification data characterizing information identifying hardware of a second monitoring subsystem;
receiving a first network identification data at the first bridge circuit, the first network identification data characterizing a first network configuration;
receiving a second identification data at a second bridge circuit coupled to a second backplane of the second monitoring subsystem, the second identification data characterizing information identifying hardware of the first monitoring subsystem;
receiving a second network identification data at the second bridge circuit, the second network identification data characterizing a second network configuration;
comparing the first network identification data with the second network identification data;
determining, using the first identification data and the second identification data, that first monitoring subsystem is compatible with the second monitoring subsystem;
receiving a first schedule at the second bridge circuit, the first schedule characterizing a first communication schedule for a first set of functional circuits that are in electronic communication with the first backplane;
receiving a second schedule at the first bridge circuit, the second schedule characterizing a second communication schedule for a second set of functional circuits that are in electronic communication with the second backplane, wherein each functional circuit included in the first set of functional circuits includes a unique MAC address that is different from a unique MAC address of each functional circuit included in the second set of functional circuits;
comparing the first communication schedule to the second communication schedule;
determining that the first schedule is compatible with the second schedule; and
providing a first signal to at least one first gate of the first bridge circuit and providing a second signal to at least one second gate of the second bridge circuit, thereby activating the at least one first gate and the at least one second gate, and facilitating electronic communication between the first backplane and the second backplane.

11. The method of claim 10, further comprising:
delivering, from the first set of functional circuits, a first set of parallel data streams to a first set of parallel data lanes of the first backplane;
receiving, at the first bridge circuit, the first set of parallel data streams from the first set of parallel data lanes of the first backplane;
converting the first set of parallel data streams to a first serial data stream;
delivering the first serial data stream to the second bridge circuit;
expanding the first serial data stream to a second set of parallel data streams; and
delivering the second set of parallel data streams to a second set of parallel data lanes.

12. The method of claim 11, further comprising amplifying a power of the first serial data stream based on a distance between the first bridge circuit and the second bridge circuit.

13. The method of claim 11, further comprising delivering, from the second set of functional circuits, a third set of parallel data streams to the second set of parallel data lanes of the second backplane.

14. The method of claim 13, further comprising:
receiving, at the second bridge circuit, the third set of parallel data streams from the second set of parallel data lanes of the second backplane;
converting the third set of parallel data streams to a second serial data stream;
delivering the second serial data stream to the first bridge circuit;
expanding the second serial data stream to a fourth set of parallel data streams; and
delivering the fourth set of parallel data streams to the first set of parallel data lanes.

15. The method of claim 13, further comprising generating a third schedule using at least one functional circuit of the first set of functional circuits, the third schedule including data that determines when each functional circuit of the first set of functional circuits delivers data to the first set of parallel data lanes and when each functional circuit the second set of functional circuits delivers data to the second set of parallel data lanes.

16. The method of 14, wherein the third set of parallel data streams includes sensor data characterizing measured operating values of a machine, the sensor data being measured by sensors coupled to the machine.

17. The method of claim 13, further comprising amplifying a power of the second serial data stream based on a distance between the first bridge circuit and the second bridge circuit.

18. The method of claim 10, further comprising:
determining an estimated delay time characterizing an estimated amount of time required to transfer data between the first bridge circuit and the second bridge circuit;
determining a dead band period based on at least one of the first communication schedule and the second communication schedule, the dead band time characterizing a total amount of time available to absorb delays in communication between one or more backplane;
determining an amount of the dead band time that is available based on at least one of the first communication schedule and the second communication schedule; and
comparing the estimated delay time to the amount of dead band time that is available.

* * * * *